(12) United States Patent
Ma et al.

(10) Patent No.: US 12,018,193 B2
(45) Date of Patent: Jun. 25, 2024

(54) ORGANIC-INORGANIC HYBRID BULK ASSEMBLIES AND METHODS

(71) Applicant: Florida State University Research Foundation, Inc., Tallahassee, FL (US)

(72) Inventors: Biwu Ma, Tallahassee, FL (US); Chenkun Zhou, Tallahassee, FL (US); Haoran Lin, Tallahassee, FL (US); Yu Tian, Tallahassee, FL (US)

(73) Assignee: Florida State University Research Foundation, Inc., Tallahassee, FL (US)

( * ) Notice: Subject to any disclaimer, the term of this patent is extended or adjusted under 35 U.S.C. 154(b) by 0 days.

(21) Appl. No.: 18/180,601

(22) Filed: Mar. 8, 2023

(65) Prior Publication Data

US 2023/0383180 A1 Nov. 30, 2023

Related U.S. Application Data

(62) Division of application No. 16/156,218, filed on Oct. 10, 2018, now Pat. No. 11,624,026.

(60) Provisional application No. 62/570,229, filed on Oct. 10, 2017.

(51) Int. Cl.
| | |
|---|---|
| *C09K 11/06* | (2006.01) |
| *C09K 11/66* | (2006.01) |
| *C09K 11/74* | (2006.01) |
| *C09K 11/77* | (2006.01) |

(Continued)

(52) U.S. Cl.
CPC ............ *C09K 11/06* (2013.01); *C09K 11/664* (2013.01); *C09K 11/7428* (2013.01); *C09K 11/7734* (2013.01); *H05B 33/145* (2013.01); *H05B 33/20* (2013.01); *C09K 2211/1007* (2013.01); *C09K 2211/1011* (2013.01);

(Continued)

(58) Field of Classification Search
CPC .............. C09K 11/664; C09K 11/7428; C09K 2211/1014; C09K 2211/1018; C09K 2211/1022
See application file for complete search history.

(56) References Cited

U.S. PATENT DOCUMENTS

| | | |
|---|---|---|
| 5,882,548 A | 3/1999 | Liang et al. |
| 2003/0170918 A1 | 9/2003 | Dehaven et al. |
| 2015/0071319 A1 | 3/2015 | Xing et al. |

(Continued)

FOREIGN PATENT DOCUMENTS

| | | |
|---|---|---|
| JP | 2008-227330 A | 9/2008 |
| WO | 2015/061555 A1 | 4/2015 |
| WO | 2017/066160 A1 | 4/2017 |

OTHER PUBLICATIONS

Lemmerer et al., "Lead halide inorganic-organic hybrids incorporating diammonium cations", 2012, CrystEngComm, 14, pp. 1954-1966. (Year: 2012).*

(Continued)

*Primary Examiner* — Khanh T Nguyen
(74) *Attorney, Agent, or Firm* — Eversheds Sutherland (US) LLP

(57) ABSTRACT

Bulk assemblies are provided, which may have desirable photoluminescence quantum efficiencies. The bulk assemblies may include two or more metal halides, and a wide band gap organic network. The wide band gap organic network may include organic cations. The metal halides may be disposed in the wide band gap organic network. Light emitting composite materials also are provided.

10 Claims, 18 Drawing Sheets

Monomer    Dimer    Trimer    Tetramer

Trigonal Prismatic    Trigonal Bipyramidal    Square Pyramidal    Tetrahedral

Seesaw

(51) Int. Cl.
*H05B 33/14* (2006.01)
*H05B 33/20* (2006.01)

(52) U.S. Cl.
CPC .......... *C09K 2211/1014* (2013.01); *C09K 2211/1018* (2013.01); *C09K 2211/1022* (2013.01)

(56) References Cited

U.S. PATENT DOCUMENTS

| | | |
|---|---|---|
| 2017/0012404 A1 | 1/2017 | Xing et al. |
| 2017/0283693 A1 | 10/2017 | Ma et al. |
| 2018/0037813 A1 | 2/2018 | Ma et al. |

OTHER PUBLICATIONS

First Office Action issued in China application No. 201880079416.3, dated Dec. 19, 2022, 36 pages.

Mao et al., Temperature-Triggered Dielectric-Optical Duple Switch Based on an Organic-Inorganic Hybrid Phase Transition Crystal: [C5N2H16]2SbBr5, Inorganic Chemistry, vol. 55, No. 15, pp. 7661-7666.

Zhou et al., Blue Emitting Single Crystalline Assembly of Metal Halide Clusters, Journal of the American Chemical Society, vol. 140, No. 41, pp. 13181-13184.

Zhou et al., Facile Preparation of Light Emitting Organic Metal Halide Crystals with Near-Unity Quantum Efficiency, Chemistry of Materials, vol. 30, No. 7, pp. 2374-2378.

Worku et al., Sunlike White-Light-Emitting Diodes Based on Zero-Dimensional Organic Metal Halide Hybrids, ACS Applied Materials & Interfaces, vol. 10, No. 36, pp. 30051-30057.

PCT International Search Report and Written Opinion for PCT Application No. PCT/US2018/055165 dated Jan. 16, 2019 (18 pages).

Chen et al., "Tailoring Organic Cation of 2D Air-Stable Organometal Halide Perovskites for Highly Efficient Planar Solar Cells," Adv. Energy Mater., 2017, 7:1700162 (1-7).

Dohner et al., "Intrinsic White-Light Emission from Layered Hybrid Perovskites," American Chemical Society, 2014, 13154-13157.

Zhou et al., "Low-Dimensional Organic Tin Bromide Perovskites and Their Photoinduced Structural Transformation," Angew. Chem. Int. Ed., 2017, 56:9018-9022.

Lemmerer et al., Lead halide inorganic-organic hybrids incorporating diammonium cations, CrystEngComm, 2012, 14, 1954-1966.

* cited by examiner

ORGANIC-INORGANIC HYBRID BULK ASSEMBLIES AND METHODS

CROSS-REFERENCE TO RELATED APPLICATIONS

This application is a divisional of U.S. patent application Ser. No. 16/156,218, filed Oct. 10, 2018, which claims priority to U.S. Provisional Patent Application No. 62/570,229, filed Oct. 10, 2017. The content of these application is incorporated by reference herein.

STATEMENT REGARDING FEDERALLY SPONSORED RESEARCH AND DEVELOPMENT

This invention was made with government support under DMR-1709116 awarded by National Science Foundation, and 17RT0906 awarded by the Air Force Office of Scientific Research. The government has certain rights in the invention.

BACKGROUND

Light emitting materials have applications in a wide variety of technologies, including energy, information, environmental, and healthcare technologies. Various types of light emitting materials have been developed, including organic and polymeric emitters, transition metal complexes, rare-earth doped phosphors, nanocrystals, and organic-inorganic hybrid perovskites.

One possible design of light emitting materials relies on the host-guest concept, in which light emitting species are doped in an inert host matrix. The benefits of the host-guest design can include suspending aggregation-induced self-absorption and self-quenching, and/or allowing for facile fine-tuning of the emission color.

However, realizing highly efficient host-guest systems with dopants uniformly distributed in a host matrix can be difficult, because the systems typically require the selection of proper host and dopant materials, precise control of material processing, or a combination thereof.

A crystalline solid is a material whose constituents, such as atoms, molecules or ions, are arranged in an ordered structure, forming a periodic lattice that extends in all directions. The interactions between the lattice points can lead to the formation of band structure. As a result, the properties of inorganic crystals can show strong dependence on their size, especially at the nanoscale, and this dependence may be referred to as the quantum size effect. The molecular interactions in organic crystals can cause their properties to be distinct from those of individual molecules.

Luminescent materials with a large Stokes shift may be useful for a variety of applications, from bio-imaging to luminescent solar concentrators, where self-absorption typically is undesirable. Several principles have been identified to guide the possible realization of a large Stokes shift for light emitting systems, including excited-state intramolecular proton transfer (ESIPT), excited-state intramolecular energy transfer, and/or excited-state structure deformation. Metal complexes capable of undergoing ultrafast excited state structural deformation may have the potential to generate emissions with large Stokes shifts. However, for many systems, a large Stokes shift is only available in solution, not in the solid state, as the rigidity of the solid state structure may restrict the extent of the excited state deformation with the reduced red shift of the emission wavelength.

To generate white emission, the most common solid-state lighting devices include light emitting diodes (LEDs) coated with a single phosphor, e.g. an InGaN blue LED chip coated with a YAG:$Ce^{3+}$ yellow-emitting phosphor. However, these single-phosphor-coated white LEDs (WLEDs) typically emit light with poor color rendering, usually due to spectral discontinuity. UV pumped WLEDs with blue, green, and red phosphors can produce higher quality white light, but often suffer from efficiency losses due to the reabsorption of emitted light and self-quenching of phosphors.

Organic-inorganic metal halide hybrids are a class of crystalline materials that may have unique structures and/or permit the tunability of one or more properties. Metal halide polyhedra can form three- (3D), two- (2D), one- (1D), and zero-dimensional (0D) structures surrounded by organic moieties. The decreased dimensionality of the inorganic structures can lead to the emergence of unique properties.

There remains a need for materials, including single crystalline materials, that exhibit bulk properties consistent with their individual building blocks, or bulk assemblies of quantum-confined materials without band formation and/or quantum size effect. There also remains a need for solid state luminescent materials with a desirable Stokes shift. A need also remains for methods for making crystalline materials, including methods that are simple, fast, reliable, tunable, or a combination thereof.

BRIEF SUMMARY

Provided herein are embodiments of single crystalline bulk assemblies, which may include 0D quantum confined materials. The bulk assemblies, in some embodiments, exhibit Gaussian-shaped and/or strongly Stokes shifted broadband emissions with photoluminescence quantum efficiencies (PLQEs) of up to near-unity. The bulk assemblies can include individual photoactive molecular species that exhibit one or more of their intrinsic properties while in the bulk material. In some embodiments, the bulk assemblies herein may have tunable chemical compositions, tunable crystallographic structures, tunable photo-physical properties, or a combination thereof.

In one aspect, bulk assemblies are provided. In some embodiments, the bulk assemblies include two or more metal halides, and a wide band gap organic network that includes a plurality of organic cations. The two or more metal halides may be (i) disposed in the wide band gap organic network, and (ii) isolated from each other.

In some embodiments, the two or more metal halides include (i) an octahedron of formula $MX_6$, (ii) a dimer of formula $M_2X_9$, (iii) a trimer of formula $M_3X_{11}$, (iv) a tetramer of formula $M_4X_{13}$, (v) a trigonal prismatic of formula $MX_6$, (vi) a trigonal bipyramid of formula $MX_5$, (vii) a square pyramid of formula $MX_5$, (viii) a tetrahedron of formula $MX_4$, (ix) a seesaw of formula $MX_4$, or (x) a combination thereof, wherein M is a metal atom, and X is a halide.

In another aspect, methods of forming bulk assemblies are provided. In some embodiments, the methods include providing a precursor solution, and contacting the precursor solution and an anti-solvent to form the bulk assembly. The precursor solution may include (i) a solvent, (ii) one or more compounds of formula $M^{p+}X_y$, wherein M is a metal selected from the group consisting of Sb, Pb, Sn, and Mn, X is Cl, Br, or I, and y is the charge of the metal, and (iii) one or more organic salts.

In yet another aspect, light emitting composite materials are provided. The light emitting composite materials, in some embodiments, include a first bulk assembly, a second bulk assembly, and a matrix material, wherein the first bulk assembly and the second bulk assembly are dispersed in the matrix material. The first bulk assembly may include two or more first metal halides and a first wide band gap organic network, the first wide band gap organic network including a plurality of first organic cations, wherein the two or more first metal halides are (i) disposed in the first wide band gap organic network, and (ii) isolated from each other. The second bulk assembly may include two or more second metal halides and a second wide band gap organic network, the second wide band gap organic network including a plurality of second organic cations, wherein the two or more second metal halides are (i) disposed in the second wide band gap organic network, and (ii) isolated from each other. In some embodiments, the light emitting composite materials include a third bulk assembly, which may also be dispersed in the matrix material.

In a still further aspect, light emitting devices are provided. In some embodiments, the light emitting devices include a light emitting material, wherein the light emitting material includes a first bulk assembly. In some embodiments, the light emitting material includes a second bulk assembly. The first bulk assembly and the second bulk assembly may be dispersed in a matrix material.

DETAILED DESCRIPTION

Figure 1:
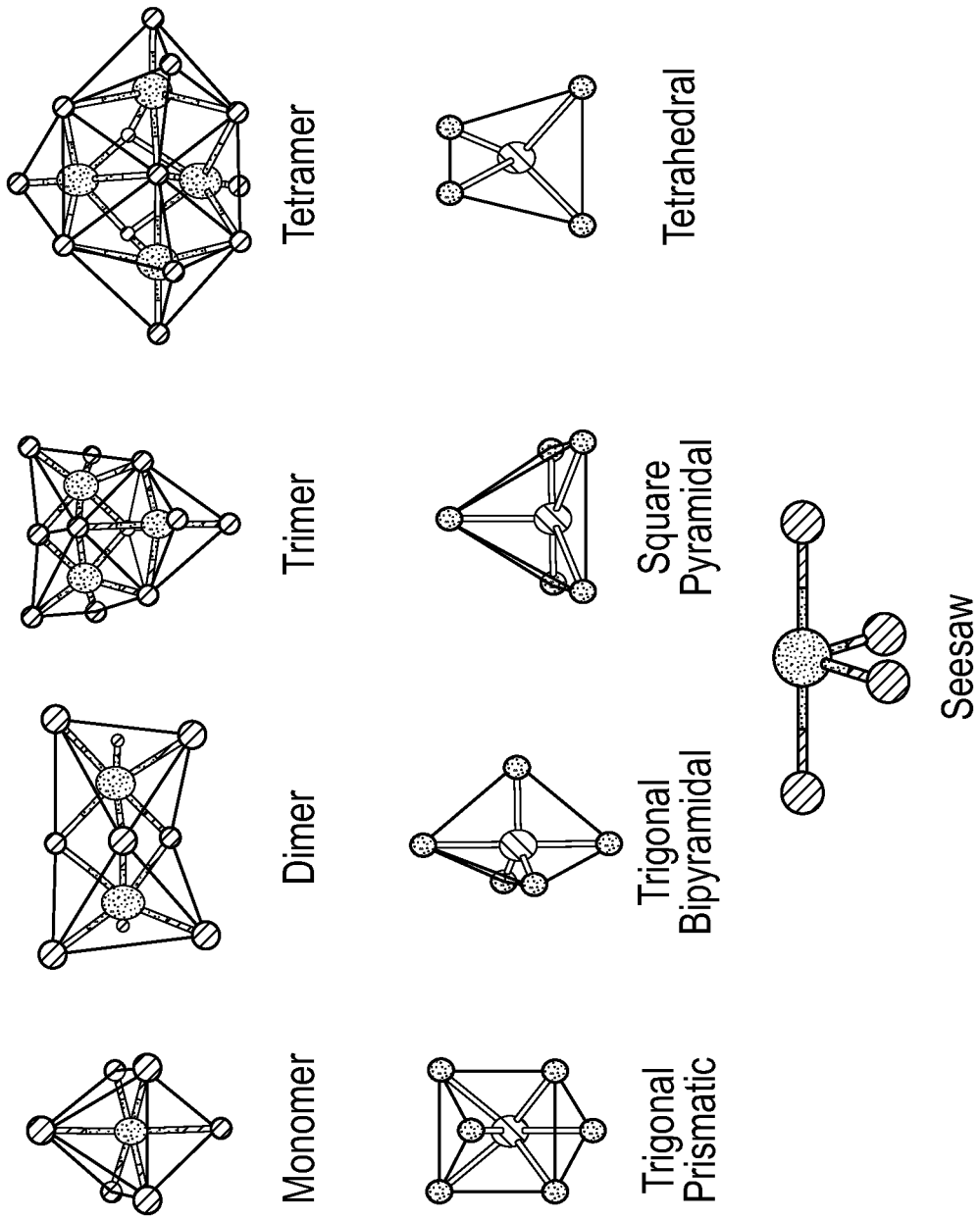
FIG. 1 depicts possible spatial arrangements of embodiments of metal halides.

Provided herein are bulk assemblies that may include an organic component (e.g., organic cations) and an inorganic component (e.g., metal halides).

Not wishing to be bound by any particular theory, it is believed that the use of organic and inorganic components, such as those disclosed herein, may permit the formation of embodiments of organic-inorganic hybrid bulk assemblies containing photoactive metal halides, which represent, in some embodiments, "perfect" host-guest systems in which the metal halides are periodically embedded in wide band gap organic networks through ionic bonds. Due to the lack of band formation or quantum size effect in some embodiments, the ionically bonded bulk assemblies can permit the individual photoactive molecular species to exhibit one or more of their intrinsic properties while in a bulk material, thereby possibly forming new generation high performance light emitting materials for optoelectronic devices.

In some embodiments, highly luminescent, strongly Stokes shifted broadband emissions with photoluminescence quantum efficiencies (PLQEs) of up to near-unity are exhibited, likely as a result of excited state structural reorganization of the individual metal halides.

In one aspect, a bulk assembly is provided. In some embodiments, the bulk assembly includes two or more photo- and/or electro-active species; and a wide band gap organic network. The wide band gap organic network may include a plurality of organic cations. Each of the two or more photo- and/or electro-active species may be (i) disposed in the wide band gap organic network, and (ii) isolated from each other. In some embodiments, the two or more photo- and/or electro-active species comprise two or more metal halides.

In some embodiments, the bulk assembly includes two or more metal halides, and a wide band gap organic network that includes a plurality of organic cations, wherein the two or more metal halides are (i) disposed in the wide band gap organic network, and (ii) isolated from each other.

The bulk assemblies provided herein may be crystalline materials. Therefore, when a bulk assembly herein is described as having a particular formula, (e.g., "$(C_9NH_{20})_7(PbX_4) Pb_3Cl_{11}$"), the formula represents a unit cell of the bulk assembly.

The phrase "wide band gap organic network", as used herein, refers to a network that is capable of eliminating or reducing interactions, band formation, or a combination thereof between two or more metal halides that are disposed in the network. In some embodiments, the wide band gap organic network allows the bulk assemblies provided herein to exhibit one or more intrinsic properties of the individual metal halides. In other words, the bulk assemblies herein include two or more halides and an organic network, and when the two or more halides are disposed in the organic network, the organic network forms a wide band gap organic network by eliminating or reducing interactions, band formation, or a combination thereof between the two or more metal halides.

The two or more metal halides are "isolated from each other" in the network when (i) the two or more metal halides that are disposed in the network do not contact each other, (ii) a portion of the network is arranged between the two or more metal halides, or (iii) a combination thereof.

Metal Halides

The two or more metal halides may be of any formula that permits the formation of the bulk assemblies provided herein. The two or more metal halides also may have any spatial arrangement that permits the formation of the bulk assemblies provided herein. The two or more metal halides may be of the same formula, or the two or more metal halides may have two or more different formulas. The two or more metal halides may have the same spatial arrangement, or the two or more metal halides may have two or more different spatial arrangements.

In some embodiments, each of the two or more metal halides are independently selected from the group consisting of (i) an octahedron of formula $MX_6$, (ii) a dimer of formula $M_2X_9$, (iii) a trimer of formula $M_3X_{11}$, (iv) a tetramer of formula $M_4X_{13}$, (v) a trigonal prismatic of formula $MX_6$, (vi) a trigonal bipyramid of formula $MX_5$, (vii) a square pyramid of formula $MX_5$, (viii) a tetrahedron of formula $MX_4$, and (ix) a seesaw of formula $MX_4$, wherein M is a metal atom, and X is a halide selected from the group consisting of Cl, Br, and I.

FIG. 1 depicts embodiments of possible spatial arrangements of the two or more metal halides, including an octahedron, a dimer, a trimer, a tetramer, a trigonal prismatic, a trigonal bipyramid, a square pyramid (which may be referred to as a "quadrangular pyramid"), a tetrahedron, and a seesaw.

The two or more metal halides generally may include any metal atom(s) that permit the formation of the bulk assemblies provided herein. In some embodiments, the metal atom includes Sn, Sb, Pb, Mn, or a combination thereof. Therefore, in the foregoing embodiments of formulas for the two or more metal halides, M may be independently selected from the group consisting of Sn, Pb, Sb, and Mn.

In some embodiments, the two or more metal halides are an octahedron of formula $MX_6$, M is Sn, and the two or more metal halides have a formula $SnX_6^{4-}$, wherein X is selected from Cl, Br, or I. In some embodiments, X is Br and the two or more metal halides have a formula $SnBr_6^{4-}$. In some embodiments, X is I, and the two or more metal halides have a formula $SnI_6^{4-}$. In some embodiments, X is Cl, and the two or more metal halides have a formula $SnCl_6^{4-}$.

In some embodiments, the two or more metal halides are a square pyramid of formula $MX_5$, M is Sb, and the two or more metal halides have a formula $SbX_5^{2-}$, wherein X is selected from Cl, Br, or I. In some embodiments, X is Br, and the two or more metal halides have a formula $SbBr_5^{2-}$. In some embodiments, X is I, and the two or more metal halides have a formula $SbI_5^{2-}$. In some embodiments, X is Cl, and the two or more metal halides have a formula $SbCl_5^{2-}$.

In some embodiments, the two or more metal halides have the seesaw of formula $MX_4$, wherein M is Sn, and the two or more metal halides have a formula $SnX_4^{2-}$, wherein X is selected from Cl, Br, or I. In some embodiments, X is Br, and the two or more metal halides have a formula $SnBr_4^{2-}$. In some embodiments, X is I, and the two or more metal halides have a formula $SnI_4^{2-}$. In some embodiments, X is Cl, and the two or more metal halides have a formula $SnCl_4^{2-}$.

In some embodiments, the two or more metal halide include (i) a tetrahedron of formula $MX_4$, and (ii) a trimer of formula $M_3X_{11}$, wherein M is Pb, and the two or more metal halides, respectively, have a formula $PbX_4^{2-}$ and a formula $PbX_{11}^{5-}$, wherein X is selected from Cl, Br, or I. In some embodiments, X is Cl, and the two or more metal halides have a formula $PbCl_4^{2-}$ and a formula $PbCl_{11}^{5-}$. In some embodiments, X is Br, and the two or more metal halides have a formula $PbBr_4^{2-}$ and a formula $PbBr_{11}^{5-}$. In some embodiments, X is I, and the two or more metal halides have a formula $PbI_4^{2-}$ and a formula $PbI_{11}^{5-}$.

Organic Cations

Generally, the plurality of organic cations may include organic cations of one or more types that are capable of forming a wide band gap organic network. In some embodiments, the plurality of organic cations includes a single type of organic cation. In some embodiments, the plurality of organic cations includes two or more different types of organic cations.

In some embodiments, the plurality of organic cations includes one or more quaternary ammonium cations, one or more tertiary ammonium cations, one or more secondary ammonium cations, one or more primary ammonium cations, or a combination thereof.

As used herein, the phrase "quaternary ammonium cations" generally refers to cations of the following formula:

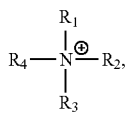

wherein $R_1$, $R_2$, $R_3$, and $R_4$ are independently selected from a monovalent $C_1$-$C_{20}$ hydrocarbyl.

As used herein, the phrase "tertiary ammonium cations" generally refers to cations of the following formula:

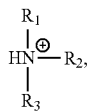

wherein $R_1$, $R_2$, and $R_3$ are independently selected from a monovalent $C_1$-$C_{20}$ hydrocarbyl.

As used herein, the phrase "secondary ammonium cations" generally refers to cations of the following formula:

wherein $R_1$ and $R_2$ are independently selected from a monovalent $C_1$-$C_{20}$ hydrocarbyl.

As used herein, the phrase "primary ammonium cations" generally refers to cations of the following formula:

wherein $R_1$ is selected from a monovalent $C_1$-$C_{20}$ hydrocarbyl.

In some embodiments, the plurality of organic cations includes a cation selected from N,N,N-trimethyloctan-1-aminium; tetraethylammonium; tetrabutylammonium; N,N-dimethylhexan-1-aminium; bis(2-ethylhexyl)ammonium; $N^1$-methylethane-1,2-diaminium; $N^1$,$N^2$-dimethylethane-1,2-diaminium; $N^1$,$N^1$,$N^2$,$N^2$-tetramethylethane-1,2-diaminium; $N^1$,$N^1$-dimethylethane-1,2-diaminium; $N^1$,$N^1$,$N^2$-trimethylethane-1,2-diaminium; 2,6-dimethylpyridin-1-ium; 2-amino-4-methylpyridin-1-ium; [4,4'-bipyridine]-1,1'-diium; [4,4'-bipyridin]-1-ium 4-(di(pyridin-4-yl)amino)pyridin-1-ium; 1-butyl-1-methylpyrrolidin-1-ium; 3-butyl-1-methyl-1H-imidazol-3-ium; 3-(pyrrolidin-1-yl)propan-1-aminium; 2-(pyrrolidin-2-yl)ethanaminium; 1,1-dibutylpiperidin-1-ium; 5-azaspiro[4.4]nonan-5-ium; (1r,3r,5s,7s)-1,3,5,7-tetraazaadamantane-1,3-diium; 6-azaspiro[5.5]undecan-6-ium; 1,4-diazabicyclo[2.2.2]octan-1-ium; (3s,5s,7s)-1-azaadamantan-1-ium; (3r,5r,7r)-1,3,5,7-tetraazaadamantan-1-ium; tetraphenylphosphonium, or a combination thereof. These compounds have the following structures:

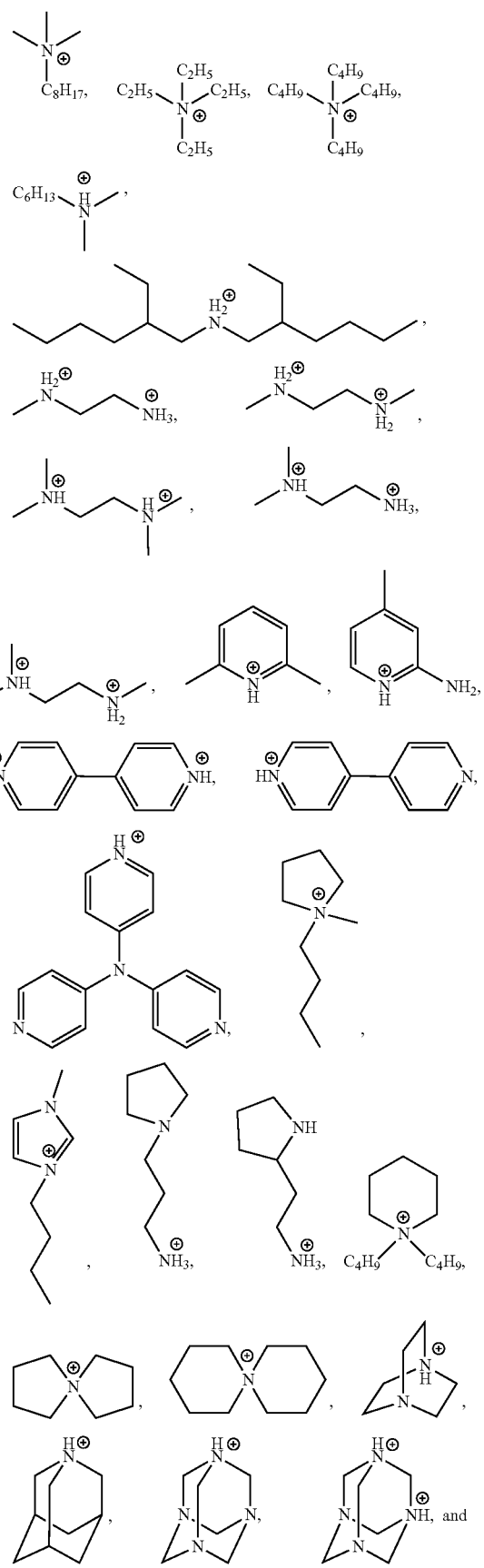

-continued

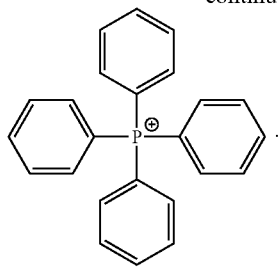

In some embodiments, the plurality of organic cations includes an organic cation selected from the group consisting of—

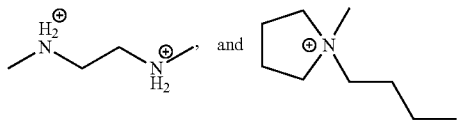

In some embodiments, the plurality of organic cations includes $C_4N_2H_{14}X^+$, $C_9NH_{20}^+$, or a combination thereof, wherein X is selected from Cl, Br, or I.

Bulk Assemblies

In some embodiments, the bulk assembly includes two or more halides of the formula $SnX_6$, a plurality of organic cations of the formula $C_4N_2H_{14}X^+$, and the bulk assembly has the following formula:

$(C_4N_2H_{14}X)_4SnX_6$, wherein X is selected from Cl, Br, or I. The two or more metal halides may be octahedron monomers (FIG. 1). In some embodiments, the bulk assembly has a PLQE of at least 70%, about 75%, about 80%, at least 80%, about 85%, at least 90%, or about 95%. In some embodiments, X is Br, and the bulk assembly has the formula $(C_4N_2H_{14}Br)_4SnBr_6$. In some embodiments, X is Br, the bulk assembly has the formula $(C_4N_2H_{14}Br)_4SnBr_6$, and the bulk assembly has a PLQE of at least 70%, about 75%, about 80%, at least 80%, about 85%, at least 90%, or about 95%. In some embodiments, X is I, and the bulk assembly has the formula $(C_4N_2H_{14}I)_4SnI_6$. In some embodiments, X is I, the bulk assembly has the formula $(C_4N_2H_{14}I)_4SnI_6$, and the bulk assembly has a PLQE of at least 70%, about 75%, about 80%, at least 80%, about 85%, at least 90%, or about 95%.

In some embodiments, the bulk assembly includes two or more halides of the formula $SbX_5$, a plurality of organic cations of the formula $C_9NH_{20}+$, and the bulk assembly has the following formula:

$(C_9NH_{20})_2SbX_5$, wherein X is selected from Cl, Br, or I. The two or more metal halides may be square pyramids (FIG. 1). In some embodiments, the bulk assembly has a PLQE of at least 70%, about 75%, about 80%, at least 80%, about 85%, at least 90%, at least 95%, or about 98%. In some embodiments, X is Cl, and the bulk assembly has the formula $(C_9NH_{20})_2SbCl_5$. In some embodiments, X is Cl, the bulk assembly has the formula $(C_9NH_{20})_2SbCl_5$, and the bulk assembly has a PLQE of at least 70%, about 75%, about 80%, at least 80%, about 85%, at least 90%, at least 95%, or about 98%. In some embodiments, X is I, and the bulk assembly has the formula $(C_9NH_{20})_2SbI_5$. In some embodiments, X is I, the bulk assembly has the formula $(C_9NH_{20})_2SbI_5$, and the bulk assembly has a PLQE of at least 70%, about 75%, about 80%, at least 80%, about 85%, at least 90%, at least 95%, or about 98%.

In some embodiments, the bulk assembly includes two or more halides of the formula $SbX_5$, a plurality of organic cations of the formula $Ph_4P+$, and the bulk assembly has the following formula:

$(Ph_4P)_2SbX_5$, wherein X is selected from Cl, Br, or I. The two or more metal halides may be square pyramids (FIG. 1). In some embodiments, the bulk assembly has a PLQE of at least 70%, about 75%, about 80%, at least 80%, about 85%, or about 87%. In some embodiments, X is Cl, and the bulk assembly has the formula $(Ph_4P)_2SbCl_5$. In some embodiments, X is Cl, the bulk assembly has the formula $(Ph_4P)_2SbCl_5$, and the bulk assembly has a PLQE of at least 70%, about 75%, about 80%, at least 80%, about 85%, or about 87%. In some embodiments, X is I, and the bulk assembly has the formula $(Ph_4P)_2SbI_5$. In some embodiments, X is I, the bulk assembly has the formula $(Ph_4P)_2SbI_5$, and the bulk assembly has a PLQE of at least 70%, about 75%, about 80%, at least 80%, about 85%, or about 87%.

In some embodiments, the bulk assembly includes two or more metal halides of the formula $SnX_4$, a plurality of organic cations of the formula $C_9NH_{20}+$, and the bulk assembly has the following formula:

$(C_9NH_{20})_2SnX_4$, wherein X is selected from Cl, Br, or I. The two or more metal halides may have a seesaw structure (FIG. 1). In some embodiments, the bulk assembly has a PLQE of at least 30%, about 35%, at least 40%, about 40%, about 45%, at least 45%, or about 46%. In some embodiments, X is Br, and the bulk assembly has the following formula $(C_9NH_{20})_2SnBr_4$. In some embodiments, X is Br, the bulk assembly has the following formula $(C_9NH_{20})_2SnBr_4$, and the bulk assembly has a PLQE of at least 30%, about 35%, at least 40%, about 40%, about 45%, at least 45%, or about 46%. In some embodiments, the bulk assembly of formula $(C_9NH_{20})_2SnBr_4$ is a lead-free organic metal halide hybrid material having a zero-dimensional (0D) structure, in which individual seesaw-shaped inorganic tin (II) bromide anions ($SnBr_4^{2-}$) are co-crystallized with organic 1-butyl-1-methylpyrrolidinium cations ($C_9NH_{20}^+$). In some embodiments, the bulk assemblies of formula $(C_9NH_{20})_2SnX_4$, wherein X is Cl, Br, or I, exhibit, upon photoexcitation, a highly efficient broadband deep-red emission peaked at about 695 nm, with [1] a Stokes shift of about 332 nm, [2] a quantum efficiency of about 46%, or [3] a combination thereof. Not wishing to be bound by any particular theory, it is believed that the photo-physical properties of the bulk assemblies of formula $(C_9NH_{20})_2SnX_4$, wherein X is Cl, Br, or I, may be attributed, at least in part, to (i) the 0D structure, which may allow the bulk crystals to exhibit the intrinsic properties of individual $SnX_4^{2-}$ species, and/or (ii) the seesaw structure, which may enable a pronounced excited state structural deformation. The seesaw structure may flatten to a tetrahedron structure in the excited state.

In some embodiments, the bulk assembly includes (i) two or more metal halides that include (a) a tetrahedron of formula $PbX_4^{2-}$ and (b) a trimer of formula $Pb_{11}X^{5-}$, (ii) a plurality of organic cations of the $C_9NH_{20}+$, and (iii) the bulk assembly has the following formula:

$(C_9NH_{20})_7(PbX_4)Pb_3X_{11}$, wherein X is selected from the group consisting of Cl, Br, and I. In some embodiments, the bulk assembly has a PLQE of at least 60%, about 65%, at least 70%, about 75%, about 80%, or about 83%. In some embodiments, X is Cl, and the bulk assembly has the following formula $(C_9NH_{20})_7(PbCl_4)Pb_3Cl_{11}$. In some embodiments, X is Br, and the bulk assembly has the following formula $(C_9NH_{20})_7(PbBr_4)Pb_3Br_{11}$. In some embodiments, X is I, and the bulk assembly has the following formula $(C_9NH_{20})_7(PbI_4)Pb_3I_{11}$.

Methods

Methods of forming bulk assemblies also are provided. In some embodiments, the methods include providing a precursor solution, and contacting the precursor solution and an anti-solvent to form the bulk assembly.

The precursor solution may include (i) a solvent, (ii) one or more compounds of formula $M^{y+}X_y$, wherein M is a metal selected from the group consisting of Sb, Pb, Sn, and Mn, X is Cl, Br, or I, and y is the charge of the metal, and (iii) one or more organic salts.

In some embodiments, the molar ratio of the one or more compounds of formula $M^{y+}X_y$ to the one or more organic salts is about 1:1.5 to about 1:2.5. In some embodiments, the molar ratio of the one or more compounds of formula $M^{y+}X_y$ to the one or more organic salts is about 1:2.

The solvent used in the methods provided herein may include any liquid that is capable of dissolving the metal halides and organic salts. In some embodiments, the solvent includes dimethylformamide. The anti-solvent may be any liquid that facilitate crystallization or removal of the bulk assembly from the solvent. In some embodiments, the anti-solvent includes diethylether.

The contacting of the precursor solution and the anti-solvent may be achieved diffusing the anti-solvent into the solution over a particular period of time (e.g., overnight, several hours, etc.). The amount of anti-solvent diffused into the precursor solution should be sufficient to crystallize or remove the bulk assembly from the solvent. In some embodiments, a 2:1 volume ratio of anti-solvent is diffused into the precursor solution (e.g., 2 mL of anti-solvent per 1 mL of precursor solution), but other volume ratios may be used, including those of about 1:1 to about 3:1.

The contacting of the precursor solution and the anti-solvent may be achieved by injecting the anti-solvent into the solution. The "injecting" contacts the solution with a pre-determined amount of anti-solvent in a relatively short time period (e.g., less than five seconds). Crystals may then be allowed to grow for several minutes (e.g., 10 minutes) before being collected.

The methods provided herein may product bulk assemblies at yield of about 50% to about 90%.

Light Emitting Composite Materials

Also provided herein are light emitting composite materials. The light emitting composite materials may include a matrix material in which bulk assemblies described herein may be dispersed. The light emitting composite materials may include one type of bulk assembly, or the light emitting composite materials may include two or more different types of bulk assemblies. When two or more different types of bulk assemblies are included in the light emitting composite materials, the different types of bulk assemblies may emit light of different colors, intensities, etc. In some embodiments, the light emitting composite materials emit white light.

In some embodiments, the light emitting composite materials include a first bulk assembly, a second bulk assembly, and a matrix material. The first bulk assembly and the second bulk assembly may be dispersed in the matrix material. The first bulk assembly and the second bulk assembly may include different metal halides, different wide bang gap organic networks, or both. In some embodiments, the first bulk assembly and the second bulk assembly are substantially uniformly dispersed in the matrix material. In some embodiments, the first bulk assembly and the second bulk assembly are non-uniformly dispersed in the matrix material.

The first bulk assembly and the second bulk assembly may generally be in any form that permits them to be dispersed in a matrix material. The physical form of the first bulk assembly and second bulk assembly may be the same or different. In some embodiments, the first bulk assembly and the second bulk assembly are in a particulate form (e.g., a powder).

Any weight ratio of the first bulk assembly to the second bulk assembly may be present in the light emitting composite materials. In some embodiments, the weight ratio of the first bulk assembly to the second bulk assembly is about 1:10 to about 10:1, but other ratios are envisioned. A weight ratio may be selected to achieve a desired emission (e.g., color of light, such as white light, etc.).

In some embodiments, the light emitting composite materials include a third bulk assembly. The third bulk assembly may include a metal halide and/or a wide band gap organic network that differs from the metal halide and/or wide band gap organic network of at least one of the first bulk assembly and the second bulk assembly. Any weight ratio of the first bulk assembly to the second bulk assembly to the third bulk assembly may be used in the light emitting composite materials.

In some embodiments, the first bulk assembly of the light emitting composite materials includes two or more first metal halides and a first wide band gap organic network. In some embodiments, (i) the two or more first metal halides include a tetrahedron of formula $MnX_4^{2-}$, (ii) the plurality of first organic cations of the first wide band gap organic network includes $Ph_4P+$, and (iii) the first bulk assembly has the following formula:

$$(Ph_4P)_2MnX_4,$$

wherein X is selected from the group consisting of Cl, Br, and I. In some embodiments, X is Br.

In some embodiments, the second bulk assembly of the light emitting composite materials includes two or more second metal halides and a second wide band gap organic network. In some embodiments, (i) the two or more second metal halides include an octahedron of formula $SnX_6^{4-}$, (ii) the plurality of second organic cations includes $C_4N_2H_{14}X^+$, and (iii) the second bulk assembly has the following formula:

$$(C_4N_2H_{14}X)_4SnX_6,$$

wherein X is selected from the group consisting of Cl, Br, and I. In some embodiments, X is Br.

In some embodiments, the third bulk assembly of the light emitting composite materials includes two or more third metal halides and a third wide band bap organic network. In some embodiments, (i) the two or more third metal halides include a square pyramid of formula $SbX_5^{2-}$ (ii) the plurality of third organic cations includes $Ph_4P^+$, and (iii) the third bulk assembly has the following formula:

$$(Ph_4P)_2SbX_5,$$

wherein X is selected from the group consisting of Cl, Br, and I. In some embodiments, X is Cl.

The matrix material of the light emitting composite materials may include a polymeric matrix. In some embodiments, the matrix material of the light emitting composite materials includes a polydimethylsiloxane.

The concentration of a bulk assembly or combination of bulk assemblies in a matrix material, in some embodiments, is about 5 mg/mL to about 50 mg/mL, about 10 mg/mL to about 40 mg/mL, about 15 mg/mL to about 30 mg/mL, about 20 mg/mL to about 30 mg/mL, or about 25 mg/mL. These concentrations are based on the total weight of the one or more bulk assemblies in the composite materials. For example, if three different types of bulk assemblies appear in a light emitting composite materials, the three different types of bulk assemblies may be combined to form a mixture, and if 25 mg of this mixture is added per mL of matrix material, then the concentration would be 25 mg/mL.

Devices

Light emitting devices are provided herein. In some embodiments, the light emitting devices include a light emitting material. The light emitting material may include one or more bulk assemblies. The light emitting material may include a first bulk assembly. In some embodiments, the light emitting material includes a first bulk assembly and a second bulk assembly. In some embodiments, the light emitting material includes a first bulk assembly, a second bulk assembly, and a third bulk assembly. The light emitting material may include a matrix material in which the one or more bulk assemblies are dispersed.

The light emitting devices, in some embodiments, are light emitting diodes.

The phrase "$C_1$-$C_{20}$ hydrocarbyl", and the like, as used herein, generally refers to aliphatic, aryl, or arylalkyl groups containing 1 to 20 carbon atoms. Examples of aliphatic groups, in each instance, include, but are not limited to, an alkyl group, a cycloalkyl group, an alkenyl group, a cycloalkenyl group, an alkynyl group, an alkadienyl group, a cyclic group, and the like, and includes all substituted, unsubstituted, branched, and linear analogs or derivatives thereof, in each instance having 1 to 20 carbon atoms. Examples of alkyl groups include, but are not limited to, methyl, ethyl, propyl, isopropyl, n-butyl, t-butyl, isobutyl, pentyl, hexyl, isohexyl, heptyl, 4,4-dimethylpentyl, octyl, 2,2,4-trimethylpentyl, nonyl, decyl, undecyl and dodecyl. Cycloalkyl moieties may be monocyclic or multicyclic, and examples include cyclopropyl, cyclobutyl, cyclopentyl, cyclohexyl, and adamantyl. Additional examples of alkyl moieties have linear, branched and/or cyclic portions (e.g., 1-ethyl-4-methyl-cyclohexyl). Representative alkenyl moieties include vinyl, allyl, 1-butenyl, 2-butenyl, isobutylenyl, 1-pentenyl, 2-pentenyl, 3-methyl-1-butenyl, 2-methyl-2-butenyl, 2,3-dimethyl-2-butenyl, 1-hexenyl, 2-hexenyl, 3-hexenyl, 1-heptenyl, 2-heptenyl, 3-heptenyl, 1-octenyl, 2-octenyl, 3-octenyl, 1-nonenyl, 2-nonenyl, 3-nonenyl, 1-decenyl, 2-decenyl and 3-decenyl. Representative alkynyl moieties include acetylenyl, propynyl, 1-butynyl, 2-butynyl, 1-pentynyl, 2-pentynyl, 3-methyl-1-butynyl, 4-pentynyl, 1-hexynyl, 2-hexynyl, 5-hexynyl, 1-heptynyl, 2-heptynyl, 6-heptynyl, 1-octynyl, 2-octynyl, 7-octynyl, 1-nonynyl, 2-nonynyl, 8-nonynyl, 1-decynyl, 2-decynyl and 9-decynyl. Examples of aryl or arylalkyl moieties include, but are not limited to, anthracenyl, azulenyl, biphenyl, fluorenyl, indan, indenyl, naphthyl, phenanthrenyl, phenyl, 1,2,3,4-tetrahydro-naphthalene, tolyl, xylyl, mesityl, benzyl, and the like, including any heteroatom substituted derivative thereof.

Unless otherwise indicated, the term "substituted," when used to describe a chemical structure or moiety, refers to a derivative of that structure or moiety wherein one or more of its hydrogen atoms is substituted with a chemical moiety or functional group such as alcohol, alkoxy, alkanoyloxy, alkoxycarbonyl, alkenyl, alkyl (e.g., methyl, ethyl, propyl, t-butyl), alkynyl, alkylcarbonyloxy (—OC(O)alkyl), amide (—C(O)NH-alkyl- or -alkylNHC(O)alkyl), tertiary amine (such as alkylamino, arylamino, arylalkylamino), aryl, aryloxy, azo, carbamoyl (—NHC(O)O-alkyl- or —OC(O)NH-alkyl), carbamyl (e.g., $CONH_2$, as well as CONH-alkyl, CONH-aryl, and CONH-arylalkyl), carboxyl, carboxylic acid, cyano, ester, ether (e.g., methoxy, ethoxy), halo, haloalkyl (e.g., —$CCl_3$, —$CF_3$, —$C(CF_3)_3$), heteroalkyl, isocyanate, isothiocyanate, nitrile, nitro, phosphodiester, sulfide, sulfonamido (e.g., $SO_2NH_2$, $SO_2NR'R''$), sulfone, sulfonyl (including alkylsulfonyl, arylsulfonyl and arylalkylsulfonyl), sulfoxide, thiol (e.g., sulfhydryl, thioether) or urea (—NHCONH-alkyl-).

While certain aspects of conventional technologies have been discussed to facilitate disclosure of various embodiments, applicants in no way disclaim these technical aspects, and it is contemplated that the present disclosure may encompass one or more of the conventional technical aspects discussed herein.

In the descriptions provided herein, the terms "includes," "is," "containing," "having," and "comprises" are used in an open-ended fashion, and thus should be interpreted to mean "including, but not limited to." When methods and bulk assemblies are claimed or described in terms of "comprising" various components or steps, the bulk assemblies and methods can also "consist essentially of" or "consist of" the various components or steps, unless stated otherwise.

The terms "a," "an," and "the" are intended to include plural alternatives, e.g., at least one. For instance, the disclosure of "a metal halide," "an organic cation," "a bulk assembly", and the like, is meant to encompass one, or mixtures or combinations of more than one metal halide, organic cation, bulk assembly, and the like, unless otherwise specified.

EXAMPLES

The present invention is further illustrated by the following examples, which are not to be construed in any way as imposing limitations upon the scope thereof. On the contrary, it is to be clearly understood that resort may be had to various other aspects, embodiments, modifications, and equivalents thereof which, after reading the description herein, may suggest themselves to one of ordinary skill in the art without departing from the spirit of the present invention or the scope of the appended claims. Thus, other aspects of this invention will be apparent to those skilled in the art from consideration of the specification and practice of the invention disclosed herein.

Unless noted otherwise, the following materials were used in the examples herein. Tin (II) bromide, tin (II) iodide, tin (II) bromide, antimony trichloride, N, N'-dimethylethylenediamine (99%), 1-butyl-1-methylpyrrolidinium chloride, γ-butyrolactone (GBL, ≥99%), hydrobromic acid (48 wt. % in $H_2O$), hydriodic acid (55%), and tetraphenylphosphonium chloride ($Ph_4PCl$, 98%) were purchased from Sigma-Aldrich. Dimethylformamide (DMF, 99.8%) and diethyl ether (Et$_2$O, anhydrous) were purchased for VWR. All reagents and solvents were used without further purification unless otherwise stated.
were purchased from Sigma-Aldrich. Dichloromethane (DCM, 99.9%), dimethylformamide (DMF, 99.8%), toluene (anhydrous, 99.8%), and ethyl ether (Stabilized with ~1 ppm BHT) were purchased from VWR. Acetone (HPLC grade) was purchased from EMD Millipore. 1-Butyl-1-methylpyrrolidinium bromide (C$_9$NH$_{20}$Br, 97.0%) was purchased from TCI America. All reagents and solvents were used without further purification unless otherwise stated. Spectroscopic grade solvents were used in the UV-Vis and photoluminescence spectroscopic measurements.

Example 1—Preparation of N, N'-dimethylethylene-1,2diammonium Halide Salts

N, N'-dimethylethylene-1,2diammonium bromide salts were prepared by adding a hydrobromic acid solution (2.2 equiv.) into N, N'-dimethylethylenediamine (1 equiv.) in ethanol at 0° C. The organic salts were obtained after removal of the solvents and starting reagents under vacuum, followed by washing with ethyl ether. The salts were dried and kept in a desiccator for future use. N, N'-dimethylethylene-1,2-diammonium iodide salts were prepared following a similar method.

Example 2—Solution Growth of Single Crystalline 0D Sn Halide Bulk Materials

Single crystalline bulk materials ((C$_4$N$_2$H$_{14}$X)$_4$SnX$_6$, X=Br or I) were prepared by slowly diffusing dichloromethane into a dimethylformamide precursor solution of tin halide (SnX$_2$, X=Br or I) and N, N'-dimethylethylene-1,2-diammonium halide (CH$_3$NH$_2^+$CH$_2$CH$_2$NH$_2^+$CH$_3$·2X$^-$) at room temperature in a N$_2$-filled glove box.
1. (C$_4$N$_2$H$_{14}$Br)$_4$SnBr$_6$ Specifically, tin(II) bromide and N, N'-dimethylethylene-1,2-diammonium bromide were mixed at a 1:4 molar ratio and dissolved in DMF to form a clear precursor solution. Bulk crystals were prepared by diffusing DCM into the DMF solution at room temperature overnight. The large colorless crystals were washed with acetone and dried under reduced pressure.

The yield was about 70%.

C$_{16}$H$_{56}$N$_8$SnBr$_{10}$: Anal, Calc. C, 15.03; H, 4.42; N, 8.77. Found: C, 15.31; H, 4.24; N, 8.74.
2. (C$_4$N$_2$H$_{14}$I)$_4$SnI$_6$ Tin(II) iodide and N, N'-dimethylethylene-1,2-diammonium iodide were mixed at a 1:4 molar ratio and dissolved in GBL to form a clear precursor solution.

Bulk crystals were prepared by diffusing DCM into the GBL solution at room temperature overnight. The large reddish crystals were washed with acetone and dried under reduced pressure.

The yield was about 70%. C$_{16}$H$_{56}$N$_8$SnI$_{10}$: Anal, Calc. C, 10.99; H, 3.23; N, 6.41. Found: C, 11.16; H, 3.23; N, 6.24.

Example 3—Solution Growth of Single Crystalline 0D Sb Halide Bulk Materials (C$_9$NH$_{20}$)$_2$SbCl$_5$ was prepared by slowly diffusing acetone into a dimethylformamide precursor solution that included antimony trichloride (SbCl$_3$) and 1-butyl-1-methylpyrrolidinium chloride (C$_9$NH$_{20}^+$·Cl$^-$).

Specifically, antimony (II) chloride and 1-butyl-1-methylpyrrolidinium chloride were mixed at a 1:2 molar ratio and dissolved in DMF to form a clear precursor solution. Bulk crystals were prepared by diffusing acetone into DMF solution at room temperature overnight.

The colorless crystals were washed with acetone and dried under reduced pressure. The yield was about 70%.

C$_{18}$H$_{40}$N$_2$SbCl$_5$: Anal, Calc. C, 37.05; H, 6.91; N, 4.80. Found: C, 37.32; H, 6.84; N, 4.83.

Example 4—Characterization

The materials of Example 1-3 were characterized using the following techniques.
1. Single Crystal X-ray Diffraction (SCXRD)

The crystal structures of the bulk assemblies of the examples were determined using single crystal X-Ray Diffraction (SCXRD), which showed a 0D structure with the individual metal halide ions, SnX$_6^{4-}$ and SbX$_5^{2-}$, completely isolated from each other and surrounded by the large organic ligands, C$_4$N$_2$H$_{14}$X$^+$ and C$_9$NH$_{20}^+$, respectively.

The following table includes single crystal x-ray diffraction data and collection parameters. The collection which resulted in the data of the following table was performed at a temperature of about 120 K.

| | Compound | | |
|---|---|---|---|
| | (C$_4$N$_2$H$_{14}$Br)$_4$SnBr$_6$ | (C$_4$N$_2$H$_{14}$I)$_4$SnI$_6$ | (C$_9$NH$_{20}$)$_2$SbCl$_5$ |
| Formula | [(CH$_3$NH$_2$)$_2$C$_2$H$_4$]$_4$SnBr$_{10}$ | [(CH$_3$NH$_2$)$_2$C$_2$H$_4$]$_4$SnI$_{10}$ | C$_{18}$H$_{40}$Cl$_5$N$_2$Sb |
| Molecular weight | 1278.40 g/mol | 1748.37 g/mol | 583.54 g/mol |
| Space group | P −1 (# 2) | P −1 | P 2$_1$/n |
| a | 10.2070(4) Å | 10.7464(7) Å | 8.7562(2) Å |
| b | 10.6944(4) Å | 10.8924(7) Å | 27.2439(5) Å |
| c | 18.5996(6) Å | 11.1796(7) Å | 10.64230(2) Å |
| α | 94.043(3)° | 64.2658(7)° | 90.0000° |
| β | 102.847(3)° | 80.1825(7)° | 97.354(2)° |
| γ | 97.904(3)° | 72.8331(7)° | 90.0000° |
| V | 1949.89(12) Å$^3$ | 1124.94(12) Å$^3$ | 2518.02(8) Å$^3$ |
| Z | 2 | 1 | 4 |
| ρ$_{calc.}$ | 2.177 g/cm$^3$ | 2.581 g/cm$^3$ | 1.539 g/cm$^3$ |
| μ | 10.922 mm$^{-1}$ | 7.448 mm$^{-1}$ | 1.633 mm$^{-1}$ |
| Data collection range | 2.815° < θ < 34.220° | 1.986° < θ < 29.408° | 2.782° < θ < 31.981° |
| Reflections collected | 57392 | 14019 | 32635 |

-continued

| | Compound | | |
|---|---|---|---|
| | $(C_4N_2H_{14}Br)_4SnBr_6$ | $(C_4N_2H_{14}I)_4SnI_6$ | $(C_9NH_{20})_2SbCl_5$ |
| Independent reflections | 11532 | 5710 | 8177 |
| Parameters refined | 540 | 165 | 395 |
| Restraints | 240 | 0 | 174 |
| $R_1$, $wR_2$ | $0.0651^a$, $0.0511^b$ | 0.0178, 0.0349 | 0.0418, 0.0542 |
| Goodness-of-fit on $F^2$ | 0.9933 | 1.078 | 0.9984 |

$^a R_1 = \Sigma \|F_o| - |F_c\| / \Sigma |F_o|$.
$^b wR_2 = [\Sigma w(F_o^2 - F_c^2)^2 / \Sigma w(F_o^2)^2]^{1/2}$.

The materials of this example (i.e., $(C_4N_2H_{14}X)_4SnX_6$, X=Br, I) could be considered true 0D organometal halide perovskites. The complete isolation between the photoactive metal halides by the wide band gap organic ligands, with the distance between two metal centers of >1 nm, as depicted at FIG. 2 and FIG. 3, resulted in no interactions between the photoactive metal halides or band formation.

Figure 2:
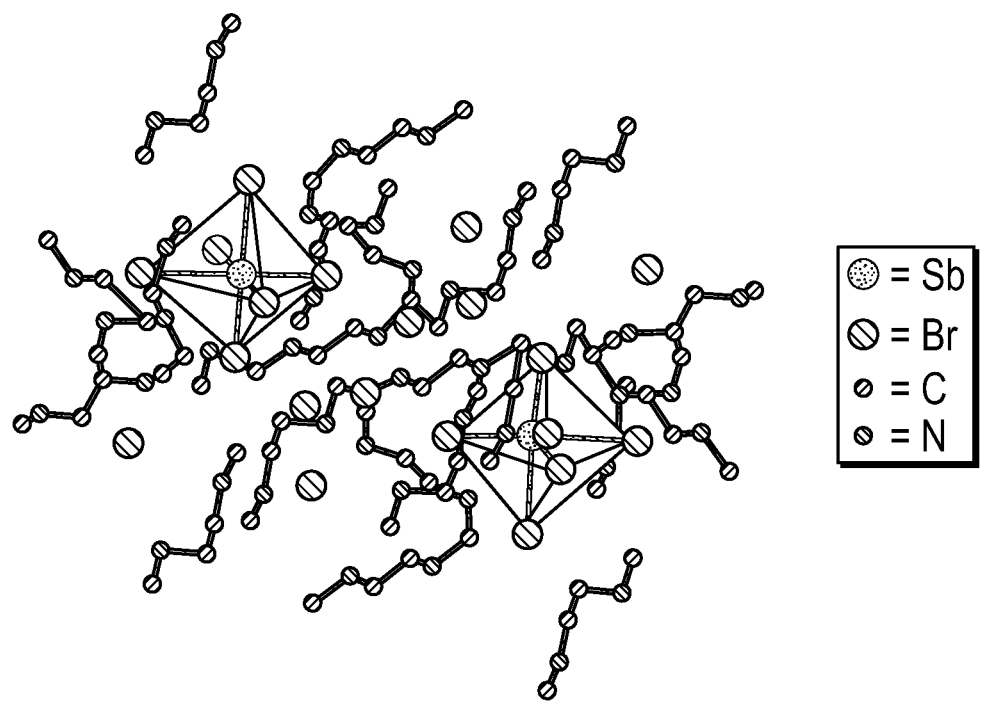
FIG. 2 depicts an embodiment of a bulk assembly that includes embodiments of two $SnBr_6^{4-}$ octahedron species that are isolated from each other and surrounded by $C_4N_2H_{14}Br^+$ ligands.

FIG. 2 depicts two $SnBr_6^{4-}$ octahedron species completely isolated from each other and surrounded by $C_4N_2H_{14}Br^+$ ligands.

Figure 3:
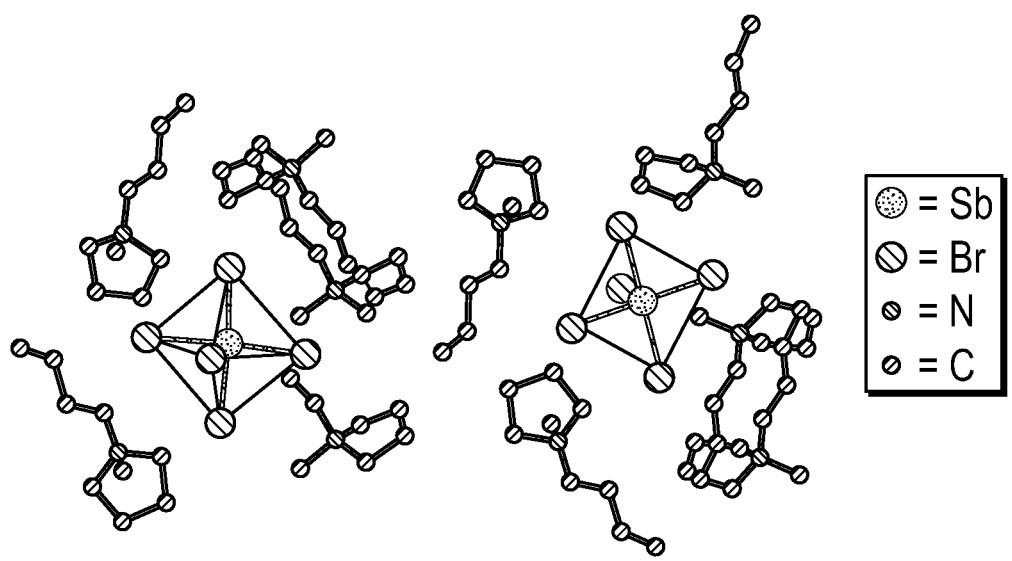
FIG. 3 depicts an embodiment of a bulk assembly that includes embodiments of two isolated $SbCl_5^{2-}$ quadrangular pyrimid species that are surrounded by $C_9NH_{20}^+$ ligands.

FIG. 3 depicts two completely isolated $SbCl_5^{2-}$ quadrangular pyrimid species surrounded by $C_9NH_{20}^+$ ligands.

Space-filling models of the materials of this example were prepared, and the depictions indicated full coverage of the individual metal halides by organic ligands, which suggested a perfect 0D core-shell structure.

Figure 4:
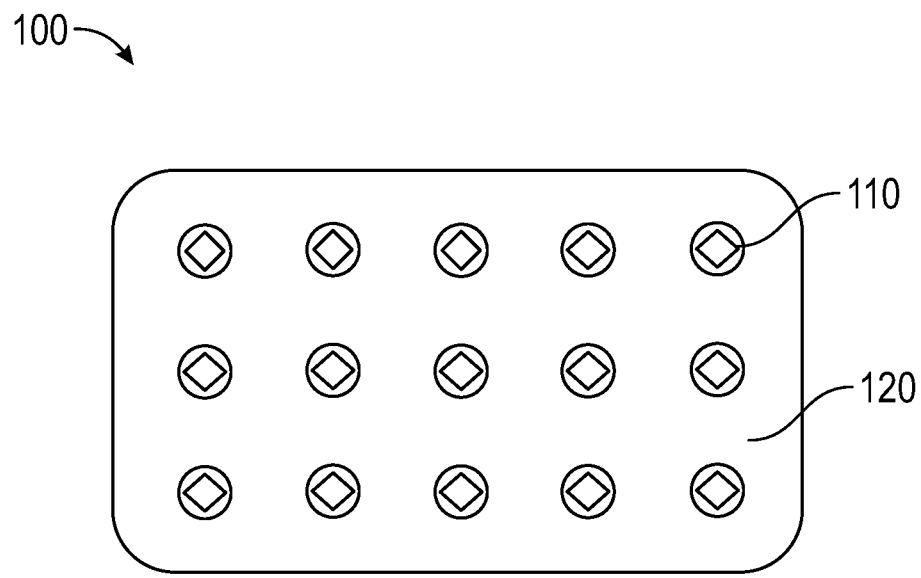
FIG. 4 is a schematic drawing of an embodiment of a perfect host-guest system 100.
Figure 5:
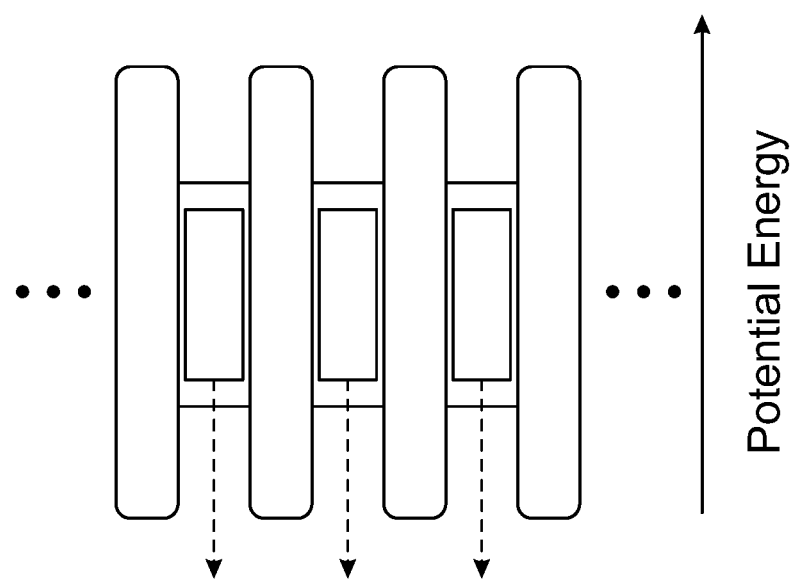
FIG. 5 depicts a potential energy diagram of the perfect host-guest system 100 of FIG. 4.

FIG. 4 is a schematic drawing of a perfect host-guest system 100 with the light emitting species 110 periodically embedded in an inert matrix 120, and FIG. 5 depicts a corresponding potential energy diagram of the perfect host-guest system 100 of FIG. 4.

The potential energy diagram for the bulk assemblies of 0D core-shell quantum confined materials of this example, or perfect host-guest systems (FIG. 4), can be described by the schematic of FIG. 5. The bulk materials of Example 1 may exhibit one or more intrinsic properties of the individual metal halides.

Single crystal x-ray diffraction data of $(C_4N_2H_{14}Br)_4SnBr_6$ was collected using an Oxford-Diffraction Xcalibur-2 CCD diffractometer with graphite-monochromated Mo Kα radiation. The crystal was mounted in a cryoloop under Paratone-N oil and cooled to 120 K with an Oxford-Diffraction Cryojet. A complete sphere of data was collected using ω scans with 1° frame widths to a resolution of 0.6 Å, equivalent to 2θ≈72.5°. Reflections were recorded, indexed and corrected for absorption using the Oxford-Diffraction CrysAlisPro software, and subsequent structure determination and refinement was carried out using CRYSTALS, employing Superflip to solve the crystal structure.

The data did not allow for an unconstrained refinement: all hydrogens were restrained to the connecting nitrogen or carbon. The refinement was performed against $F^2$, with anisotropic thermal displacement parameters for all non-hydrogen atoms and with isotropic thermal displacement parameters for the hydrogens in the structure. The crystal structure of $(C_9NH_{20})_2SbCl_5$ was resolved using the same method. $(C_4N_2H_{14}I)_4SnI_6$ was mounted on a nylon loop with the use of heavy oil. The sample was held at 100 K for data collection. The data were taken on a Bruker SMART APEX II diffractometer using a detector distance of 6 cm.

The number of frames taken was 2400 using 0.3-degree omega scans with either 20 or 30 seconds of frame collection time. Integration was performed using the program SAINT which was part of the Bruker suite of programs. Absorption corrections were made using SADABS. XPREP was used to obtain an indication of the space group and the structure was typically solved by direct methods and refined by SHELXTL. The non-hydrogen atoms were refined anisotropically. VESTA was used as the crystal structure visualization software for the images presented in the manuscript.

2. Powder X-Ray Diffraction (PXRD)

Figure 6:
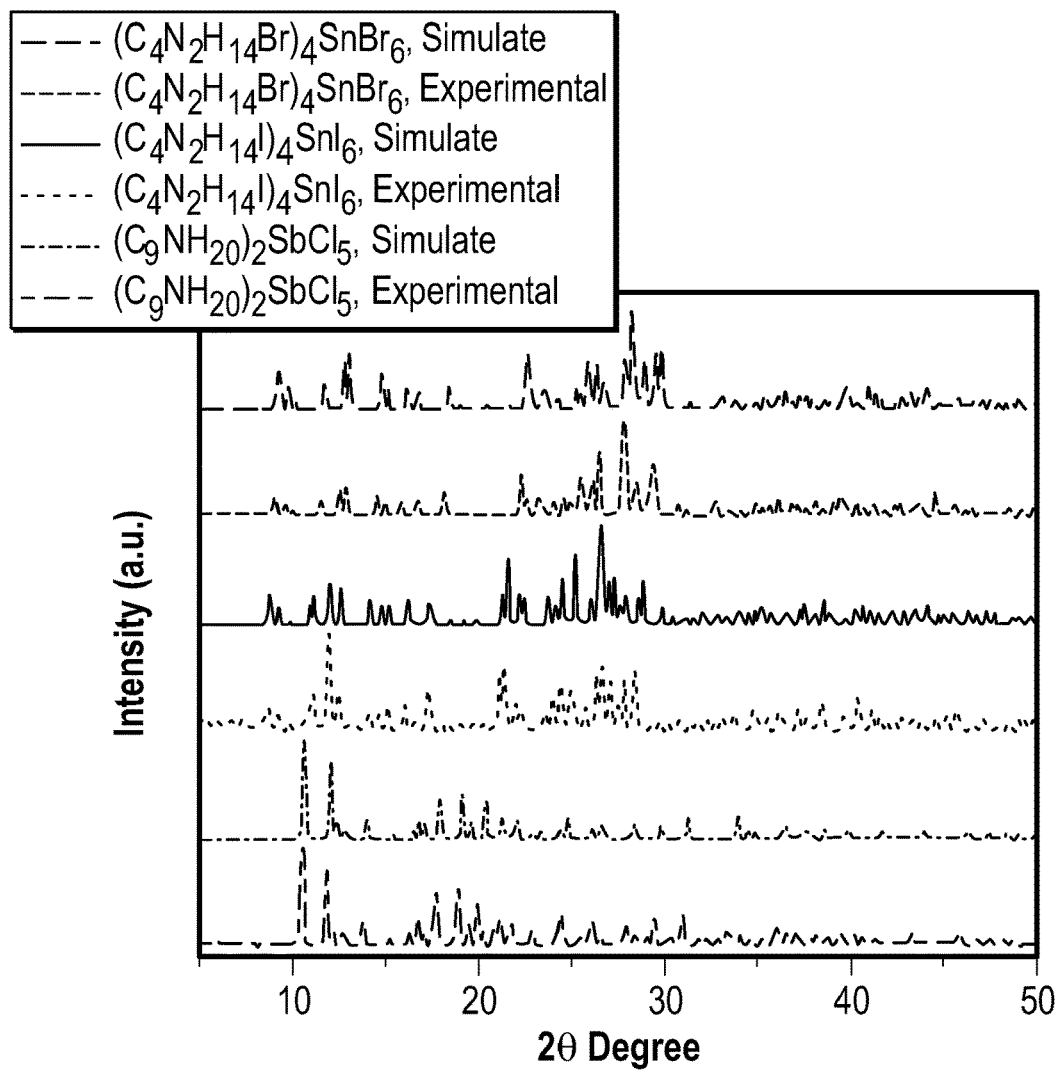
FIG. 6 depicts powder X-ray diffraction patterns (PXRD) collected for embodiments of powder bulk assemblies as well as simulated results.

Powder X-ray diffraction (PXRD) patterns of ball-milled crystal powders were collected, and the patterns displayed exactly the same features as simulated patterns from SCXRD (FIG. 6), which suggests a uniform crystal structure of as-synthesized bulk assemblies.

The PXRD analysis was performed on Panalytical X'PERT Pro Powder X-Ray Diffractometer using Copper X-ray tube (standard) radiation at a voltage of 40 kV and 40 mA, and X'Celerator RTMS detector. The diffraction pattern was scanned over the angular range of 5-50 degree (2θ) with a step size of 0.02, at room temperature. Simulated powder patterns were calculated by Mercury software using the crystallographic information file (CIF) from single-crystal x-ray experiment.

3. Sn Nuclear Magnetic Resonance (NMR)

Elemental analysis also confirmed the purity and uniformity of the bulk assemblies of this example. To further verify the structure, composition, and the presence of only Sn (II) in the Sn-based materials, solid state $^{119}$Sn nuclear magnetic resonance spectroscopy (NMR) (FIG. 7) and X-ray photoelectron spectroscopy (XPS) (FIG. 8A and FIG. 8B) analyses were performed.

Figure 7:
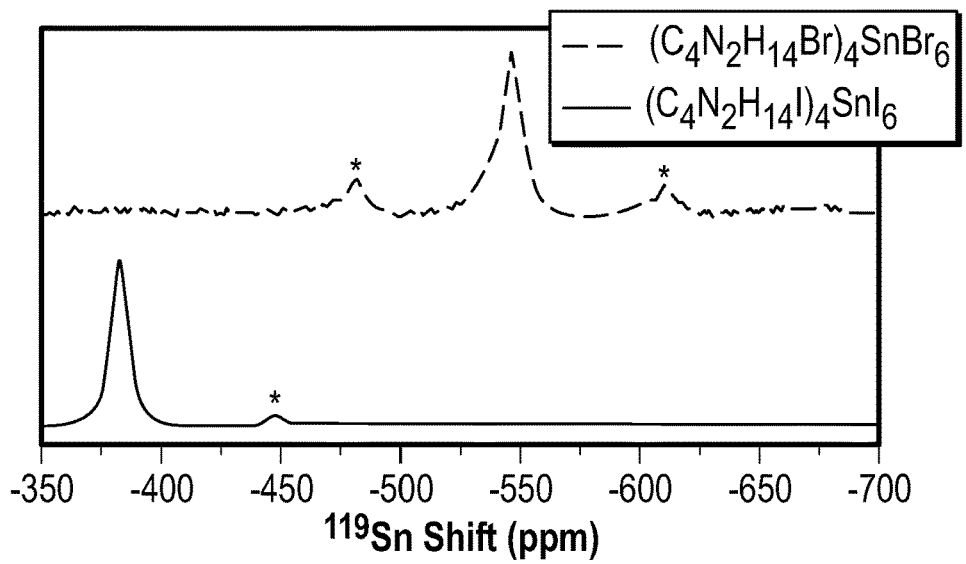
FIG. 7 depicts $^{119}Sn$ MAS NMR spectra of embodiments of Sn halide bulk assemblies recorded at room temperature spinning at 12 kHz (spinning sidebands are indicated with asterisks).

FIG. 7 depicts an $^{119}$Sn MAS NMR spectra of Sn halide bulk assemblies recorded at room temperature spinning at 12 kHz. Spinning sidebands are indicated with asterisks.

The $^{119}$Sn MAS NMR spectra were recorded on a Bruker Advance III HD spectrometer equipped with 4 mm MAS probe, operating at 186.5 MHz with the samples spinning at 12 kHz, high power proton decoupling, 30 s recycle delay, and typically 2048 scans. $SnO_2$ was used as a secondary reference at −604.3 ppm.

4. X-Ray Photoelectron Spectroscopy (XPS)

Figure 8A:
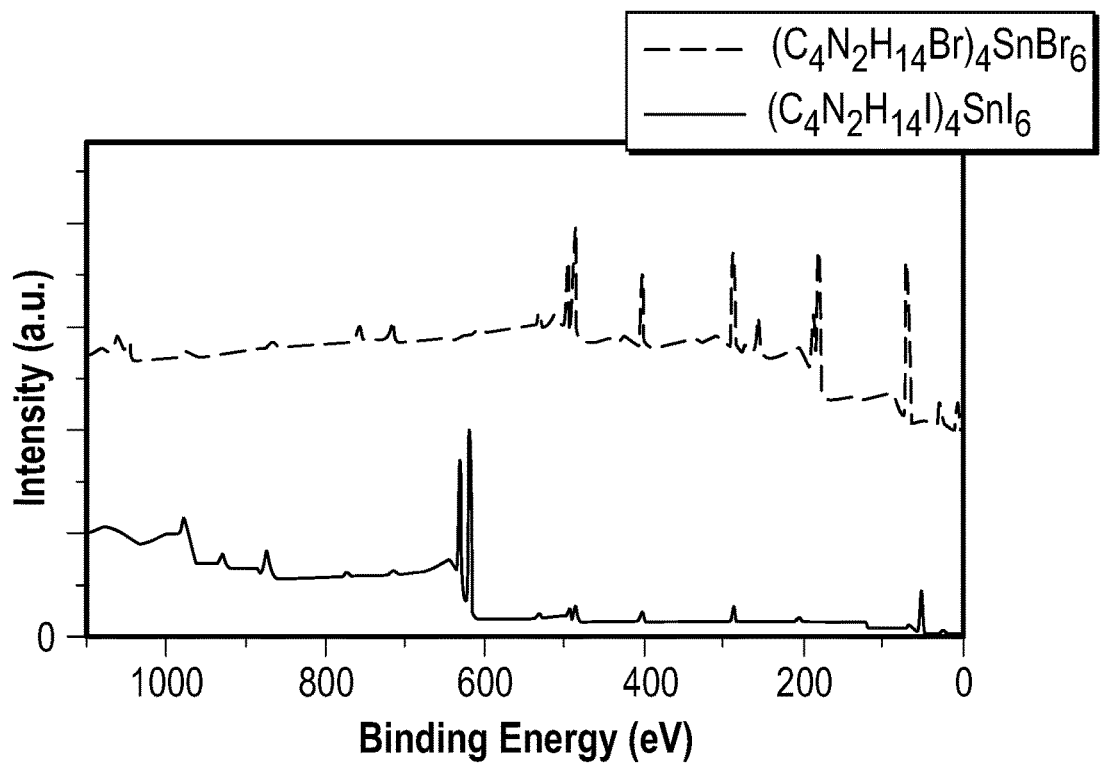
FIG. 8A depicts a survey spectra of two embodiments of Sn halide bulk assemblies.
Figure 8B:
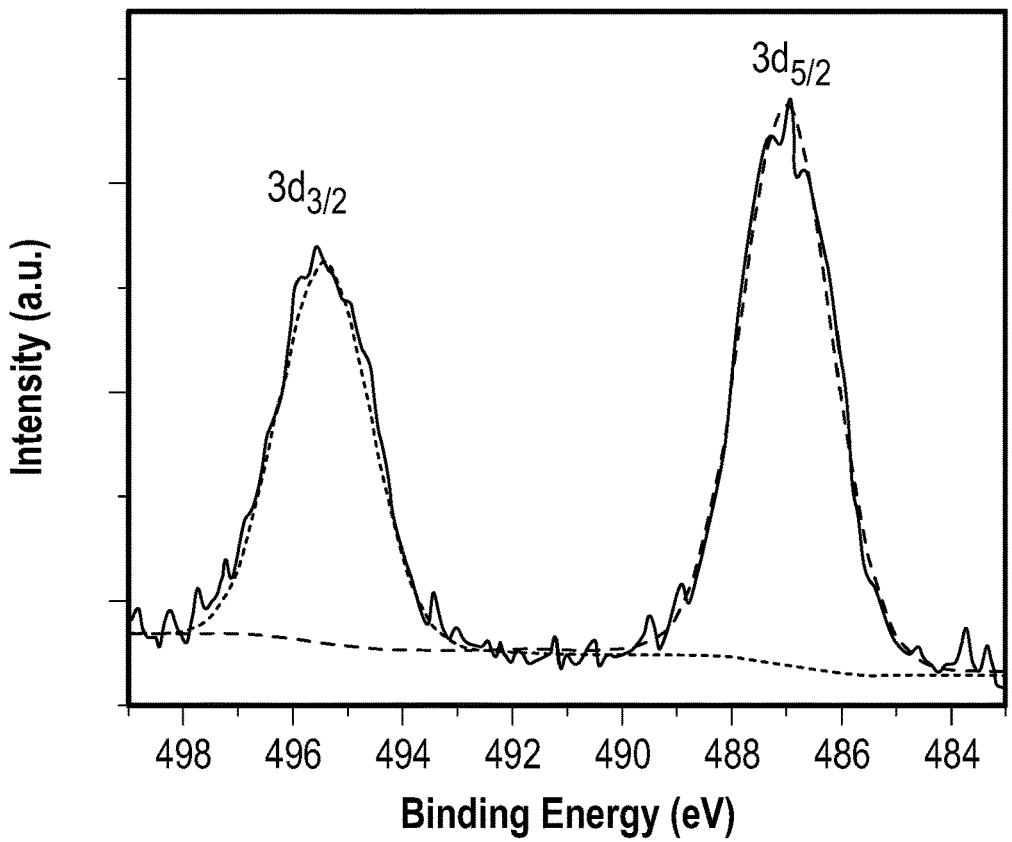
FIG. 8B depicts high resolution Sn spectra of one embodiment of a material having the following formula: $(C_4N_2H_{14}Br)_4SnBr_6$.

FIG. 8A and FIG. 8B depict X-ray photoelectron spectroscopy (XPS) of the Sn halide bulk assemblies of this example. FIG. 8A depicts a survey spectra of two embodiments of Sn halide bulk assemblies, and FIG. 8B depicts high resolution Sn spectra of one embodiment of a material having the following formula: $(C_4N_2H_{14}Br)_4SnBr_6$.

XPS measurements were carried out using a ULVACPHI, Inc., PHI 5000 VersaProbe II. The survey XPS spectra were recorded with a monochromatic Al Kα source using a 93.9 pass energy and 0.8 eV/step. High-resolution spectra were recorded using a 11.75 pass energy and step. The high-resolution spectra binding energies were assigned using a C 1 s binding energy of 286.2 eV for the C—N═bonds in the $(C_4N_2H_{14}Br)_4SnBr_6$. A binding energy of 487.0 eV for the Sn 3d5 was then found to correspond to that of Sn (II) in $SnBr_2$.

The photophysical properties of the bulk assemblies were characterized using UV-Vis absorption spectroscopy, as well as steady state and time-resolved emission spectroscopies, as explained in the following paragraphs. Major photophysical properties are summarized at Table 1.

TABLE 1

Photophysical properties of bulk assemblies at room temperature and 77 K.

| Materials | $\lambda_{exc}$, nm | $\lambda_{em}$, nm | FWHM, nm | Stokes shift, nm | Φ, % | $\tau_{av}$, μs |
|---|---|---|---|---|---|---|
| $(C_4N_2H_{14}Br)_4SnBr_6$ | 355 | 570 (530) | 105 (63) | 215 | 95 ± 5 | 2.2 (1.8) |
| $(C_4N_2H_{14}I)_4SnI_6$ | 410 | 620 (626) | 118 (63) | 210 | 75 ± 4 | 1.1 (1.1) |
| $(C_9NH_{20})_2SbCl_5$ | 380 | 590 (592) | 119 (77) | 210 | 98 ± 2 | 4.2 (4.7) |

$\lambda_{exc}$ is the wavelength at excitation maximum; $\lambda_{em}$ is the wavelength at the emission maximum, Φ is the photoluminescence quantum efficiency; $\tau_{av}$ is the photoluminescence lifetime; the values in parentheses are for 77 K.

Figure 9:
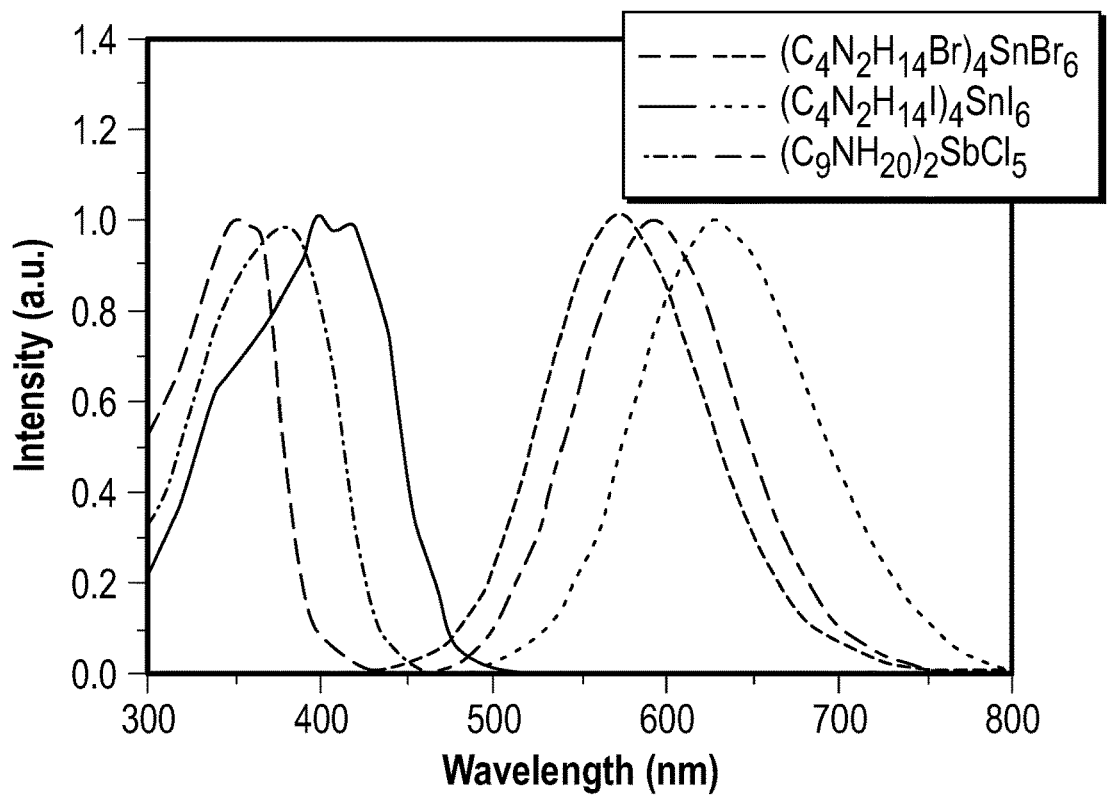
FIG. 9 depicts the excitation (dash lines) and emission (solid lines) spectra of embodiments of bulk assemblies at room temperature.

Images were collected of the bulk assemblies of this example under ambient light and a UV lamp irradiation (365 nm). Highly luminescent yellow, red, and orange emissions under UV irradiation were observed for $(C_4N_2H_{14}Br)_4SnBr_6$, $(C_4N_2H_{14}I)_4SnI_6$, and $(C_9NH_{20})_2SbCl_5$, respectively, with the excitation and emission spectra depicted at FIG. 9. FIG. 9 depicts the excitation (dash lines) and emission (solid lines) spectra of the bulk assemblies at room temperature.

Figure 10:
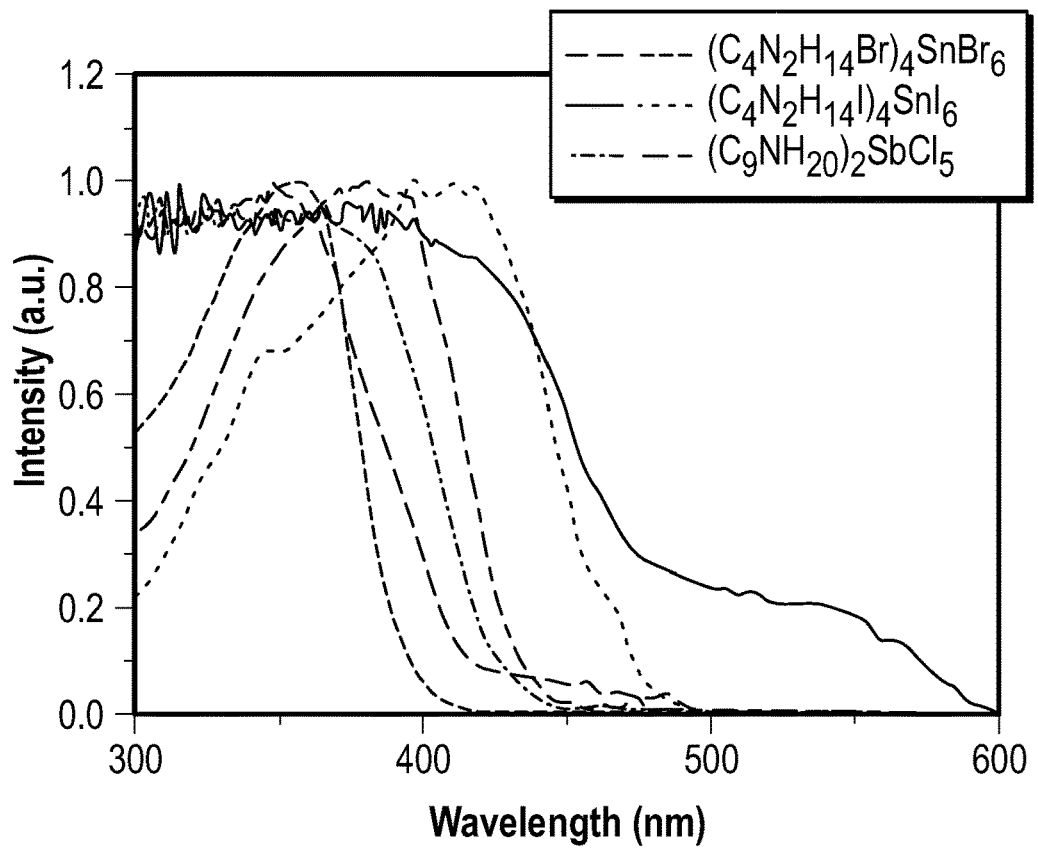
FIG. 10 depicts the absorption (dash lines) and excitation (solid lines) spectra of embodiments of bulk assemblies recorded at room temperature.

The absorption spectra of these bulk assemblies matched well with their excitation spectra, except the scattering in the low energy regions (FIG. 10). FIG. 10 depicts the absorption (dash lines) and excitation (solid lines) spectra of the bulk assemblies of this example recorded at room temperature.

The excitation maxima shift from 355 nm to 410 nm upon substitution of Br with I in the $SnX_6^{4-}$ octahedron was consistent with the weaker ligand field effect of I versus Br. The emissions of these bulk assemblies showed extremely large Stokes shift (>200 nm) and full width at half maximum (FWHM) (>100 nm), which were similar to those observed in rare-earth doped phosphors with localized excited states.

Figure 11:
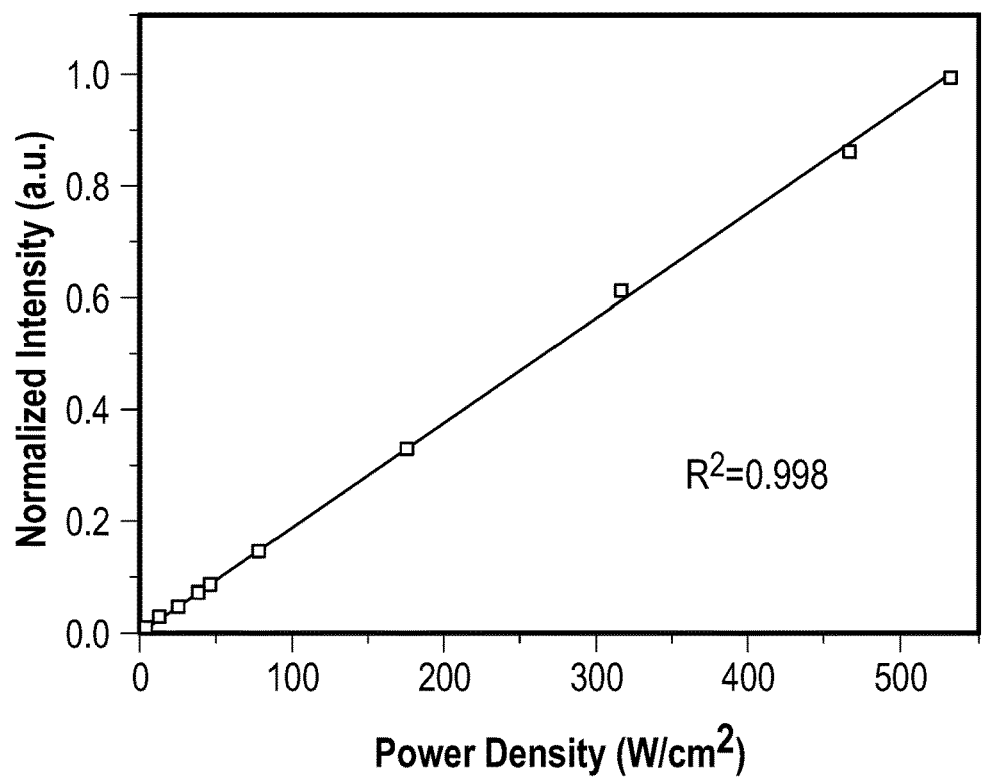
FIG. 11 depicts the emission intensity versus excitation power for $(C_4N_2H_{14}Br)_4SnBr_6$ at room temperature.

To verify that these emissions represented the intrinsic properties of the bulk assemblies of this example, the dependence of emission intensity on excitation power at room temperature was measured. As depicted at FIG. 11, the intensity of the broadband yellow emission from $(C_4N_2H_{14}Br)_4SnBr_6$ exhibited a linear dependence on the excitation power up to 500 W/cm², which suggests that the emission did not arise from permanent defects. The emissions of these materials became narrower at 77 K (FIG. 12), which was likely due to reduced thermally populated vibrational states at low temperature.

Figure 12:
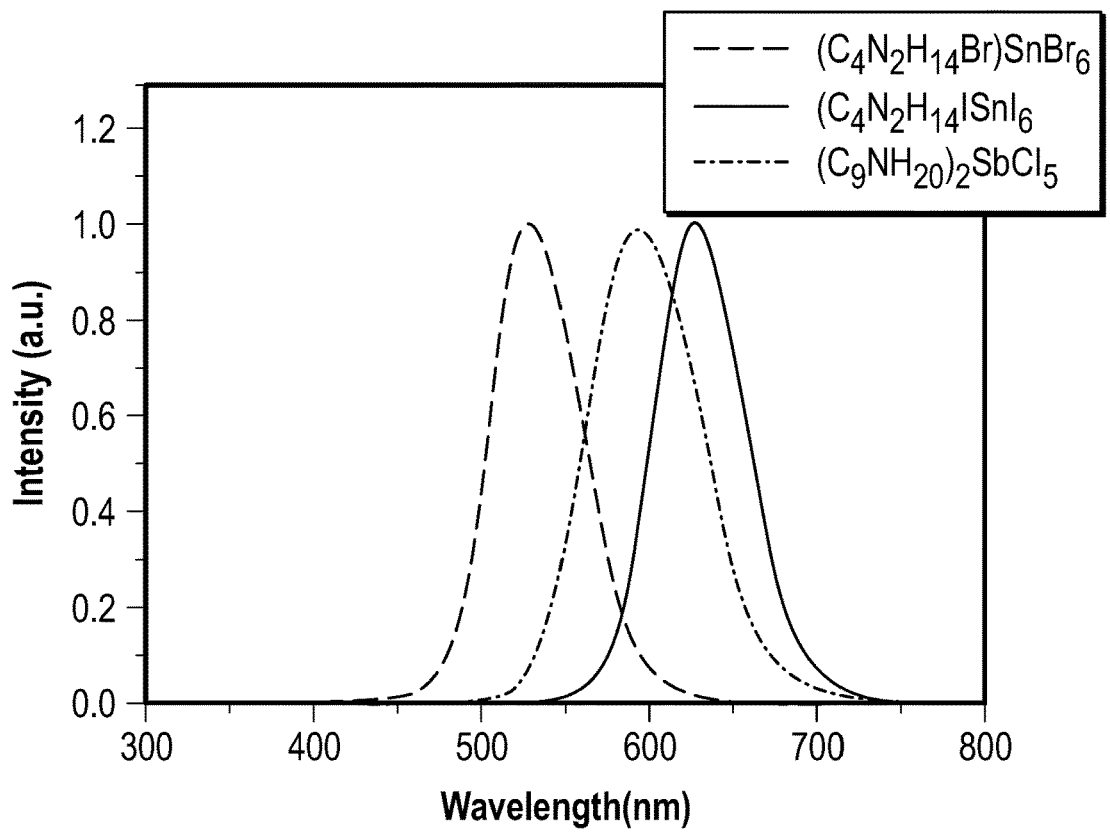
FIG. 12 depicts emission spectra of embodiments of bulk assemblies at 77 K.

FIG. 11 depicts the emission intensity versus excitation power for $(C_4N_2H_{14}Br)_4SnBr_6$ at room temperature. FIG. 12 depicts emission spectra of the bulk assemblies of this example at 77 K.

Figure 13:
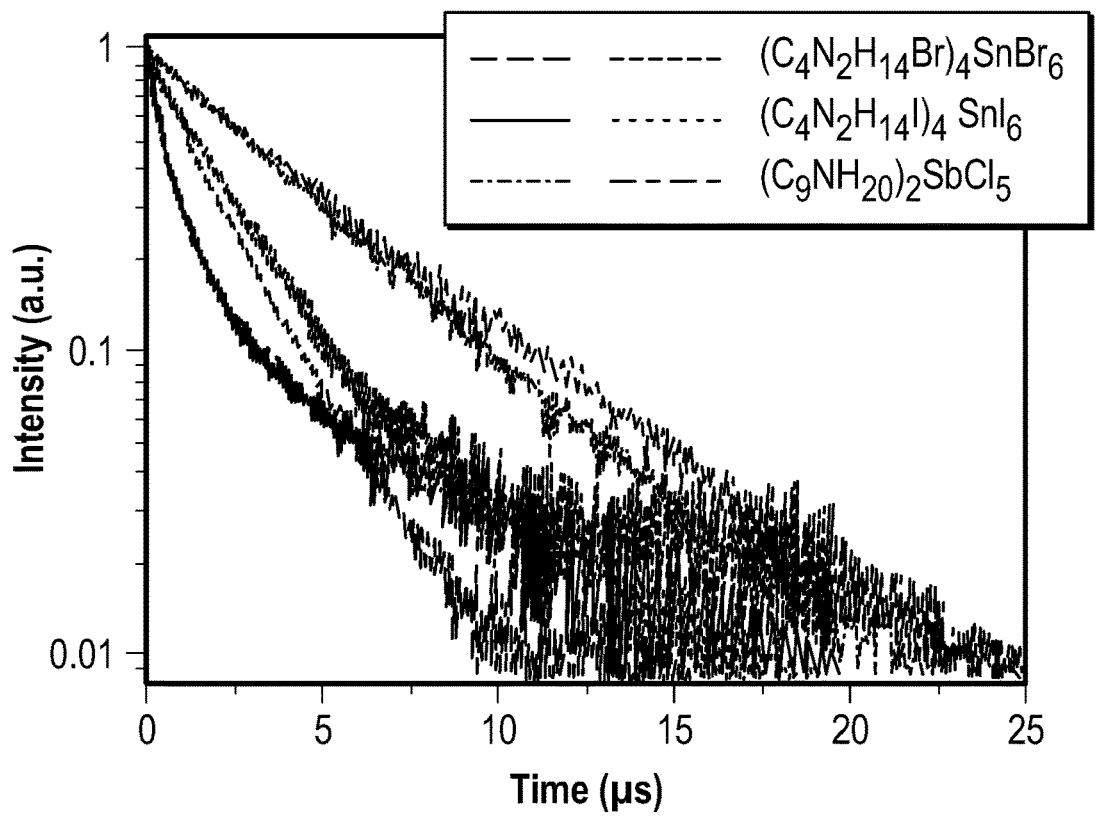
FIG. 13 depicts the emission decays of embodiments of bulk assemblies at room temperature (solid lines) and 77 K (dash lines).

The decay curves of broadband emissions from these bulk assemblies at room temperature and 77K are depicted at FIG. 13. Specifically, FIG. 13 depicts the emission decays of the bulk assemblies of this example at room temperature (solid lines) and 77 K (dash lines). The decay curves indicate long lifetimes of ~2.2 μs for $(C_4N_2H_{14}Br)_4SnBr_6$, ~1.1 μs for $(C_4N_2H_{14}I)_4SnI_6$, and ~4.2 μs for $(C_9NH_{20})_2SbCl_5$. The similar decay behaviors at room temperature and 77 K that were observed suggest little to no change of the characteristics of radiative and non-radiative processes.

Figure 14:
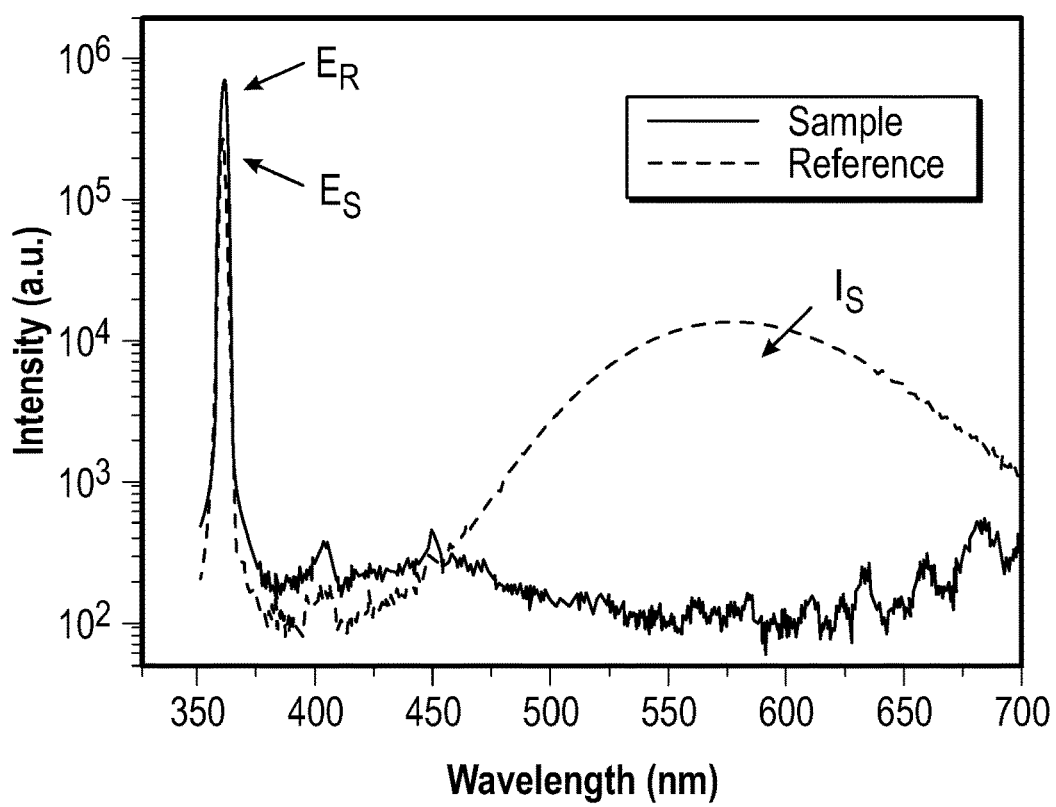
FIG. 14 depicts the excitation line of reference and emission spectrum of $(C_4N_2H_{14}Br)_4SnBr_6$ collected by an integrating sphere.

The bulk assemblies of this example possessed extremely high PLQEs at room temperature: 95±5% for $(C_4N_2H_{14}Br)_4SnBr_6$, 75±4% for $(C_4N_2H_{14}I)_4SnI_6$, and 98±2% for $(C_9NH_{20})_2SbCl_5$ (FIG. 14).

FIG. 14 depicts the excitation line of reference and emission spectrum of $(C_4N_2H_{14}Br)_4SnBr_6$ collected by an integrating sphere. The PLQE was calculated by the equation:

$$\eta_{QE} = I_S/(E_R - E_S).$$

Figure 15A:
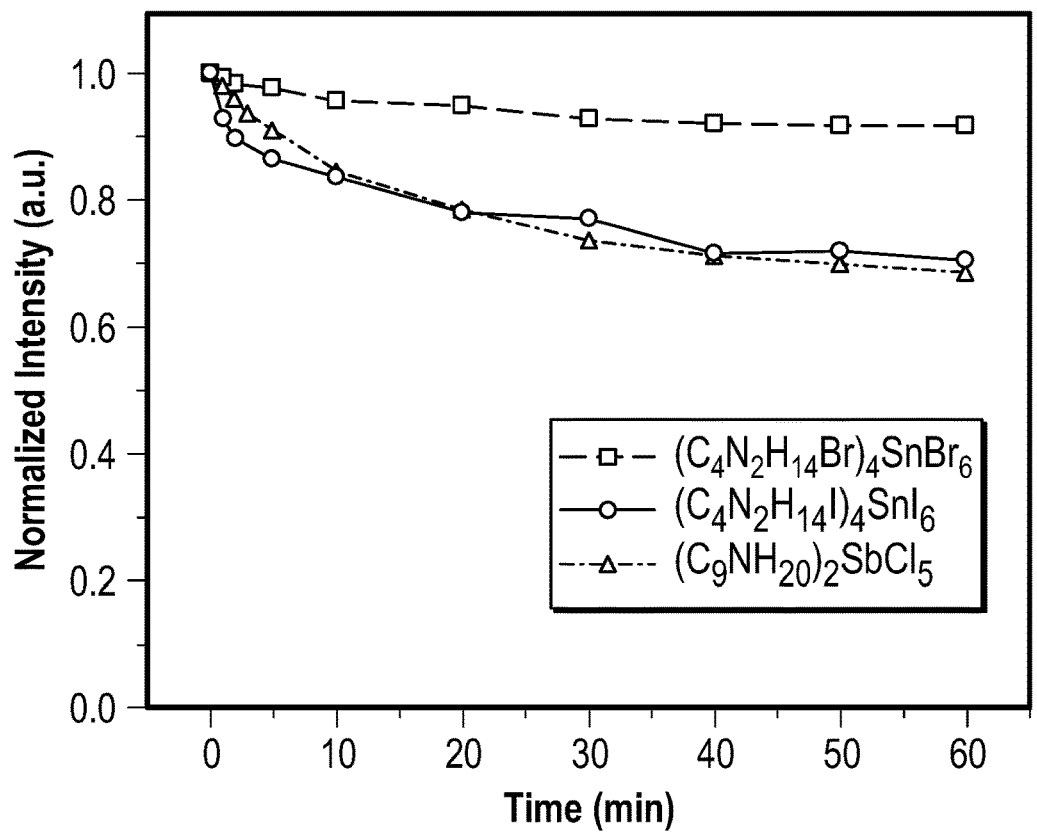
FIG. 15A depicts the photo-stability of embodiments of bulk assemblies under continuous illumination using a high power mercury lamp (150 mW/cm$^2$).
Figure 15B:
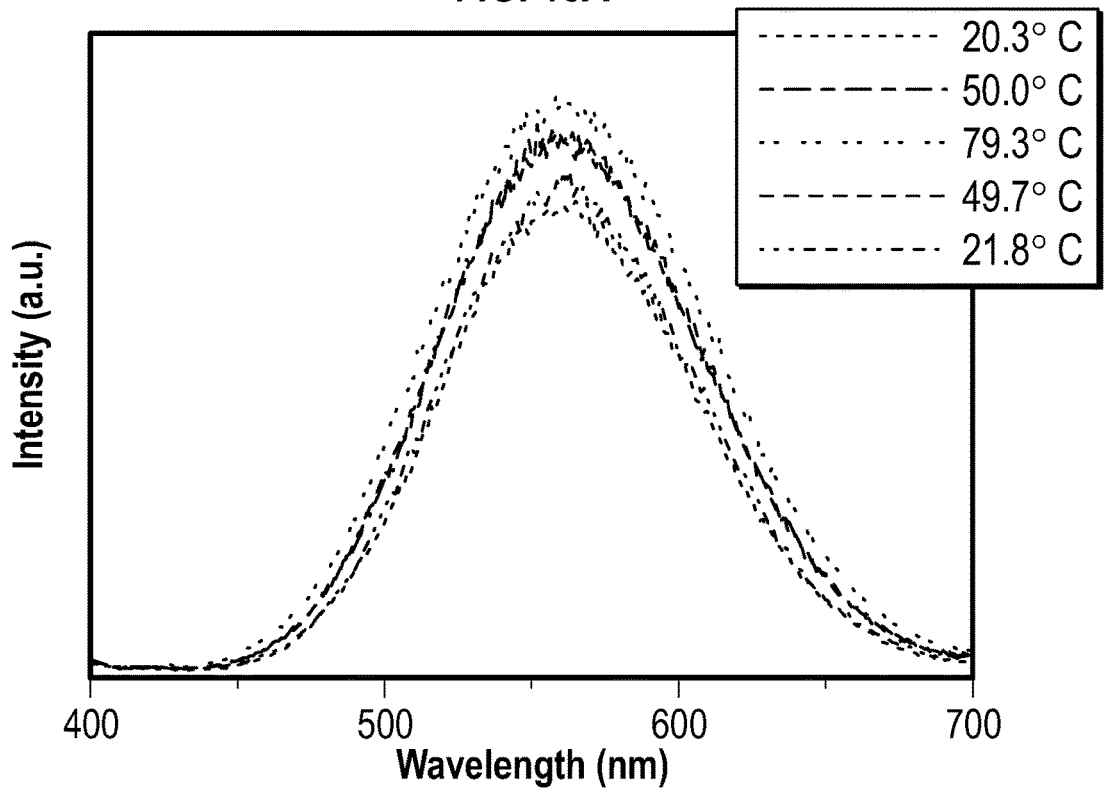
FIG. 15B depicts the temperature dependent photoluminescence of $(C_4N_2H_{14}Br)_4SnBr_6$.

The bulk assemblies of this example also showed great stability under continuous high power mercury lamp irradiation (150 mW/cm²) (FIG. 15A), as well as high thermal stability (FIG. 15B).

FIG. 15A depicts the photostability of the bulk assemblies of this example under continuous illumination using a high power mercury lamp (150 mW/cm²).

FIG. 15B depicts the temperature dependent photoluminescence of $(C_4N_2H_{14}Br)_4SnBr_6$.

The broadband emissions with large Stokes shifts suggested that the emissions were not from the direct excited states, but other lower energy excited states. As these bulk assemblies appeared, at least in some instances, to be perfect host-guest systems with luminescent molecular species periodically embedded in an inert matrix without intermolecular interactions or band formation, the emissions of bulk materials were therefore likely from the individual metal halide molecular species, $SnX_6^{4-}$ and $SbX_5^{2-}$.

Figure 16:
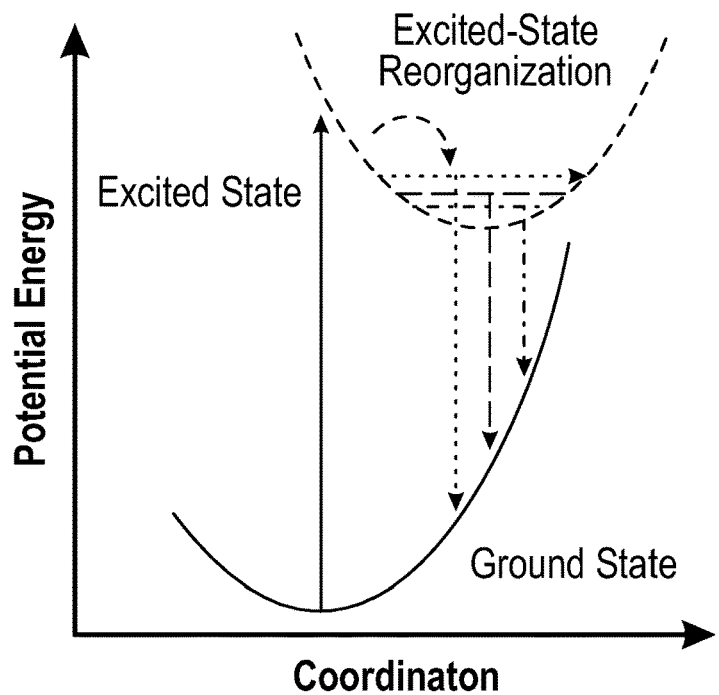
FIG. 16 depicts a configuration coordinate diagram showing possible excited state processes for embodiments of bulk assemblies.

Molecular excited state structural reorganization can account for large Stokes shifts for a number of light emitting materials, including Sn bromide complex $[NEt_4]SnBr_3$ in solutions. Therefore, the excited state processes for these bulk assemblies can be depicted in the configuration coordinate diagram of FIG. 16. FIG. 16 depicts the mechanism of excited state structural reorganization: the straight and curved arrows represent optical and relaxation transitions, respectively.

Upon photon absorption, the metal halides were excited to the high energy excited states, which underwent ultrafast excited state structural reorganization to the lower energy excited states to generate strongly Stokes shifted broadband photoluminescence. On the other hand, similar below gap broadband emissions have been observed in corrugated-2D and 1D metal halide perovskites, as a result of exciton self-trapping (see, e.g., Dohner, E. R.; Jaffe, A.; Bradshaw, L. R.; Karunadasa, H. I., Intrinsic White-Light Emission from Layered Hybrid Perovskites. *J Am Chem Soc* 2014, 136 (38), 13154-13157).

For metal halides, the formation of localized self-trapped excited states can be dependent on the dimensionality of the crystalline systems, and lowering the dimensionality can make exciton self trapping easier. Therefore, 0D systems with the strongest quantum confinement may be reasonably expected to be favorable for the formation of self-trapped excited states. Accordingly, the yellow emission from the $(C_4N_2H_{14}Br)_4SnBr_6$ was very similar to the self-trapped 2.2 eV emission from $SnBr_2$ crystals at low temperature (12 K) (Yamasaki, Y.; Ohno, N., Self-trapped excitons in orthorhombic SnBr$_2$. *International Journal of Modern Physics B* 2001, 15 (28-30), 4009-4012).

Unlike corrugated 2D and 1D perovskites, with band formation due to the connections of metal halide octahedrons and structural distortion, emitting from both free exciton and self-trapped excited states at room temperature, the Sn based 0D perovskites $(C_4N_2H_{14}X)_4SnX_6$ without band formation emitted from the indirect reorganized excited states only. Therefore, the bulk assemblies of this example allowed the classic solid-state theory of "exciton self-trapping" to be related to the molecular photophysics term of "excited state structural reorganization", as the metal halide building blocks could be considered either "crystal lattice points" or "molecular species". It should be pointed out that the apparently true 0D perovskites $(C_4N_2H_{14}X)_4SnX_6$ present in this example were fundamentally different from previously reported analogous compounds, such as $Cs_4PbBr_6$ and $Cs_2SnI_6$, which possess little-to-no quantum confinement for the individual metal halide octahedrons and exhibit emissions from the direct excited states.

The ability to exhibit high PLQEs in the solid state make the earth-abundant lead-free materials of this example promising light emitters for a variety of applications. Unlike most conventional light emitters, such as organic emitters and colloidal quantum dots, which require doping to prevent aggregation and self-quenching in the solid state, the bulk assemblies of this example were apparently perfect host-guest systems themselves, at least in some embodiments.

The strongly Stokes shifted broadband emissions without self-absorption may be of particular interest for applications in down conversion white LEDs and luminescent solar concentrators. To demonstrate the application of these materials as a phosphor, down conversion LEDs were fabricated, in which a commercial UV LED (340 nm) was used to optically pump polydimethylsiloxane (PDMS) films blended with ball-milled yellow emitting $(C_4N_2H_{14}Br)_4SnBr_6$ and commercial blue emitting europium-doped barium magnesium aluminates $(BaMgAl_{10}O_{17}:Eu^{2+})$.

Figure 17:
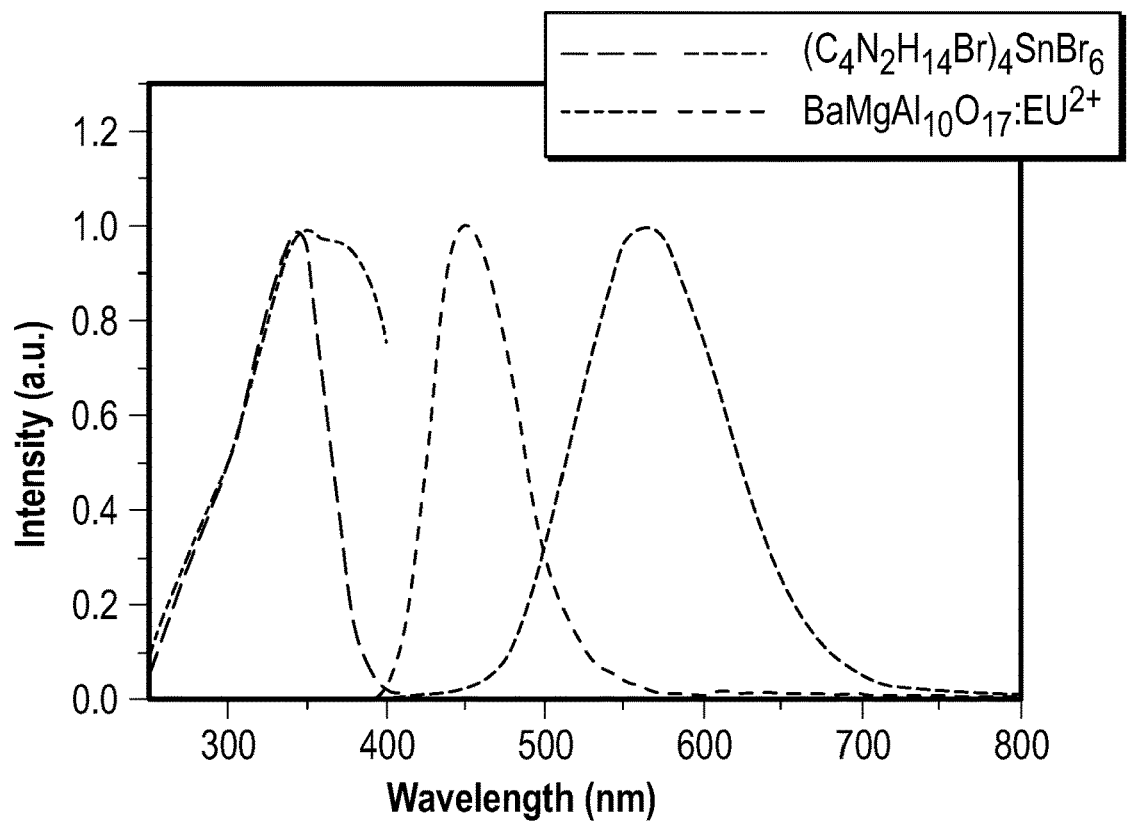
FIG. 17 depicts the normalized excitation (dash lines) and emission (solid lines) spectra of $BaMgAl_{10}O_{17}:Eu^{2+}$ and $(C_4N_2H_{14}Br)_4SnBr_6$ phosphors.

A UV LED (340 nm) was chosen after considering the excitations of both the yellow and blue phosphors in the UV region (FIG. 17). FIG. 17 depicts the normalized excitation (dash lines) and emission (solid lines) spectra of $BaMgAl_{10}O_{17}: Eu^{2+}$ and $(C_4N_2H_{14}Br)_4SnBr_6$ phosphors.

Images were collected of PDMS films doped with blue and yellow phosphors at different weight ratios under ambient light and a UV lamp irradiation. The collected images included images of blue phosphors, yellow phosphors, and their blends with different weight ratios (1:2, 1:1, and 2:1) embedded in PDMS under ambient light and a hand held UV lamp irradiation (365 nm). The emission spectra of UV pumped LEDs are depicted at FIG. 18, and the CIE color coordinates and Correlated Color Temperatures (CCTs) were collected and evaluated.

Figure 18:
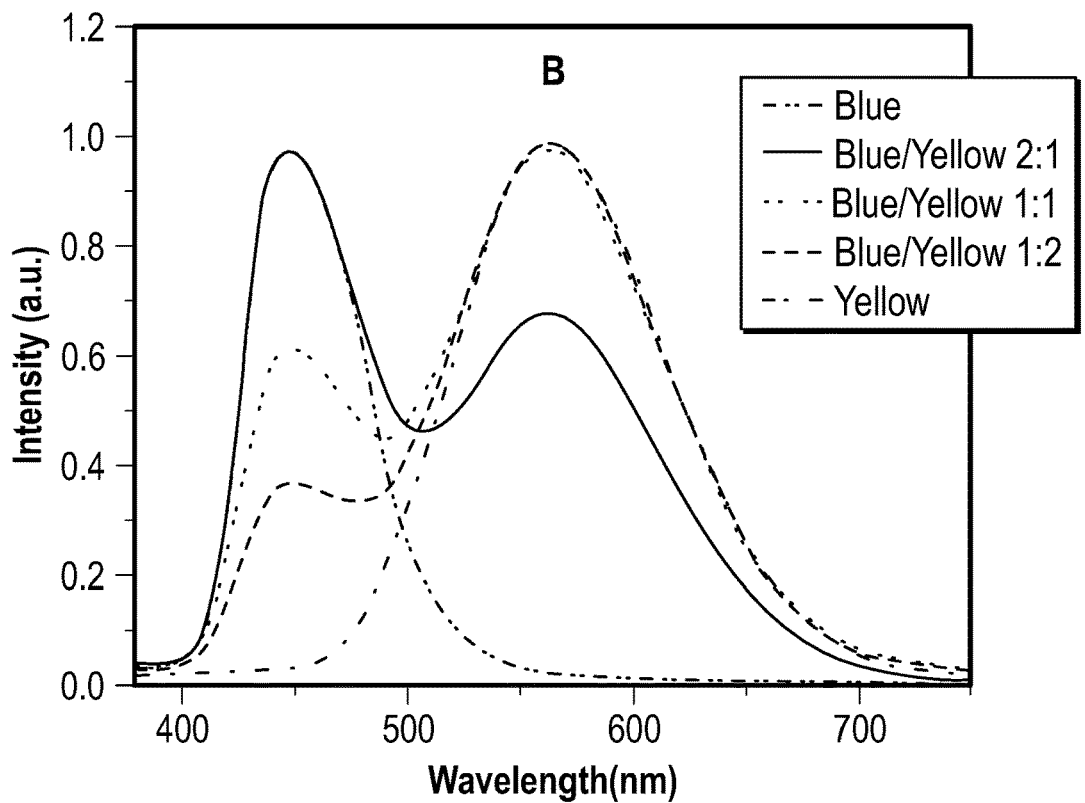
FIG. 18 depicts the emission spectra of UV pumped LEDs with different blending ratios of blue and yellow phosphors.

FIG. 18 depicts the emission spectra of UV pumped LEDs with different blending ratios between blue and yellow phosphors.

A range of "cold" to "warm" white lights was achieved by controlling the blending ratio between the two phosphors. With a blue/yellow weight ratio of 1:1, a decent white emission with CIE coordinates of (0.35, 0.39), a CCT of 4946 K, and a color-rendering index (CRI) of 70, was obtained.

Figure 19:
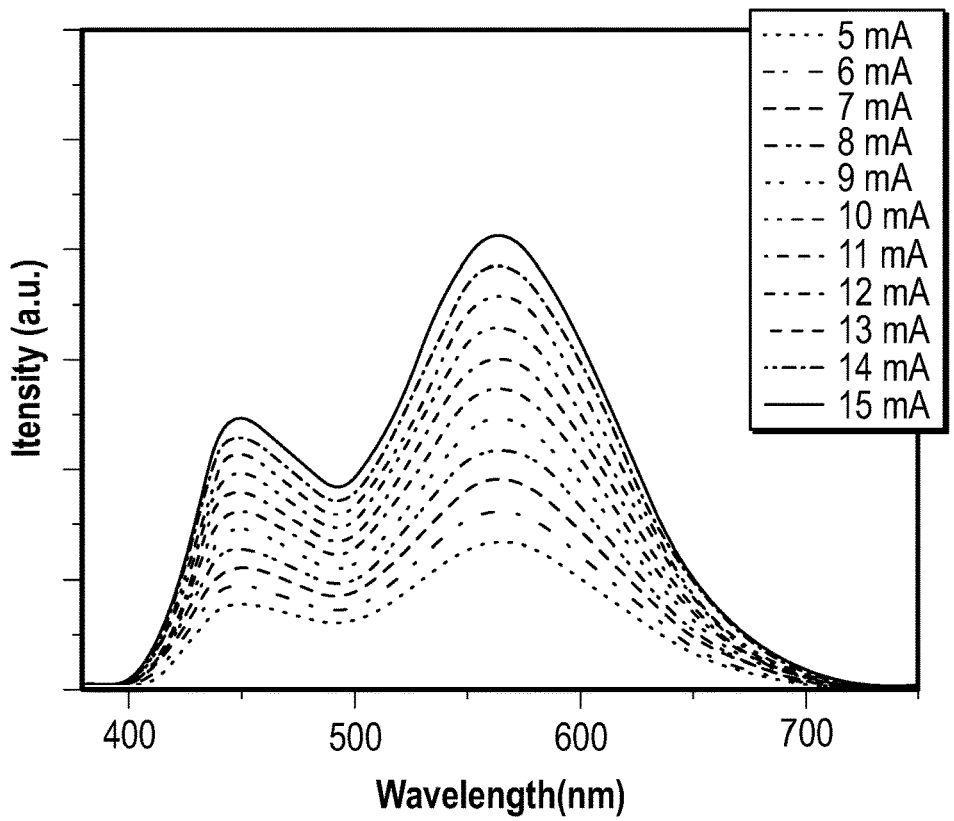
FIG. 19 depicts the emission spectra of a white LED at different driving currents.

Excellent color stability was observed in this white LED at different operating currents, as shown at FIG. 19. This could be attributed to the little-to-no energy transfer from the blue phosphors to the yellow phosphors, as there was a minimum overlap between the excitation of yellow phosphors and the emission of blue phosphors. The white LED also showed great stability in air with almost no change of light brightness and color during the preliminary testing, (the device was continuously on at about 400 cd/m$^2$ for more than six hours under the same operating power). FIG. 19 depicts the emission spectra of a white LED at different driving currents.

5. Absorption Spectrum Measurements

Absorption spectra of bulk assemblies were measured at room temperature through a synchronous scan in an integrating sphere incorporated into the spectrofluorometer (FLS980, Edinburgh Instruments) while maintaining a 1 nm interval between the excitation and emission monochromators.

6. Excitation Spectrum Measurements

Excitation spectra of bulk assemblies were measured at room temperature on a FLS980 spectrofluorometer (Edinburgh Instruments) monitored at the maximum of emission spectra.

7. Photoluminescence Steady State Studies

Steady-state photoluminescence spectra of bulk assemblies were obtained at room temperature and 77 K (liquid nitrogen was used to cool the samples) on a FLS980 spectrofluorometer.

8. Temperature Dependent Photoluminescence

The temperature dependent photoluminescence spectra were measured on a Varian Cary Eclipse Fluorescence Spectrometer with a Water 4Position Multicell Holder Accessory attached to a Julabo F12-EC Refrigerated/Heating Circulator filled with ethylene glycol-water mixture (3:2). The PL intensity of 0D $(C_4N_2H_{14}Br)_4SnBr_6$ bulk crystals even increased slightly upon the increasing of temperature (recovering upon the decreasing of temperature), which was likely due to the change of refractive index of the bulk crystal samples (absorption increasing upon the increasing of temperature).

9. Photoluminescence Quantum Efficiencies (PLQEs)

For the photoluminescence quantum efficiency measurements, the samples were excited using light output from a housed 450 W Xe lamp passed through a single grating (1800 l/mm, 250 nm blaze) Czerny-Turner monochromator and finally a 5 nm bandwidth slit. Emission from the sample was passed through a single grating (1800 l/mm, 500 nm blaze) Czerny-Turner monochromator (5 nm bandwidth) and detected by a Peltier-cooled Hamamatsu R928 photomultiplier tube. The absolute quantum efficiencies were acquired using an integrating sphere incorporated into the FLS980 spectrofluorometer. The PLQE was calculated by the equation: $\eta_{QE}=I_S/(E_R-E_S)$, in which $I_S$ represents the luminescence emission spectrum of the sample, $E_R$ is the spectrum of the excitation light from the empty integrated sphere (without the sample), and $E_S$ is the excitation spectrum for exciting the sample. Control samples, rhodamine 101 and blue phosphor $BaMgAl_{10}O_{17}:Eu^{2+}$, were measured using this method to give PLQEs of about 98% and about 93%, which are close to the literature reported values. The PLQEs were confirmed by a Hamamatsu C9920 system equipped with a xenon lamp, calibrated integrating sphere and model C10027 photonic multi-channel analyzer (PMA). The measurements that took account of indirect PL provided the same results within the error bars.

10. Time-Resolved Photoluminescence

Time-Resolved Emission data were collected at room temperature and 77 K (liquid nitrogen was used to cool the samples) using time-correlated single photon counting on a Horiba JY Fluoromax-4 Fluorometer. Samples were excited with 295 nm pulsed diode lasers. Emission counts were monitored at 530 nm. The average lifetime was obtained by multiexponential fitting.

11. PL intensity Dependence on Excitation Power Density

PL intensity versus power studies were carried out on an Edinburgh Instruments PL980-KS transient absorption spectrometer using a Continuum Nd:YAG laser (Surelite EX) pumping a Continuum Optical Parametric Oscillator (Horizon II OPO) to provide 360 nm 5 ns pulses at 1 Hz. The pump beam profile was carefully defined by using collimated laser pulses passed through an iris set to 5 mm diameter. Pulse intensity was monitored by a power meter (Ophir PE10BF-C) detecting the reflection from a beam splitter. The power meter and neutral density filters were calibrated using an identical power meter placed at the sample position. Neutral density filters and an external power attenuator were used to reduce the pump's power density to the desired power range. Detection consisted of an Andor intensified CCD (1024×256 element) camera collecting a spectrum from 287 nm to 868 nm and gated to optimize PL collection (typically a 30 to 50 ns gate depending on PL lifetime starting immediately following the 5 ns laser pulse). 100 collections were averaged at each power level with every laser pulse monitored to determine the average intensity. PL intensity was determined at the maximum of the PL emission curve.

12. Materials Photostability Study

To test the photostability, a 100 W 20 V mercury short arc lamp was used as continuous irradiation light source. The intensity of the irradiation was calibrated to 150 mW/cm$^2$. The emission was measured perodically on a HORIBA iHR320 spectrofluorimeter, equipped with a HORIBA Synapse CCD detection system.

13. Thermogravimetry Analysis (TGA)

Thermogravimetric analysis (TGA) showed that Sn based bulk assemblies did not decompose until 200° C. This high stability in air may have been due to the unique core-shell structure in which the photoactive metal halides were well-protected by the organic shells.

TGA was carried out using a TA instruments Q50 TGA system. The samples were heated from room temperature (about 22° C.) to 800° C. at a rate of 5° C.·min$^{-1}$, under a nitrogen flux of 100 mL·min$^{-1}$.

14. UV Pumped LEDs

The blue (BaMgAl$_{10}$O$_{17}$:Eu$^{2+}$) and yellow ((C$_4$N$_2$H$_{14}$)$_4$SnBr$_{10}$) phosphors were blended with Sylgard 184 polydimethylsiloxane (PDMS) encapsulant, and put in a polytetrafluoroethylene (PTFE) mold to control shape and thickness. The whole mold was heated at 100° C. for 40 min in an oven to cure PDMS. The phosphors-doped PDMS films were then attached to a UVTOP® UV LED with window, 340 nm, 0.33 mW (THORLABS) to form UV pumped LEDs. The LEDs were driven by a Keithly 2400 sourcemeter and emission spectra were recorded on an Ocean Optics USB4000 Miniature Fiber Optic Spectrometer. For the device stability tests, a white light LED was continuously powered by a Keithley 2400 at a stable current power to give a brightness of ~400 cd/m$^2$. Emission spectra were recorded at periodic intervals using an Ocean Optics USB4000 Miniature Fiber Optic Spectrometer.

Example 5—Growth of (C$_9$NH$_{20}$)$_2$SnBr$_4$ Bulk Crystals

In this example, a crystalline organic tin bromide hybrid was made ((C$_9$NH$_{20}$)$_2$SnBr$_4$), in which isolated tin bromide ions (SnBr$_4^{2-}$) were surrounded by the organic ligands (C$_9$NH$_{20}^+$) to form a 0D structure in a solid state.

The SnBr$_4^{2-}$ ions possessed a unique, rarely reported seesaw structure (see, e.g., J. A. Bellow, D. Fang, N. Kovacevic, P. D. Martin, J. Shearer, G. A. Cisneros, S. Groysman, Chem-Eur J 2013, 19, 12225-12228; and H. Nikol, A. Becht, A. Vogler, Inorganic Chemistry 1992, 31, 3277-3279). A strongly Stokes-shifted broadband deep-red emission, which peaked at about 695 nm (with a full width at half maximum (FWHM) of 146 nm, and a photoluminescence quantum efficiency (PLQE) of about 46%), was realized for the organic metal halide hybrid of this example.

The large Stokes shift of 332 nm (1.63 eV) was one of the highest values reported to date for any solid state light emitting materials and the high PLQE was also an excellent value for deep-red emitters. The unique photophysical properties of this material may be attributed to the excited state structural deformation of SnBr$_4^{2-}$ from a seesaw to a flattened tetrahedron, as confirmed by the DFT calculations described in the following examples.

SnBr$_2$ (2.0 mmol) and C$_9$NH$_{20}$Br (4.0 mmol) were dissolved in 5 ml DMF solution and then filtered to form a clear precursor solution. After adding 5 mL acetone, the as-prepared solution was sealed and left to stand for around 24 hours to afford yellowish single crystals. The (C$_9$NH$_{20}$)$_2$SnBr$_4$ crystals were washed with acetone and dried under reduced pressure. The yield was about 31%. All the procedures were carried out in N$_2$-filled glove box to prevent the oxidation of Sn (II) to Sn (IV). C$_{18}$H$_{40}$N$_2$SnBr$_4$: Anal, Calc. C, 29.91; H, 5.58; N, 3.88. Found: C, 30.07; H, 5.60; N, 3.88.

Figure 20:
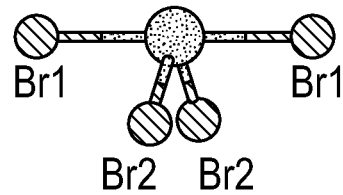
FIG. 20 depicts a ball-and-stick model of an embodiment of an individual $SnBr_4^{2-}$ anion.

A ball-and-stick model of an individual SnBr$_4^{2-}$ anion of this example is depicted at FIG. 20.

Example 6—Characterization of (C$_9$NH$_{20}$)$_2$SnBr$_4$ Bulk Crystals

1. Single Crystal X-Ray Diffraction (SCXRD)

The crystal structure of (C$_9$NH$_{20}$)$_2$SnBr$_4$ of Example 5 was determined by single crystal X-ray diffraction (SCXRD). The material adopted a monoclinic space group C2/c with SnBr$_4^{2-}$ anions surrounded by C$_9$NH$_{20}^+$ cations to form a 0D structure at the molecular level. The data indicated a clear separation between individual SnBr$_4^{2-}$ anions by the C$_9$NH$_{20}^+$ cations with the nearest Sn—Sn distance of 9.16 Å. Due to the large spatial separation, the intermolecular coupling between SnBr$_4^{2-}$ anions should be negligible. The structure of the isolated SnBr$_4^{2-}$ anion is depicted at FIG. 1. The ion adopted a seesaw structure with a tetracoordinate Sn(II) center. The axial Br1-Sn—Br1 angle was 178.9°, whereas the Br2-Sn—Br2 and Br1-Sn—Br2 angles were close to 90°. The length of the equatorial and axial Sn—Br bonds (2.63 Å and 2.96, respectively), were both significantly shorter than the average value found in SnBr$_6^{4-}$ octahedra present in organic tin bromide hybrids with 0D [(C$_4$N$_2$H$_{14}$Br)$_4$SnBr$_6$ (3.05 Å)] and 1D [C$_4$N$_2$H$_{14}$SnBr$_4$ (3.02 Å)] structures (C. Zhou, Y. Tian, M. Wang, A. Rose, T. Besara, N. K. Doyle, Z. Yuan, J. C. Wang, R. Clark, Y. Hu, T. Siegrist, S. Lin, B. Ma, Angewandte Chemie International Edition 2017, 56, 9018-9022). Such bond length shortening may be due to the lower coordination number of the Sn(II) center in (C$_9$NH$_{20}$)$_2$SnBr$_4$.

2. Powder X-Ray Diffraction (PXRD)

The bulk purity of the as-prepared crystalline material was confirmed by powder X-ray diffraction (XRD). The PXRD analysis was performed on Panalytical X'PERT Pro Powder X-Ray Diffractometer using Copper X-ray tube (standard) radiation at a voltage of 40 kV and 40 mA, and X'Celerator RTMS detector. The diffraction pattern was scanned over the angular range of 5-50 degree (2θ) with a step size of 0.02, at room temperature. Simulated powder patterns were calculated by Mercury software using the crystallographic information file (CIF) from single-crystal x-ray experiment.

3. Thermogravimetry Analysis (TGA)

The stability and composition of the crystals were further verified by thermogravimetric analysis (TGA) and elemental analysis. TGA was carried out using a TA instruments Q50 TGA system. The samples were heated from room temperature (about 22° C.) to 800° C. with at a rate of 5° C.·min$^{-1}$, under an argon flux of 40 mL·min$^{-1}$.

Example 7—Photophysical Properties of $(C_9NH_{20})_2SnBr_4$ Bulk Crystals

A light yellow color was exhibited by the $(C_9NH_{20})_2SnBr_4$ bulk crystals of Example 5 under ambient light, and a bright red emission was exhibited upon irradiation with a UV lamp (365 nm).

Figure 21:
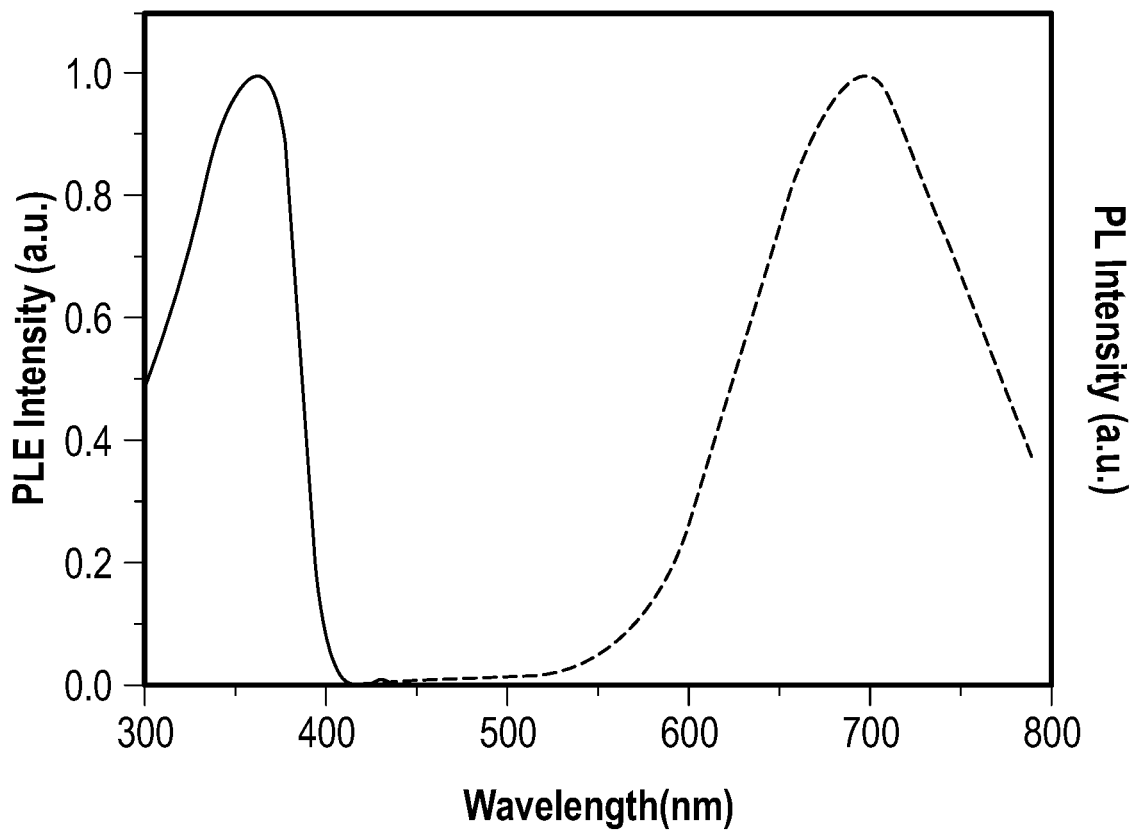
FIG. 21 depicts excitation and emission spectra of an embodiment of $(C_9NH_{20})_2SnBr_4$ bulk crystals.

Detailed photophysical properties of crystalline $(C_9NH_{20})_2SnBr_4$ were characterized using steady state UV-visible absorption and emission spectroscopies, as well as time-resolved emission spectroscopy. FIG. 21 shows the emission and excitation spectra.

1. Absorption Spectrum Measurements

Absorption spectra of $(C_9NH_{20})_2SnBr_4$ crystals were measured at room temperature through a synchronous scan in an integrating sphere incorporated into the spectrofluorometer (FLS980, Edinburgh Instruments) while maintaining a 1 nm interval between the excitation and emission monochromators. The absorption spectrum agreed with the excitation spectrum, except in the low energy region where scattering occurred due to the sample crystallinity. The broad red photoluminescence (FWHM=146 nm, 0.38 eV) extended into near-infrared region. The Stokes shift (332 nm, 1.63 eV) was significantly larger than that of yellow emitting 0D $(C_4N_2H_{14}Br)_4SnBr_6$ (215 nm, 1.31 eV). This is believed to be the largest Stokes shift reported to date for any organic metal halide hybrid, and one of the largest for any single crystalline light emitting systems.

2. Excitation Spectrum Measurements

Excitation spectra of $(C_9NH_{20})_2SnBr_4$ bulk crystals were measured at room temperature on a FLS980 spectrofluorometer (Edinburgh Instruments) monitored at maximum of emission spectra.

The PLQE of the bulk crystals was determined to be 46±1% at room temperature, which was also very high for deep-red emitting materials. The PLQE was calculated by the equation: $\eta_{QE}=I_S/(E_R-E_S)$. The Comission Internationale de l'Eclairage (CIE) chromaticity coordinate for this red emission was calculated to be (0.63, 0.36), which was close to the coordinate (0.67, 0.33) of "ideal red" defined by the National Television System Committee (NTSC). The luminescence decay profile at room temperature indicated a long single exponential lifetime (□=6.51 μs), which is consistent with phosphorescence.

3. Photoluminescence Steady State Studies

Steady-state photoluminescence spectra of $(C_9NH_{20})_2SnBr_4$ bulk crystals were obtained at room temperature on a FLS980 spectrofluorometer.

4. Photoluminescence Quantum Efficiency (PLQE)

The PLQEs were acquired using a Hamamatsu C9920 system equipped with a xenon lamp, calibrated integrating sphere and model C10027 photonic multi-channel analyzer (PMA). The PLQEs were calculated by the equation: $\eta_{QE}=I_S/(E_R-E_S)$, in which $I_S$ represents the luminescence emission spectrum of the sample, $E_R$ is the spectrum of the excitation light from the empty integrated sphere (without the sample), and $E_S$ is the excitation spectrum for exciting the sample.

5. Time-Resolved Photoluminescence

Time-Resolved Emission data were collected at room temperature using the FLS980 spectrofluorometer. The dynamics of emission decay were monitored by using the FLS980's time-correlated single-photon counting capability (1024 channels; 200 μs window) with data collection for 10,000 counts. Excitation was provided by an Edinburgh EPL-360 picosecond pulsed diode laser. The average lifetime was obtained by monoexponential fitting.

6. Photostability Study

To test the photostability, a 100 W 20 V mercury short arc lamp was used as continuous irradiation light source. The intensity of the irradiation was calibrated to 150 mW/cm$^2$. The photoluminescence was measured at periodic intervals on a HORIBA iHR320 spectrofluorimeter, equipped with a HORIBA Synapse CCD detection system.

The crystals were photostable under continuous high power mercury lamp irradiation (150 mW/cm$^2$), as well as highly thermal stable.

Example 8—Computational Methods

A likely cause for such a large Stokes shift in a solid-state light emitting material with 0D structure may have been a structural deformation in the excited state. Density functional theory (DFT) calculations were performed to gain deeper insight into the mechanism underpinning the photophysics of this hybrid $SnBr_4^{2-}$. The band structure calculated for $(C_9NH_{20})_2SnBr_4$ exhibited flat bands suggesting that the electronic states were highly localized.

For example, bands near the band gap at 0 eV and near 4 eV were confined within the $SnBr_4^{2-}$ species as evidenced by the calculated density of states (DOS). The flatness of these bands likely indicated that the intermolecular coupling was negligible or there was no electronic band formation between $SnBr_4^{2-}$ species. Therefore each $SnBr_4^{2-}$ anion could play the role of an efficient luminescent center by trapping an exciton followed by efficient radiative recombination.

The four-fold degenerated band at 0 eV was made up of the highest occupied molecular orbitals (HOMOs) of the four equivalent $SnBr_4^{2-}$ anions in a unit cell, which had mixed Br-4p and Sn-5s characters as indicated by the DOS, and the partial charge density. The twelve bands near 4 eV consisted of eight lower and four higher bands. The eight lower bands were made up of the lowest unoccupied molecular orbitals (LUMOs) of the four $SnBr_4^{2-}$ anions, which were derived from the Sn-5p dangling bonds (DBs) perpendicular to the Br—Sn—Br axis of the seesaw structure. The higher four bands were derived from the Sn-5p orbitals oriented along the Br—Sn—Br axis.

The seesaw structure of $SnBr_4^{2-}$ probably was stabilized by the nonbonding Sn 5s lone pair, which was polarized away from the two equatorial $Br_2$ ions due to Coulomb repulsion. The vertical excitation created a spin-singlet exciton localized at a $SnBr_4^{2-}$ species.

The electron was promoted into two Sn-5p DBs. The Coulomb repulsion from the electrons in the Sn-5p DBs pushed the Sn-5s lone pair towards the two equatorial Br2 ions, which in turn were repelled away from each other; thereby, destabilizing the seesaw structure.

Consequently, the calculated Br2-Sn—Br2 angle was increased from 94.1° to 151.6°. Meanwhile, the linear Br1-Sn—Br1 axis in the seesaw structure was bended and the calculated Br1-Sn—Br1 angle changed from 178.8° to 151.2°. The calculated bond lengths also changed from 2.99 Å to 2.82 Å for the axial Sn—Br1 bonds and from 2.66 Å to 2.70 Å for the equatorial Sn—Br2 bonds. The excited-state structural deformation transformed the seesaw structure to a flattened tetrahedron.

The partial densities of the electron and the hole wavefunctions in a relaxed spin-triplet exciton were evaluated. The electron state was a π-like anti-bonding orbital between Sn-5p and Br-4p while the hole state was a σ-like anti-bonding orbital between Sn-5s and Br-4p. The Perdew-Burke-Ernzerhof (PBE) band gap at Γ point was 3.65 eV, which was believed to be underestimated due to the well-known band gap error of the semi-local exchange-correlation functional. The non-local hybrid-functional PBE0 calculation increased the band gap to 5.27 eV. The optical excitation energy of a spin-singlet exciton in $(C_9NH_{20})_2SnBr_4$ was calculated (at the PBE0 level) to be 4.01 eV, which was larger than the experimentally observed excitation peak at 3.42 eV. The calculated emission energy by a spin-triplet exciton was 1.55 eV, which was smaller than the measured emission peak at 1.78 eV. The numerical difference between the calculated and the measured excitation and emission energies were reasonably small considering the challenge in the excited state calculations using DFT. Nevertheless, the significant excited state structural deformation found in calculations was believed to explain, at least in part, the large Stokes shift observed experimentally.

The calculations were based on density functional theory (DFT) as implemented in the VASP code (G. Kresse, J. Furthmüller, *Computational Materials Science* 1996, 6, 15-50).

The kinetic energy cutoff of the plane-wave basis is 262 eV. The projector augmented wave method was used to describe the interaction between ions and electrons (G. Kresse, D. Joubert, *Physical Review B* 1999, 59, 1758).

The band structure and the density of state (DOS) of $(C_9NH_{20})_2SnBr_4$ were calculated using Perdew-Burke-Ernzerhof (PBE) exchange-correlation functional (J. P. Perdew, K. Burke, M. Ernzerhof, *Physical review letters* 1996, 77, 3865) while the optical excitation and emission energies were calculated using the hybrid PBE0 functional (J. P. Perdew, M. Emzerhof, K. Burke, *Journal of Chemical Physics* 1996, 105, 9982-9985) which has 25% non-local Fock exchange. (The inclusion of a fraction of Fock exchange significantly improves the band gap energy and the description of charge localization in insulators (M.-H. Du, S. B. Zhang, *Physical Review B* 2009, 80; bJ. B. Varley, A. Janotti, C. Franchini, C. G. Van de Walle, *Physical Review B* 2012, 85, 081109).

Previous PBE0 calculations have provided understanding of the structural and electronic properties of self-trapped and dopant-bound excitons in halides (K. Biswas, M. H. Du, *Physical Review B* 2012, 86, 7; bM. H. Du, *Journal of Materials Chemistry C* 2014, 2, 4784-4791; cM. H. Du, *ECS J. Solid State Sci. Technol.* 2016, 5, R3007-R3018).

Following Franck-Condon principle, the optical excitation and emission energies were obtained by calculating the total energy differences between the excited and the ground states using PBE0-optimized ground-state and excited-state structures, respectively. The lattice parameters were fixed at the experimentally measured values while the atomic positions were optimized until the force on each atom is less than 0.02 eV/Å.

Example 7—Blue Emitting Bulk Assemblies

A single crystalline bulk assembly of metal halide clusters was produced, having a chemical formula of $(C_9NH_{20})_7(PbCl_4)Pb_3Cl_{11}$, in which lead chloride tetrahedrons $(PbCl_4^{2-})$ and fused face-sharing lead chloride trimers $(Pb_3Cl_{11}^{5-})$ were co-crystallized with organic cations $(C_9NH_{20}^+)$ to form a 0D structure at the molecular level.

Due to the complete isolation of $Pb_3Cl_{11}^{5-}$ by wide bandgap $PbCl_4^{2-}$ and $C_9NH_{20}^+$ moieties, no interactions or electronic band formation between $Pb_3Cl_{11}^{5-}$ clusters occurred, which allowed the bulk crystal to exhibit the intrinsic properties of the $Pb_3Cl_{11}^{5-}$ clusters. Highly luminescent blue emission with PLQE exceeding 80% was realized for this lead chloride hybrid, as a result of localized exciton formation in the molecular clusters.

A facile wet chemistry method was used to grow the $(C_9NH_{20})_7(PbCl_4)Pb_3Cl_{11}$ single crystals of this example with a high yield of about 70%. The method included slowly diffusing a non-solubilizing solvent acetone into an acetonitrile ($CH_3CN$) precursor solution containing lead chloride ($PbCl_2$) and 1-Butyl-1-methylpyrrolidinium chloride ($C_9NH_{20}Cl$) at room temperature.

The crystal structure of this hybrid material adopting a triclinic space group P-1 was determined using single crystal X-Ray Diffraction (SCXRD).

The crystal structures revealed a perfect 0D structure at the molecular level. The crystal structure contained individual metal halide species, $PbCl_4^{2-}$ tetrahedrons and $Pb_3Cl_{11}^{5-}$ clusters, that were completely isolated from each other and surrounded by the large organic cations $C_9NH_{20}^+$.

Molecules of the organic liquid $CH_3CN$ also were present in the single crystalline assembly, which was not surprising considering the fact that the single crystal growth procedure included the use of $CH_3CN$.

The complete isolation of $Pb_3Cl_{11}^{5-}$ by $PbCl_4^{2-}$ and $C_9NH_{20}^+$ occurred, and the closest distance between two $Pb_3Cl_{11}^{5-}$ anions was more than 1 nm. This isolation eliminated or reduced interaction between the $Pb_3Cl_{11}^{5-}$ moieties. Such a perfect 0D structure at the molecular level can permit the bulk crystals to exhibit the intrinsic properties of the individual lead chloride clusters.

It should be noted that the $PbCl_4^{2-}$ tetrahedron had a large band gap (~4.22 eV), which could be considered an insert structural scaffold that did not likely affect the photophysical properties in the visible range of the single crystals. The composition of the prepared single crystals was further confirmed by elemental analysis.

The $(C_9NH_{20})_7(PbCl_4)Pb_3Cl_{11} \cdot CH_3CN$ single crystals of this example were colorless and transparent under ambient light, which suggests that there was little-to-no absorption in the visible region, with a wide band gap. Under UV irradiation (365 nm), the crystals emitted bright blue light.

Figure 22:
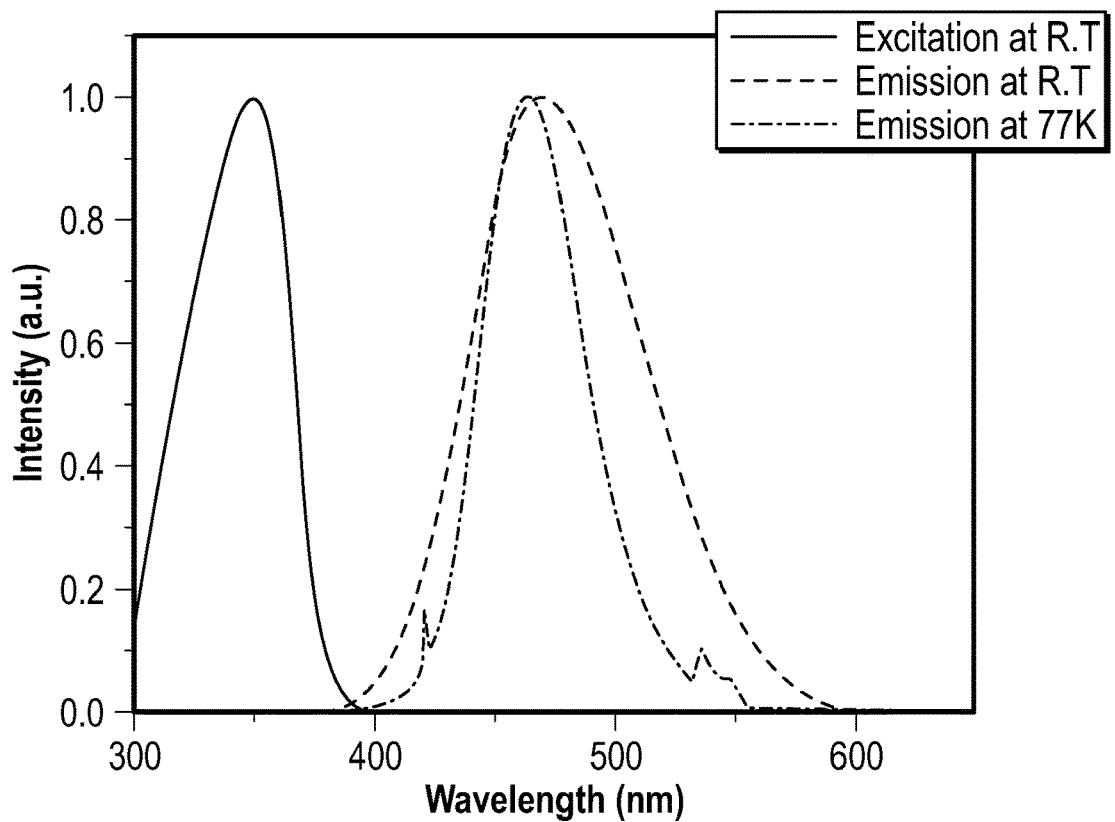
FIG. 22 depicts excitation and emission spectra collected from an embodiment of a bulk assembly at room temperature at 77 K.

The emission and excitation spectra were recorded, as depicted at FIG. 22. The blue emission peaked at 470 nm at room temperature, and had a large Stokes shift of 122 nm (0.925 eV) and a full width at half maximum (FWHM) of 84 nm.

Such a strongly Stokes shifted broadband emission can be typical for 0D organic metal halide hybrids due to the formation of highly localized excitons. A remarkable PLQE of 83±1%, however, was achieved for this blue emitting organic metal halide hybrid, which is among the highest values reported to date for single crystalline blue light emitters.

The molecular level 0D structure of this organic metal halide hybrid suggested that the bright blue emission came from the individual metal halide species, either $PbCl_4^{2-}$ tetrahedrons or $Pb_3Cl_{11}^{5-}$ clusters, or both. Considering the excitation at about 3.56 eV, which is much lower than the band gap of $PbCl_4^{2-}$ tetrahedrons (~4.22 eV), the blue emission was unlikely to have been emitted from the $PbCl_4^{2-}$ tetrahedrons. Instead, the blue light likely emitted from the $Pb_3Cl_{11}^{5-}$ clusters.

The Commission Internationale de l'Eclairage (CIE) chromaticity coordinate the blue emission was calculated to be (0.14, 0.19). The luminescent decay of the blue emitter at room temperature was calculated, and indicated a long lifetime of about 418 ns by mono-exponential fitting. This is consistent with what has been observed in other 0D organic metal halide hybrids with emissions from the excitons localized in individual metal halide species.

At 77K, the emission spectrum became narrower and shifted somewhat to the high energy region (FIG. 22), likely because of reduced thermally populated vibrational states at low temperature, and the luminescent lifetime increased to approximately 12.4 μs by mono-exponential fitting. The decay lifetimes in the hundreds of nanoseconds at room temperature and microseconds at 77 K suggested the phosphorescent nature of these emissions. The major photophysical properties of the bulk assemblies of this example are summarized in the following table.

Summary of photophysical properties of $(C_9NH_{20})_7(PbCl_4)Pb_3Cl_{11} \cdot CH_3CN$ single crystals

| T (K) | $\lambda_{exc}$ (nm) | $\lambda_{em}$ (nm) | FWHM (nm) | φ (%) | $\tau_{av}$ (μs) |
|---|---|---|---|---|---|
| 298 | 348 | 470 | 84 | 83 ± 1 | 0.418 |
| 77 | N/A | 464 | 49 | N/A | 12.4 |

The strongly Stokes shifted broadband emission with microseconds decay lifetimes suggested that the hybrid material of this example behaved more like the individual molecules than inorganic semiconductors or 3D metal halide perovskites, which typically exhibit narrow emissions with small Stokes shifts and decay lifetimes of nanoseconds.

Not wishing to be bound by any particular theory, the metal halide clusters composed of very few atoms likely exhibited molecule-like transitions, due to the fact that the density of states is insufficient to merge the highest occupied molecular orbital (HOMO) and lowest unoccupied molecular orbital (LUMO) into the valence and conduction bands that occur in inorganic semiconductors and 3D perovskites.

Figure 23:
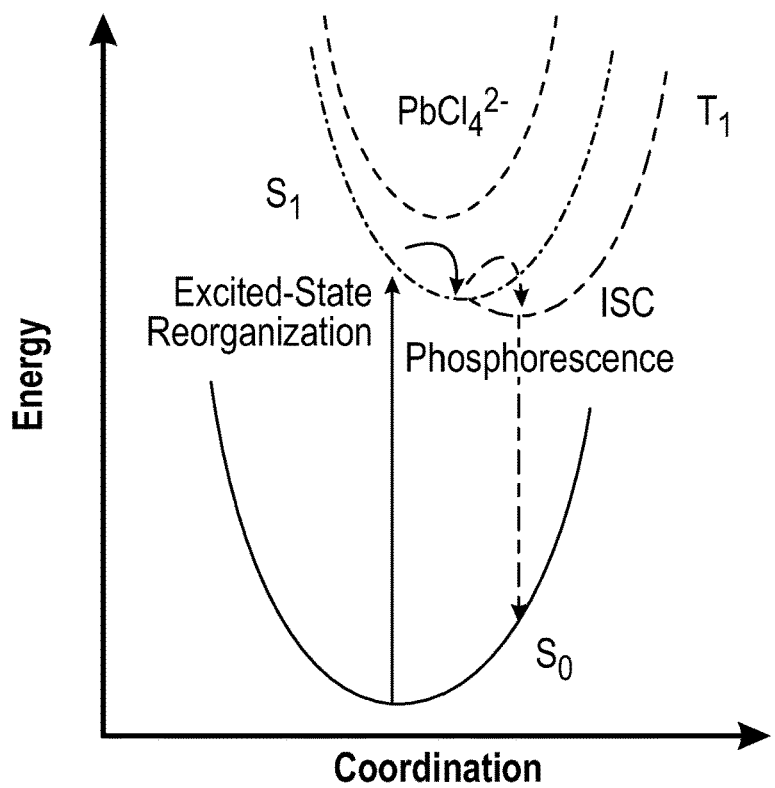
FIG. 23 depicts a schematic of the photophysical processes of an embodiment of a bulk assembly; the straight and curved arrows represent optical and relaxation transitions, respectively.

Therefore, the photophysical processes for the hybrid material of this example can be depicted as shown at FIG. 23. Upon UV photoexcitation, only $Pb_3Cl_{11}^{5-}$ clusters were excited to the higher energy excited state, which could undergo ultrafast structure reorganization and intersystem crossing (ISC) from the singlet state ($S_1$) to the triplet states ($T_1$) due to the heavy atom effect. The radiative decay from the lowest triplet states generated a highly efficient blue phosphorescence with a large Stokes shift.

To ensure that the co-crystallized $CH_3CN$ molecules had little-to-no effect on the photophysical properties, the material was characterized after removing the $CH_3CN$ molecules. By placing the fresh single crystals under vacuum overnight, the $CH_3CN$ molecules were successfully removed, which was confirmed by $^1H$ NMR spectra.

A small peak at ~2.08 ppm vanished after overnight drying, suggesting that the $CH_3CN$ molecules had been removed from the bulk crystals. The removal of $CH_3CN$ molecules was further confirmed by TGA measurements. For the fresh crystals, an obvious weight loss of 1.7% at around 85° C. was observed, which was attributed to the loss of $CH_3CN$ molecules, and no such weight loss was observed in the dry samples.

In this example, lead(II) chloride (0.25 mmol) and 1-Butyl-1-methylpyrrolidinium chloride (1 mmol) were mixed at 1:4 molar ratio and dissolved in acetonitrile to form a clear solution. Bulk crystals were prepared by diffusing acetone into acetonitrile solution at room temperature for overnight. The large colorless crystals were washed with acetone and dried under reduced pressure. All the procedure was carried out in a $N_2$-filled glove box. The yield was calculated at ~70%. $C_{63}H_{140}N_7Pb_4Cl_{15}$: Anal, Calc. C, 32.11; H, 5.99; N, 4.16. Found: C, 32.19; H, 6.02; N, 4.18.

Single crystal x-ray diffraction data of lead chloride hepta-(1-butyl-1-methyl-pyridinium) acetonitrile was collected using an Oxford-Diffraction Xcalibur-2 CCD diffractometer with graphite-monochromated Mo Kα radiation. The crystal was mounted in a cryoloop under Paratone-N oil and nitrogen cooled to 105 K with an Oxford-Diffraction Cryojet. Data was collected using ω scans with 1° frame widths to a resolution of 0.7 Å, equivalent to 2θ≈60.262°. Reflections were recorded, indexed and corrected for absorption using the Oxford-Diffraction CrysAlisPro software[1], and subsequent structure determination and refinement was carried out using CRYSTALS[2], employing Superflip[3] to solve the crystal structure. The data did not allow for an unconstrained refinement: all hydrogens were geometrically restrained to their associated carbons, and in some cases the bond lengths within the 1-butyl-1-methyl-pyridinium molecules were constrained to their physically reasonable lengths. The refinement was performed against $F^2$. Anisotropic thermal displacement parameters were refined for all inorganic clusters as well as most of the associated molecular ligands. Isotropic thermal displacement parameters were refined for all constituents. A CIF has been deposited with CCDC (1836729). VESTA was used as the crystal structure visualization software for the images presented in the manuscript.

The PXRD analysis was performed on Panalytical X'PERT Pro Powder X-Ray Diffractometer using Copper X-ray tube (standard) radiation at a voltage of 40 kV and 40 mA, and X'Celerator RTMS detector. Bulk crystals were carefully ground into powders and encapsulated using 3511 Kapton Thin Film. The diffraction pattern was scanned over the angular range of 5-50 degree (2θ) with a step size of 0.02, at room temperature. Simulated powder patterns were calculated by Mercury software using the crystallographic information file (CIF) from SCXRD experiment.

Absorption spectra of metal halide clusters were measured at room temperature through synchronous scan in an integrating sphere incorporated into the spectrofluorometer (FLS980, Edinburgh Instruments) while maintaining a 1 nm interval between the excitation and emission monochromators.

Excitation spectra of metal halide clusters were measured at room temperature and 77 K (liquid nitrogen was used to cool the samples) on a FLS980 spectrofluorometer (Edinburgh Instruments) monitored at maximum of emission spectra.

Steady-state photoluminescence spectra of metal halide clusters were obtained at room temperature and 77 K (liquid nitrogen was used to cool the samples) on a FLS980 spectrofluorometer.

The PLQEs were acquired using a Hamamatsu Quantaurus-QY Spectrometer (Model C11347-11) equipped with a xenon lamp, integrated sphere sample chamber and CCD detector. The PLQEs were calculated by the equation:

$\eta_{QE}=I_S/(E_R-E_S)$, in which $I_S$ represents the luminescence emission spectrum of the sample, $E_R$ is the spectrum of the excitation light from the empty integrated sphere (without the sample), and $E_S$ is the excitation spectrum for exciting the sample.

Time-Resolved Emission data were collected at room temperature using the FLS980 spectrofluorometer. The dynamics of emission decay were monitored by using the FLS980's time-correlated single-photon counting capability (1024 channels; 10 μs window) with data collection for 10,000 counts. Excitation was provided by an Edinburgh EPL-360 picosecond pulsed diode laser. Long lifetime measurements at 77K (1024 channels; 800 μs window) were collected using Xe flash lamp as the excitation source. The average lifetime was obtained by mono-exponential fitting.

TGA was carried out using a TA instruments Q600 SDT system. The samples were heated from room temperature (~22° C.) to 800° C. with at a rate of 5° C.·min$^{-1}$, under an argon flux of 40 mL·min$^{-1}$.

Example 8—Bulk Materials including Tetraphenylphosphonium and Antimony Chloride Salts In this example, tetraphenylphosphonium cation ($Ph_4P^+$) was used to assemble 0D organic antimony chloride ($Ph_4P)_2SbCl_5$ single crystals.

Two facile synthetic routes were established to prepare $(Ph_4P)_2SbCl_5$ single crystals in high yields: one by a slow solvent inter-diffusion process, and the other involving the rapid growth of a metastable product followed by spontaneous transformation to form the thermodynamically stable product.

1. Growth of $(Ph_4P)_2SbCl_5$ Bulk Crystals via Antisolvent Vapor Diffusion 0.82 mmol $SbCl_3$ and 1.64 mmol $Ph_4PCl$ were mixed at 1:2 molar ratio and dissolved in 3 ml DMF to form a clear precursor solution. Bulk crystals were prepared by diffusing 2 ml $Et_2O$ into 1 ml DMF solution at room temperature for overnight. The large light color crystals were washed with $Et_2O$ and dried under reduced pressure. The yield was calculated at ~65%. $C_{48}H_{40}P_2SbCl_5$: Anal, Calc. C, 58.96; H, 4.12; Cl, 18.13. Found: C, 58.86; H, 4.30; Cl, 17.99.

2. Rapid Crystal Growth Approach of $(Ph_4P)_2SbCl_5$ Bulk Crystals

Growth of $(Ph_4P)_2SbCl_5$ crystals was initiated by injecting 0.4 ml $Et_2O$ to 0.5 ml as-prepared DMF solution at room temperature. The crystal growth process was ceased after 10 minutes by removing the mother liquor. The crystals were washed with $Et_2O$ and dried under reduced pressure. The yield was calculated at about 60%.

The photophysical properties of both metastable and stable $(Ph_4P)_2SbCl_5$ prepared by the different methods of this example were fully characterized. The metastable product, which was believed to contain solvent molecules, exhibited yellow emission, peaked at 605 nm, and the stable product had red emission, peaked at 648 nm with a near-unity PLQE.

Light yellow single crystals of $(Ph_4P)_2SbCl_5$ were prepared overnight in a 65% yield by diffusing the anti-solvent diethyl ether into an undisturbed dimethylformamide (DMF) precursor solution of antimony chloride ($SbCl_3$) and tetraphenylphosphonium chloride ($Ph_4PCl$) at room temperature in an $N_2$-filled glove box. The ionic structure was determined using single crystal X-ray diffraction (SCXRD), and adopted a triclinic space group P-1 where individual $SbCl_5^{2-}$ pyramids were surrounded by the large tetrahedral $Ph_4P^+$ cations.

An $SbCl_5^{2-}$ anion wrapped by several $Ph_4P^+$ cations was present in the structure. The bond distance between the Sb atom and the apical Cl atom in $SbCl_5^{2-}$ in $(Ph_4P)_2SbCl_5$ was 2.20 Å, which was noticeably shorter than distances of previously reported pyramidal $SbCl_5$ structures, such as $(Bmim)_2SbCl_5$ (2.37 Å)[15] and $(C_9NH_{20})_2SbCl_5$ (2.38 Å)(Zhou, C. et al. Chem. Sci. 2018, 9, 586-593).

Meanwhile, the bond lengths bewsen the Sb atom and the other four Cl atoms were all between 2.61 Å and 2.63 Å, which was comparable to those of other $SbCl_5$ structures. The smaller pyramidal size suggested that the crystal structure of $(Ph_4P)_2SbCl_5$ was more compacted, which may have been caused, at least in part, by the rigid phenyl groups and their facilitation of molecular packing. The uniformity of the as-prepared crystals was confirmed by powder X-ray diffraction (PXRD). The consistency of PXRD patterns also suggested that there was no phase transition between 150K and room temperature. The compositions of the crystals were further verified by elemental analysis.

Figure 24:
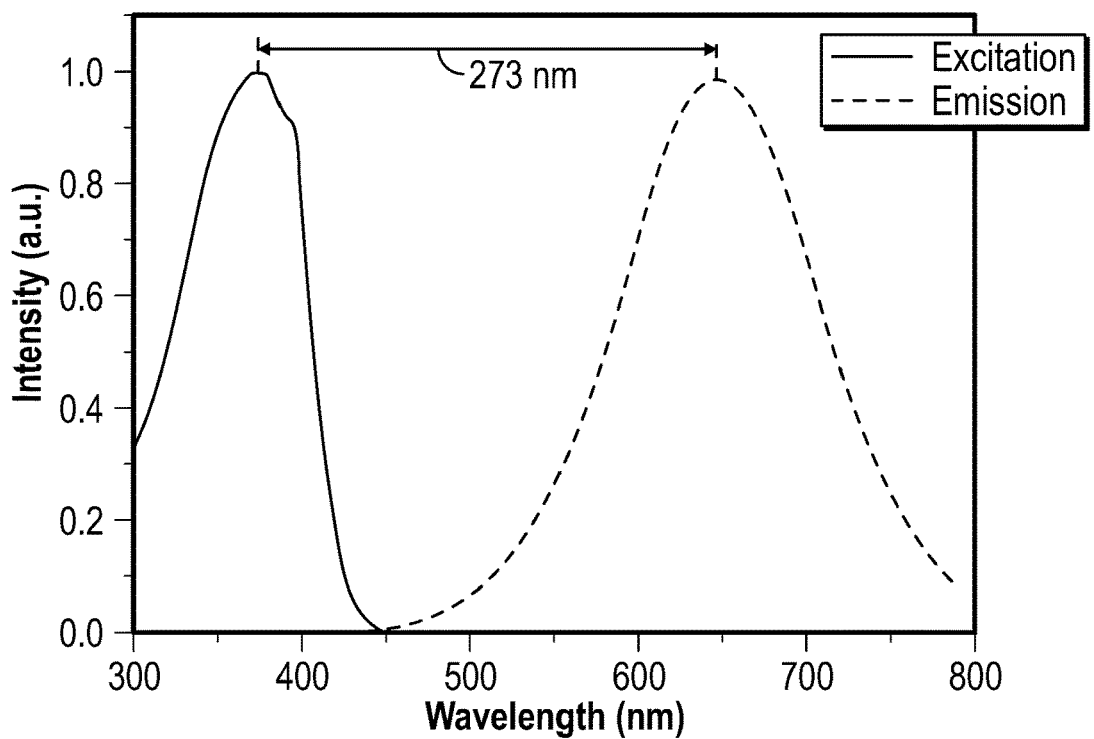
FIG. 24 depicts excitation and emission spectra collected for an embodiment of a bulk assembly.

The bulk $(Ph_4P)_2SbCl_5$ crystals displayed bright red luminescence under UV irradiation (365 nm). The photophysical properties of $(Ph_4P)_2SbCl_5$ samples were further characterized. The excitation spectrum of $(Ph_4P)_2SbCl_5$ had a maximum of 375 nm (FIG. 24). The broadband red emission peaked at 648 nm had a full width at half-maximum (FWHM) of 136 nm (FIG. 24), and a characteristic phosphorescent lifetime of 4.57±0.09 μs. Luminescence from $(Ph_4P)_2SbCl_5$ was lower in energy than emission from $(C_9NH_{20})_2SbCl_5$ ($\lambda_{max}$=590 nm) and had a Stokes shift of 273 nm (1.41 eV). The large Stokes shift suggested that the $(Ph_4P)_2SbCl_5$ underwent a larger structural distortion in the excited state than $(C_9NH_{20})_2SbCl_5$. The photoluminescent efficiency of the bulk crystals (PLQE=87±2%) was considerably high for red emitting materials. The $(Ph_4P)_2SbCl_5$ crystals also displayed high thermostability, as revealed by thermogravimetric analysis, with no degradation until 300° C., and excellent photostability under continuous high-power mercury lamp irradiation (150 mW/cm$^2$).

Density functional theory (DFT) calculations were performed to further elucidate the photophysical properties of $(Ph_4P)_2SbCl_5$. The calculated electronic structure of $(Ph_4P)_2SbCl_5$ showed a $SbCl_5$-derived valence band and a $Ph_4P$-derived conduction band. The strong hybridization between the occupied Sb-5s oritital and the Cl-3p orbital that pointed to the Sb ion created an antibonding orbital of Sb-5s and Cl-3p, which was higher in energy than the other Cl-3p orbitals.

This resulted in a top valence band that was split off from the rest of the valence band. This band was nearly dispersionless due to the long Sn—Sn distance. The conduction band was mainly made up of the anti-bonding π states on $Ph_4P$ molecular cations. The empty Sb-5p band was located within the $Ph_4P$-dominated conduction band. Although the Sb-5p level was above the conduction band minimum at the ground state, it was found that the excited electron preferred to be localized at $SbCl_5$ due to the strong Coulomb binding between the electron and the hole.

Two types of excitons were tested, one localized at $SbCl_5$ (EX1) and the other of the charge transfer type (EX2) with the hole localized at the $SbCl_5$ cluster and the electron at the adjacent $Ph_4P$ molecule. The following table compares the energies of the spin-triplet and spin-singlet EX1 and EX2.

|  | EX1 | | EX2 | |
| --- | --- | --- | --- | --- |
|  | Triplet | Singlet | Triplet | Singlet |
| Relative Energy (eV) | 0 | 0.34 | 0.25 | 0.26 |
| Emission Energy (eV) | 1.91 | 2.30 | 2.08 | 2.09 |

The most stable exciton was the spin-triplet EX1 localized at $SbCl_5$; the partial charge density contours of the electron and the hole wavefunctions of this exciton were plotted. The calculated emission energy of the spin-triplet EX1 was 1.91 eV, matching perfectly with the experimentally measured emission peak at 1.91 eV (648 nm). The spin-triplet exciton emission was also consistent with the observed lifetime of the emission on the order of a microsecond. The calculated excitation energy was 3.68 eV, which was within the experimentally measured excitation band, and the calculated Stokes shift was 1.77 eV.

Such a large Stokes shift was likely due, at least in part, to structural reorganization in the excited state, which lowered the exciton energy by 0.96 eV. The exciton relaxation involved the shortening of the four Sb—Cl bonds on the $SbCl_4$ plane and the elongation of the Sb—Cl bond perpendicular to the four shortened bonds. The significant elongation of the vertical Sb—Cl bond during the exciton relaxation may explain the different Stokes shifts observed in $(Ph_4P)_2SbCl_5$ and $(C_9NH_{20})_2SbCl_5$, which have different vertical Sb—Cl bond lengths of 2.20 Å and 2.38 Å, respectively, at the ground state. As the Stokes shift was caused by the excited state structural distortion, the larger Stokes shift for $(Ph_4P)_2SbCl_5$ than $(C_9NH_{20})_2SbCl_5$ was likely due to a stronger excited state distortion from a shorter Sb—Cl bond.

In this example, $(Ph_4P)_2SbCl_5$ were prepared in an accelerated crystal growth process. By directly injecting a fixed amount of diethyl ether into a DMF precursor solution at room temperature, plate-like crystals quickly grew out of the solution within minutes. Increasing the amount of diethyl ether resulted in faster crystallization of plate-like crystals with reduced crystal size. Interestingly, the crystals produced by this rapid growth method exhibited yellow emission peaked at around 600 nm upon UV excitation (365 nm). The intensity of broadband emission increased without change of line spectral shape during the crystal growth process, which was revealed by in-situ photoluminescence measurements.

After these yellow emitting crystals were collected and stored in the $N_2$-filled glove box, their emission was found to gradually shift from yellow ($\lambda_{max}$=600 nm) to red ($\lambda_{max}$=648 nm). It should be pointed out that the optical properties of fully converted crystals from rapid growth were almost identical to the crystals prepared by slow vapor diffusion method. An even higher PLQE of 99±1% was achieved for converted crystals from rapid growth, which was possibly due to fewer defects in these crystals.

The distinct optical properties of crystals prepared by slow and rapid processes suggested that a metastable phase was likely a kinetically favored product formed during the latter growth process, which subsequently undergoes structural transformation to the thermodynamically stable phase. To test this hypothesis, a $(Ph_4P)_2SbCl_5$ thin film was prepared by spin casting DMF precursor solution, followed by heat treatment in a $N_2$-filled glovebox.

The as-casted thin film exhibited yellow emission, exactly the same as that of the rapidly grown crystals in solution, which became red emitting upon thermal treatment, suggesting the transformation from a kinetically favored product into a thermodynamically stable product. The structural difference between the two phases was characterized using PXRD.

The PXRD patterns of thin films showed that peaks at 8° and 11.1° vanished while a peak at 9.8° increased over time, confirming the formation of the thermodynamically stable product. Therefore, the rapid growth process formed a kinetically favored metastable product, and the slow diffusion process resulted in a thermodynamically stable product.

As solvent effects on the electronic spectra of molecules in solution have been well established, it is reasonable to suspect that the variation of emission could be attributed to the removal of solvent molecules in crystals and thin films. In the rapid crystal growth process, polar liquid molecules (i.e. DMF) could co-crystallize with $Ph_4P+$ and $SbCl_5^{2-}$ to form a metastable structure, as confirmed by $^1H$ NMR spectra, which turned into a thermodynamically stable phase without solvent molecules. Upon heat treatment, this structural transformation process could be expedited. TGA measurements of the fresh and converted metastable crystals showed a sizable weight loss for the metastable crystal at around 100° C., corresponding to the removal of DMF molecules. In contrast, there was little-to-no weight loss for the converted crystal and the crystal prepared by a slow diffusion method was stable up to 300° C.

In this example, single crystal x-ray diffraction data of $(Ph_4P)_2SbCl_5$ was collected using an Oxford-Diffraction Xcalibur-2 CCD diffractometer with graphite-monochromated Mo Kα radiation. The crystal was mounted in a cryoloop under Paratone-N oil and cooled to 150 K with an Oxford-Diffraction Cryojet. A hemisphere of data was collected using ω scans with 1° frame widths to a resolution of 0.5 Å, equivalent to 2θ≈64.712°. Reflections were recorded, indexed and corrected for absorption using the Oxford-Diffraction CrysAlisPro software[1], and subsequent structure determination and refinement was carried out using CRYSTALS[2], employing Sir92[3] to solve the crystal structure. The data did not allow for an unconstrained refinement: all hydrogens were geometrically restrained to their associated carbon. The refinement was performed against $F^2$, with anisotropic thermal displacement parameters for all non-hydrogen atoms and with isotropic thermal displacement parameters for the hydrogens in the structure. A CIF has been deposited with ICSD (No. 433910) and CCDC (No. 1813002).

The PXRD analysis was performed on Panalytical X'PERT Pro Powder X-Ray Diffractometer using Copper X-ray tube (standard) radiation at a voltage of 40 kV and 40 mA, and X'Celerator RTMS detector. The diffraction pattern was scanned over the angular range of 5-50 degree (2θ) with a step size of 0.02, at room temperature. Simulated powder patterns were calculated by Mercury software using the crystallographic information file from SCXRD experiment.

TGA was carried out using a TA instruments SDT Q600 system. The samples were heated from room temperature (~22° C.) to 800° C. at a rate of 10° C.·min$^{-1}$, under an argon flux of 100 mL·min$^{-1}$.

Absorption spectra of $(Ph_4P)_2SbCl_5$ crystals were measured at room temperature through synchronous scan in an integrating sphere incorporated into the spectrofluorometer (FLS980, Edinburgh Instruments) while maintaining a 1 nm interval between the excitation and emission monochromators.

Excitation spectra of $(Ph_4P)_2SbCl_5$ crystals were measured at room temperature on a FLS980 spectrofluorometer (Edinburgh Instruments) monitored at maximum of emission spectra.

Steady-state photoluminescence spectra of $(Ph_4P)_2SbCl_5$ crystals in solid state were obtained at room temperature on a FLS980 spectrofluorometer.

The PLQEs were acquired using a Hamamatsu C9920 system equipped with a xenon lamp, calibrated integrating sphere and model C10027 photonic multi-channel analyzer (PMA). The PLQEs were calculated by the equation: $\eta_{QE}=I_S/(E_R-E_S)$, in which $I_S$ represents the luminescence emission spectrum of the sample, $E_R$ is the spectrum of the excitation light from the empty integrated sphere (without the sample), and $E_S$ is the excitation spectrum for exciting the sample. The control samples, rhodamine 101 and the blue phosphor $BaMgAl10O17:Eu2+$, were measured using this method to give PLQEs of _98% and 93%, which are close to the literature reported values.

Time-Resolved Emission data were collected at room temperature using the FLS980 spectrofluorometer. The dynamics of emission decay were monitored by using the FLS980's time-correlated single-photon counting capability (1024 channels) with data collection for 10,000 counts. Excitation was provided by an Edinburgh EPL-360 picosecond pulsed diode laser. The average lifetime was obtained by monoexponential fitting.

To test the photostability, a 100 W 20 V mercury short arc lamp was used as a continuous irradiation light source. The intensity of the irradiation was calibrated to 150 mW/cm$^2$. The photoluminescence was measured at periodic intervals on a HORIBA iHR$_{320}$ spectrofluorimeter, equipped with a HORIBA Synapse CCD detection system.

All calculations were based on density functional theory (DFT) as implemented in the VASP code. The kinetic energy cutoff of the plane-wave basis is 400 eV. The projector augmented wave method was used to describe the interaction between ions and electrons. The band structure and the density of state of $(Ph_4P)_2SbCl_5$ were calculated using Perdew-Burke-Ernzerhof (PBE) exchange-correlation functional while the exciton excitation and emission energies were calculated using the hybrid PBE0 functional, which has 25% non-local Fock exchange. The inclusion of a fraction of Fock exchange significantly improves the band gap energy and the description of charge localization in insulators. The lattice parameters were fixed at the experimentally measured values while the atomic positions were optimized until the force on each atom is less than 0.02 eV/Å.

The primitive cell that contains one formula unit of $(Ph_4P)_2SbCl_5$ was used in calculations. According to the x-ray diffraction analyses, the two apical Cl sites in a $SbCl_5^{2-}$ anion each has 50% occupancy. Since partial occupancy cannot be simulated, a Cl ion was fixed on one of the apical sites in our calculations. To evaluate the effect of fixing the apical Cl site, tests were performed using three larger supercells, which have their sizes doubled from the primitive cell along the a, b, and c crystallographic directions. The occupied apical Cl site in each $SbCl_5^{2-}$ anion was chosen to be different from that in the adjacent $SbCl_5^{2-}$ anion. The test results show that the average in-plane Sb—Cl bond length and the vertical Sb—Cl bond length in the large cells are nearly the same as those in the primitive cell. The differences are less than 0.01 Å. These tests show that fixing the apical Cl ion on one of the two apical sites is a reasonable approximation. Following Franck-Condon principle, the optical excitation and emission energies were obtained by calculating the total energy differences between the excited and the ground states using PBE0-optimized ground-state and excited-state structures, respectively. The spin-singlet exciton is considered when calculating the exciton excitation energy due to the spin-allowed optical transition while the more stable spin-triplet exciton is considered when calculating the exciton emission energy.

Example 9—White Light Emitting Diodes

In this example, "sun-like" white light emitting diodes (WLEDs) based on zero-dimensional organic metal halide hybrids were prepared.

Specifically, a series of UV pumped WLEDs were prepared, in which $BaMgAl_{10}O_{17}:Eu^{2+}$ ($BAM:Eu^{2+}$) was used as a blue phosphor, and the following 0D organic metal halide hybrids—$(Ph_4P)_2MnBr_4$, $(C_4N_2H_{14}Br)_4SnBr_6$, and $(Ph_4P)_2SbCl_5$—were used as green, yellow, and red phosphors, respectively.

The WLEDs of this example produced full spectrum white light that approximated halogen or incandescent lighting and natural daylight, with extremely high CRIs of up to 99, excellent deep-red color rendering, R9s of up to 99, and superior color quality scale (CQS) values.

By controlling the phosphor blend ratios in this example, white emission with different correlated color temperatures (CCTs), ranging from 3000 K to 6000 K, were demonstrated, which mimicked sunlight at different times of the day. The thermal and current stability of the CCT and Commission Internationale de l'Eclairage (CIE) chromaticity coordinates of the devices were also investigated.

$(C_4N_2H_{14}Br)_4SnBr_6$ (i.e., $SnBr_6^{4-}$ octahedra surrounded by $C_4N_2H_{14}Br^+$ cations) and $(Ph_4P)_2SbCl_5$ (i.e., $SbCl_5^{2-}$ pyramid surrounded by $Ph_4P^+$ cations) were synthesized following previously reported procedures (Zhou, C. K. et al., Chem. Sci. 2018, 9 (3), 586-593; and Zhou, C. K. et al., Chem. Mater. 2018, 30 (7), 2374-2378).

$(Ph_4P)_2MnBr_4$ (i.e., $MnBr_4^{2-}$ tetrahedron surrounded by $Ph_4P^+$ cations) crystals were prepared via a modified procedure, by diffusing $(C_2H_5)_2O$ into a 2:1 ratio solution of $Ph_4PBr$ and $MnBr_2$ in dimethylformamide (DMF) overnight.

An analysis of the crystal structures revealed that the 0D organic metal halide hybrids differed from their higher dimensional counterparts because the photoactive polyhedra were completely isolated from each other by the bulky wide bandgap organic cations, thereby inhibiting electronic band formation between luminescent centers.

This arrangement allowed the 0D organic metal halide hybrids of this example to display the intrinsic properties of individual metal halide polyhedra in the bulk crystal with a near-unity PLQE. Moreover, because of the molecular excited state structural reorganization, a broad emission and large Stokes shift were observed for this class of materials. Additionally, the organic cations also functioned as shells to the photoactive metal halide cores, providing stability against moisture and oxidizing agents.

The photophysical properties of the four phosphors, blue emitting $BAM:Eu^{2+}$, green emitting $(Ph_4P)_2MnBr_4$, yellow emitting $(C_4N_2H_{14}Br)_4SnBr_6$, and red emitting $(Ph_4P)_2SbCl_5$, were characterized using steady-state photoluminescence and UV-Vis absorption spectroscopy. The results are summarized in the following table.

Photophysical Property of Phosphors Summary

| Materials | $\lambda_{exc}$ (nm) | $\lambda_{emi}$ (nm) | FWHM (nm) | Stokes Shift (nm) | PLQE (%) |
|---|---|---|---|---|---|
| $BAM:Eu^{2+}$ | 344 | 449 | 49 | 115 | 93 |
| $(Ph_4P)_2MnBr_4$ | 280, 365, 460 | 512 | 48 | 52 | 98 |

-continued

| Materials | $\lambda_{exc}$ (nm) | $\lambda_{emi}$ (nm) | FWHM (nm) | Stokes Shift (nm) | PLQE (%) |
|---|---|---|---|---|---|
| $(C_4N_2H_{14}Br)_4SnBr_6$ | 355 | 560 | 108 | 205 | 95 |
| $(Ph_4P)_2SbCl_5$ | 354 | 637 | 118 | 283 | 87 |

Figure 25:
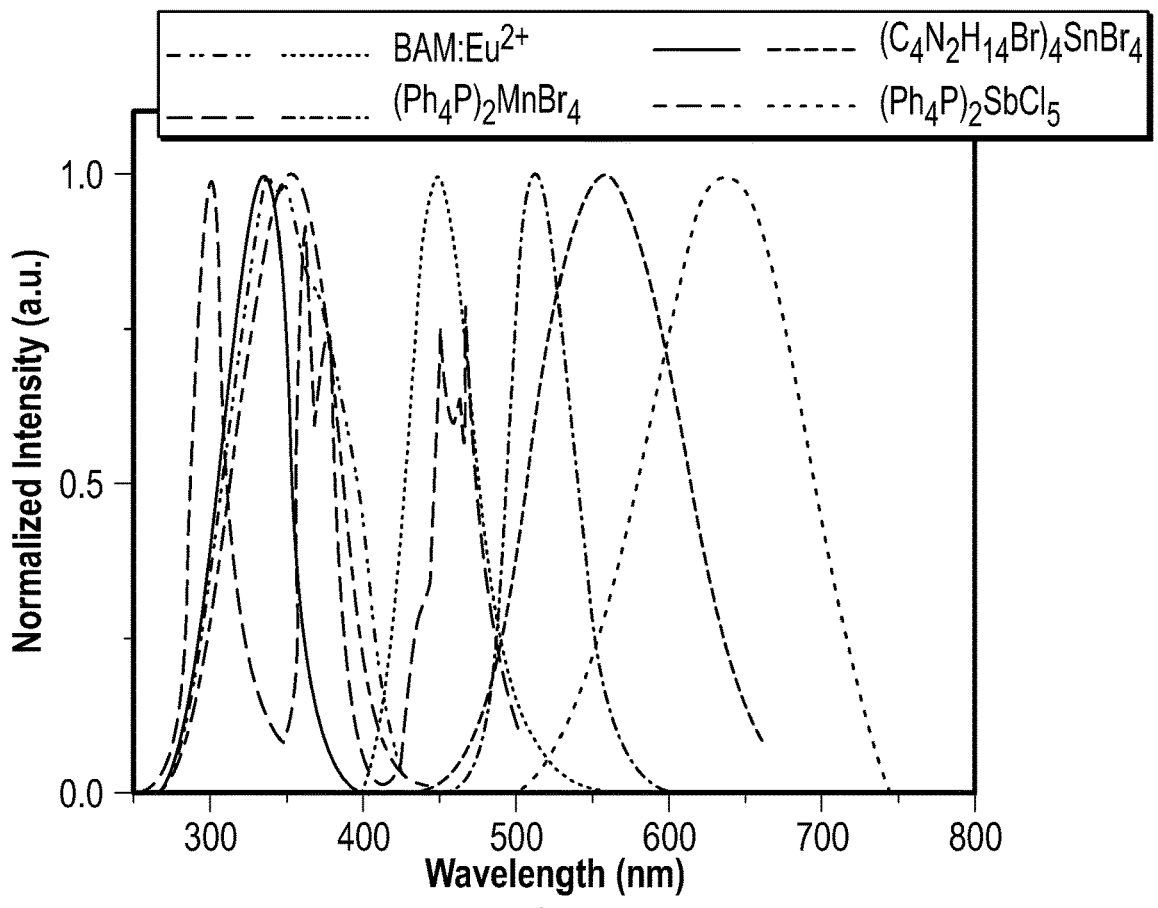
FIG. 25 depicts the excitation (dashed lines) and emission (solid lines) of several embodiments of phosphors.
Figure 26A:
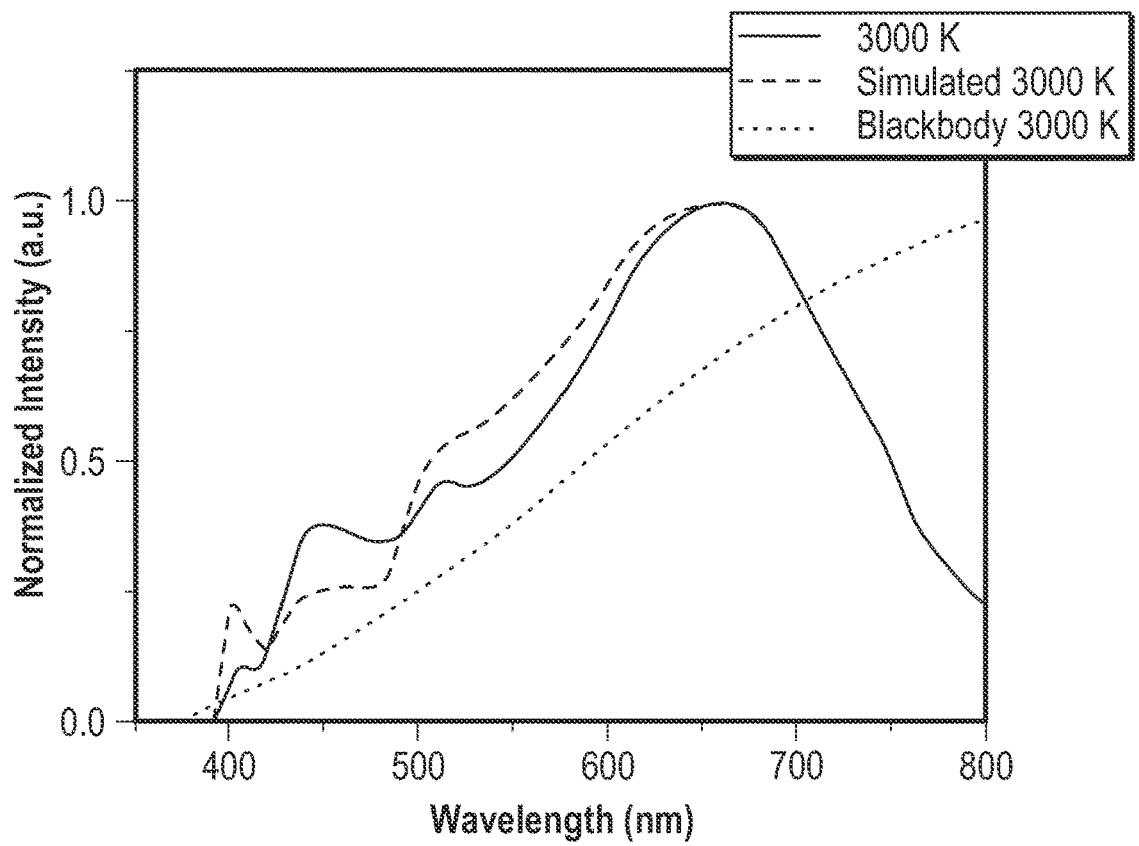
FIG. 26A depicts an emission spectrum of an embodiment of a white light emitting diode, simulated white light, and a blackbody radiator at 3000K.
Figure 26B:
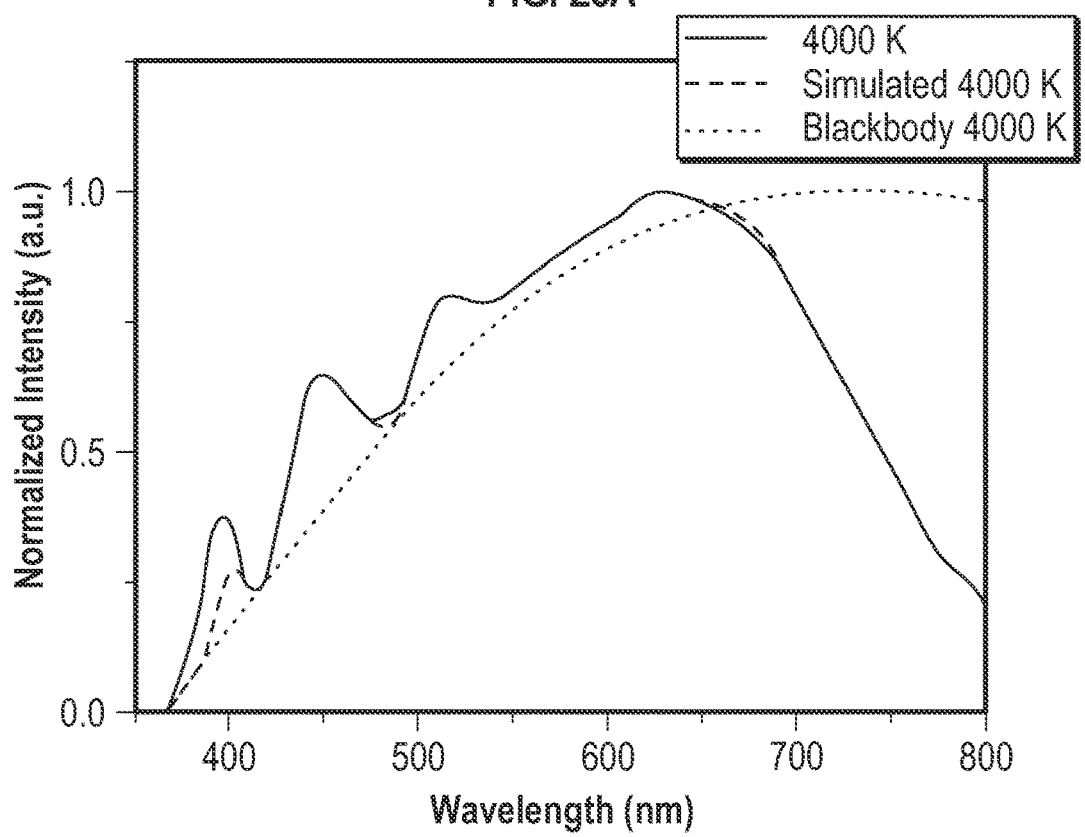
FIG. 26B depicts an emission spectrum of an embodiment of a white light emitting diode, simulated white light, and a blackbody radiator at 4000K.
Figure 26C:
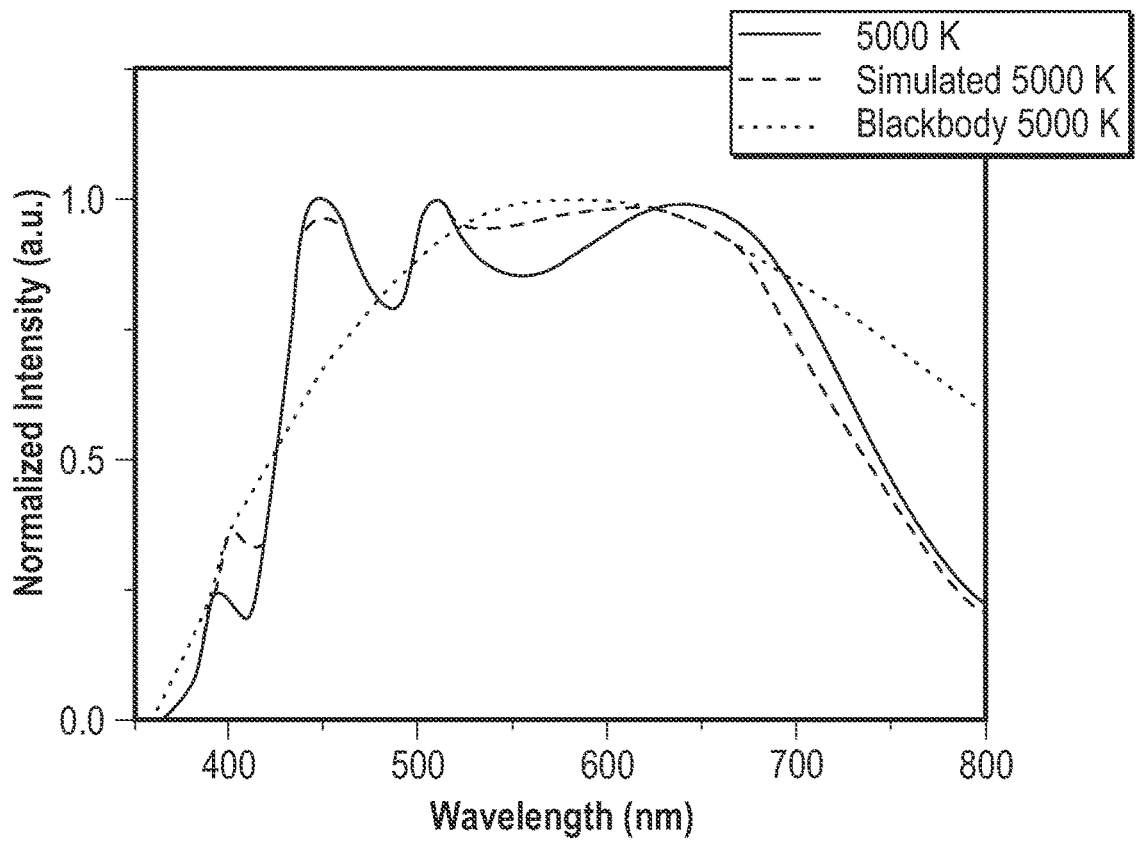
FIG. 26C depicts an emission spectrum of an embodiment of a white light emitting diode, simulated white light, and a blackbody radiator at 5000K.
Figure 26D:
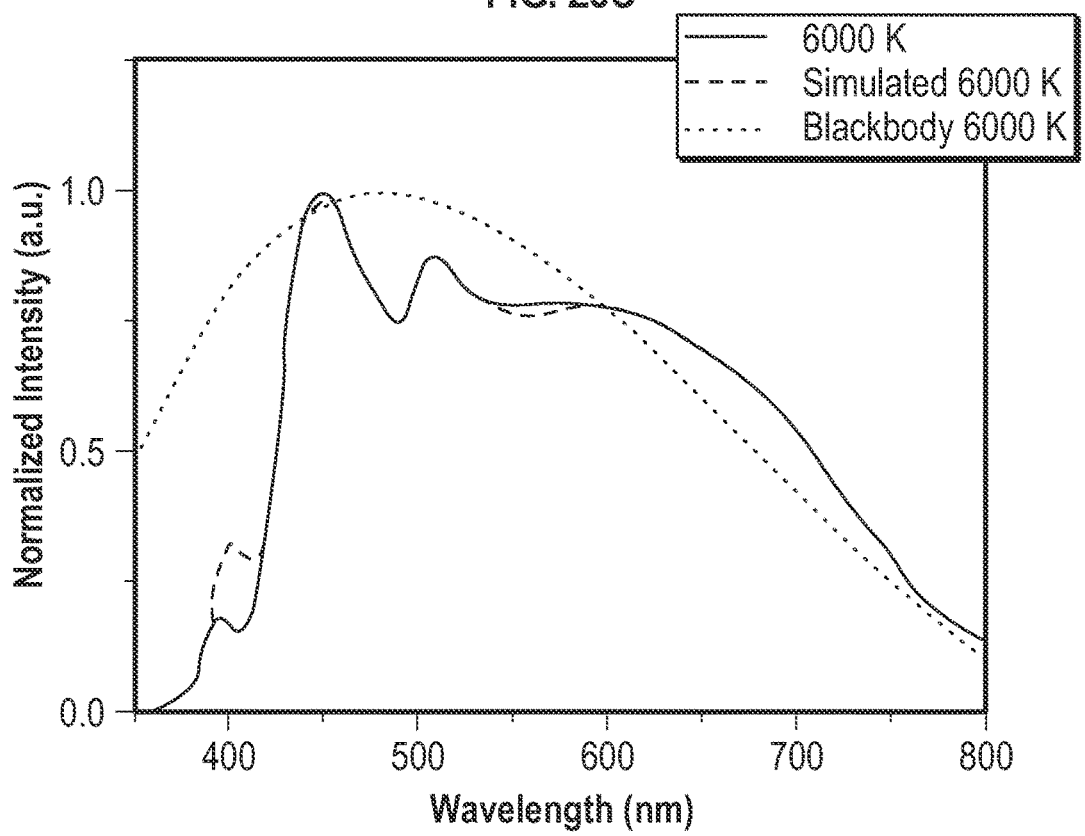
FIG. 26D depicts an emission spectrum of an embodiment of a white light emitting diode, simulated white light, and a blackbody radiator at 6000K.

The 0D organic metal halide hybrids generally showed broad emissions, as depicted at FIG. 25, with a calculated full width at half maximum (FWHM) of 48 nm (0.22 eV), 108 nm (0.43 eV) and 118 nm (0.36 eV) for $(Ph_4P)_2MnBr_4$, $(C_4N_2H_{14}Br)_4SnBr_6$ and $(Ph_4P)_2SbCl_5$, respectively. These broadband emissions have clear advantages over narrow emissions from QDs and typical 3D metal halide perovskites for the realization of full spectrum white emission. Moreover, as shown at FIG. 25, the excitation spectra of all four phosphors peaked at similar short wavelengths between 330 nm and 370 nm. The absorption spectra of three of the four phosphors also never extended into the visible range beyond 400 nm.

Only $(Ph_4P)_2MnBr_4$ displayed three different absorption peaks at 300 nm, 350 nm and 460 nm due to energy splitting of the $^4T_1$ excited state of the Mn(II) ion. However, the absorption coefficient at 460 nm was miniscule and therefore resulted in a negligible reabsorption of blue emission. The Stokes shifts were calculated to be 115 nm (0.84 eV), 52 nm (0.27 eV), 205 nm (1.28 eV) and 283 nm (1.56 eV) for BAM:$Eu^{2+}$, $(Ph_4P)_2MnBr_4$, $(C_4N_2H_{14}Br)_4SnBr_6$ and $(Ph_4P)_2SbCl_5$, respectively. These large Stokes shifts were believed to be instrumental in fabricating WLEDs with little-to-no efficiency loss from reabsorption of emitted light. The PLQEs of the commercial blue phosphor BAM:$Eu^{2+}$, and 0D organic metal halide hybrid crystals $(Ph_4P)_2MnBr_4$, $(C_4N_2H_{14}Br)_4SnBr_6$ and $(Ph_4P)_2SbCl_5$ were reported to be as high as 93%, 97%, 95% and 87%, respectively (Zhou, C. K., et al., Chem. Sci. 2018, 9 (3), 586-593; Zhou, C. K. et al., Chem. Mater. 2018, 30 (7), 2374-2378; Xu, L. J. et al., Adv. Mater. 2017, 29 (10), 5; and Kim, K. B. et al., Chem. Mater. 2002, 14 (12), 5045-5052). These results indicated that the 0D organic metal halide hybrids possessed broad emissions, strong excitation in the UV region, large Stokes shifts and high PLQEs suitable for application in high color rendering, full-spectrum UV pumped efficient WLEDs with negligible reabsorption losses.

To fabricate the optically pumped WLEDs of this example, ways of embedding phosphors into polymer matrices to prepare phosphor-polymer composites were investigated. The typical procedure involved grinding single crystal phosphors into fine powders, encapsulating ground phosphors in an inert polymer matrix and attaching the phosphor-polymer composite to a commercial UV-LED. Two routes were explored to reduce single crystals to powder: hand grinding using mortar and pestle and planetary ball milling. Although particle sizes of approximately 300 nm were obtained through planetary ball milling, the PLQEs were significantly reduced compared to those of the single crystals. This was likely because the larger surface area to volume ratio of ball-milled powders lead to increased oxidation and moisture adsorption. The largest PLQE reduction was observed for $(C_4N_2H_{14}Br)_4SnBr_6$, most likely because of the oxidation of $Sn^{2+}$ to $Sn^{4+}$. Despite producing larger size particles, hand ground phosphors maintained reasonable PLQEs and thus were employed in phosphor-polymer composite preparation and device fabrication. Silicone and epoxy are the most widely used polymer matrices for phosphor encapsulation. EI-1184Polydimethylsiloxane (PDMS) was used as an inert polymer matrix, due to its transparency in the UV-Visible light spectrum, inertness, and stability under various operating conditions. Other materials, however, such as Sylgard-184 PDMS and the epoxy resin EPO-TEK305 could be used. A photo of phosphor doped PDMS polymer composites was taken under ambient light and UV irradiation. The colorless phosphor-polymer composites under ambient light were consistent with the little-to-no absorption of these phosphors in the visible region. The strong photoluminescence of the composites under UV irradiation, however, matched with that of single crystals.

To produce white light with optimum color rendering and tunable CCT in this example, color mixing simulations were performed. This was accomplished by first fabricating monochromatic LEDs and then combining the spectra to yield ultra-high color rendering white light. Employing the Osram-Sylvania Color Calculator software, color rendering values, CRI and CQS, were optimized for four different CCT values, 3000 K, 4000 K, 5000 K and 6000 K. These CCT values were chosen because they represent the range of color temperatures typical in solid state lighting applications, from warm white (3000 K) for residential lighting to cold white (6000 K) for commercial and industrial venues. The simulation results, which are presented in the following table, revealed that ultra-high color rendering, CRI and CQS in the range of 98-99, could be achieved.

Photometric Results of Simulated White Light

| CCT | CRI ($R_a$) | CQS | R9 | CIE (x, y) |
|---|---|---|---|---|
| 3000 | 99 | 98 | 94 | (0.4355, 0.4067) |
| 4000 | 99 | 99 | 98 | (0.3811, 0.3775) |
| 5000 | 99 | 99 | 99 | (0.3458, 0.3604) |
| 6000 | 99 | 99 | 94 | (0.3217, 0.3374) |

However, of the recommended 14 reflective test-color samples, CRIs of only the first eight, R1-R8, were used to calculate the general CRI ($R_a$) value. Neglecting the R9 value, the quantity representing the deep-red color rendering could yield a high $R_a$ white light with inaccurate rendering of deep-red regions. R9 values of commercial WLEDs are usually limited to below 30 and reports of high R9 values are very rare. The simulation, however, produced R9 values as high as 99. Color rendering values of this magnitude are seldom reported in the literature. The color rendering was relatively insensitive to variations in CCT. This indicated that WLEDs based on these phosphors could be used for high color rendering applications in any arena, be it residential or industrial. In comparison, the most typical commercial white LED based on YAG:$Ce^{3+}$ phosphor has poor color rendering at lower CCTs, $R_a$ of 70, and little flexibility in CCT tuning (McKittrick, J. et al, J. Am. Ceram. Soc. 2014, 97 (5), 1327-1352).

The simulation results showed weight ratios of 1:2.7:3.6:9, 1:3:4.5:3.5, 1:3.3:4:3 and 1:2.5:3:2 for: BAM:$Eu^{2+}$:$(Ph_4P)_2MnBr_4$: $(C_4N_2H_{14}Br)_4SnBr_6$: $(Ph_4P)_2SbCl_5$, would yield 3000 K, 4000 K, 5000 K and 6000 K CCT white light, respectively. The phosphors were then blended according to the simulation results and encapsulated in PDMS to produce the white light emitting phosphor-polymer composites.

By directly attaching these phosphor layers to an Opulent 365 nm UV-LED, WLEDs were fabricated. Emission spectra of the devices were collected under forward bias current of 20 mA using a Keithley 2400 source-meter and an Ocean Optics USB4000 spectrometer. The photometry values, which are summarized in the following table, were calculated from the emission spectra using the Osram-Sylvania color calculator software.

Prototype Device Photometry Characterization Results

| CCT | CRI ($R_a$) | CQS | R9 | CIE (x, y) |
|---|---|---|---|---|
| 2982 K | 92 | 96 | 81 | (0.4218, 0.3710) |
| 4028 K | 99 | 99 | 99 | (0.3782, 0.3722) |
| 5061 K | 93 | 97 | 73 | (0.3426, 0.3406) |
| 5850 K | 98 | 97 | 94 | (0.3251, 0.3317) |

These experimental results confirmed the ultra-high color rendering that could be achieved, as evidenced by the $R_a$, CQS and R9 values. Moreover, this color rendering was maintained across widely varying CCTs, thereby making these devices viable for a wide range of solid state lighting applications. The comparison between experimental results and simulated and blackbody radiator spectra at corresponding color temperatures revealed similarity in both shape and breadth, as shown at FIG. 26A, FIG. 26B, FIG. 26C, and FIG. 26D.

Thus, the color rendering properties of white emission from the devices of this example stemmed, at least in part, from their exceptional resemblance to emission from a blackbody radiator. Calculated CIE coordinates of the devices were also almost in-line with the Planckian locus, reaffirming that the devices of this example mimicked the emission of a blackbody radiator. The 4000 K device had $R_a$, CQS and R9 of 99 at a CCT of 4028 K.

Figure 27:
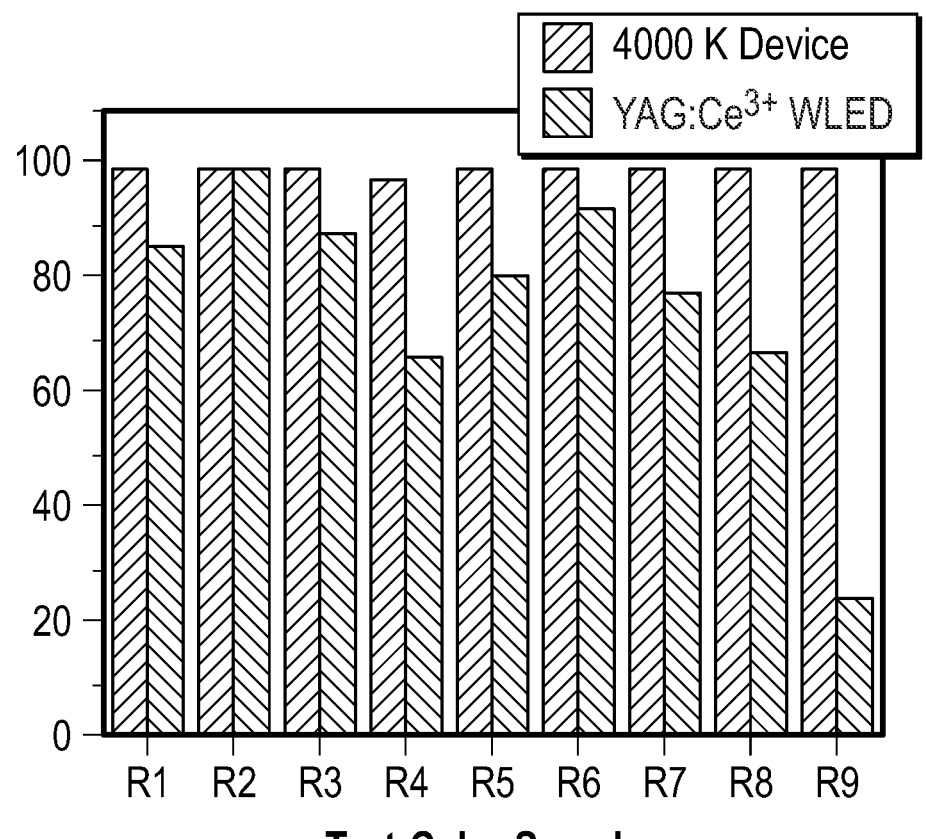
FIG. 27 depicts a comparison of an embodiment of a white light emitting device and a commercially available white light emitting device.

FIG. 27 depicts a CRI comparison between the 4000 K device of this example and a YAG:$Ce^{3+}$ based commercial WLED. It is believed that WLEDs exhibiting such high $R_a$, CQS and R9 with such precise control and tunability of CCT have not been reported yet.

The thermal stability of the phosphors was investigated using a temperature controller fitted spectrophotometer. The results were collected in the forward direction, by first increasing the temperature to 80° C. by 20° C. steps and in the reverse direction, by decreasing the temperature back to 20° C. by 20° C. steps. Except for ($C_4N_2H_{14}$ Br)$_4$SnBr$_6$, the results showed similar trends, including a slight decrease in photoluminescence intensity when the temperature was increased.

The highest intensity loss was recorded for (Ph$_4$P)$_2$SbCl$_5$ at 80° C., which retained about 62% of the room temperature photoluminescence intensity. Moreover, a slight blue-shifting of the emission peak was also observed. This was likely because of temperature induced bond stretching, which resulted in a smaller Stokes shift than the one observed at room temperature. The commercial blue phosphor BAM:$Eu^{2+}$ and the green emitting (Ph$_4$P)$_2$MnBr$_4$ retained 90% and 92% of their initial room temperature photoluminescence intensity, respectively. The BAM:$Eu^{2+}$ phosphor only experiences significant oxidation induced thermal degradation for temperatures above 500° C. (Bizarri, G. et al., *J. Lumin.* 2005, 113 (3-4), 199-213). The emission from ($C_4N_2H_{14}$Br)$_4$SnBr$_6$, however, showed an increase in intensity with increasing temperature. This anomaly likely was caused by increased absorption at higher temperatures (Zhou, C. K. et al., *Chem. Sci.* 2018, 9 (3), 586-593). Measurement in the reverse direction showed excellent recovery of photoluminescence intensity for all phosphors of this example.

The stability of the white light emission under variation of forward bias current was also investigated. The emission of a test device was recorded for the forward bias current range of 10 mA to 20 mA with a 1 mA step. The results of this experiment showed that the shape of the spectrum did not experience any significant changes. The CRI ($R_a$) of the device increased from 94 at 10 mA to 96 at 20 mA. A slight shift in CIE coordinates was also observed, changing from (0.3264, 0.3395) at 10 mA to (0.3354, 0.3506) at 20 mA.

Nonetheless, a linear increase in irradiance with increasing current was observed without a significant effect on the photometric characteristics of the white light generated. Because of the heat generated by the pump LED, also tested was the chromatic stability of the phosphor layer under thermal strain. A batch of devices were fabricated and aged at 85° C. for 24, 48, 72 and 96 hours under ambient atmosphere. The white emission from these layers was normalized by the intensity of the blue peak at 450 nm, because the commercial blue phosphor had a thermally robust emission. The CIE chromaticity coordinate was shifted from (0.3254, 0.3448) before aging to (0.3195, 0.3423) after 96 hours in the oven at 85° C. The largest coordinate shift was −0.0059, well within the industry standard of Δ±0.01 (Schubert, E. F. et al., *Science* 2005, 308 (5726), 1274-8).

The efficiency of a model WLED with 5217 K CCT, 99 CRI ($R_a$) and 96 R9 was studied. The device was operated under a forward bias current of up to 105 mA using a Keithley 2400 source-meter. The resulting optical power and photocurrent were measured using a Newport 818-UV photodetector and a Newport multi-function optical meter.

Figure 28:
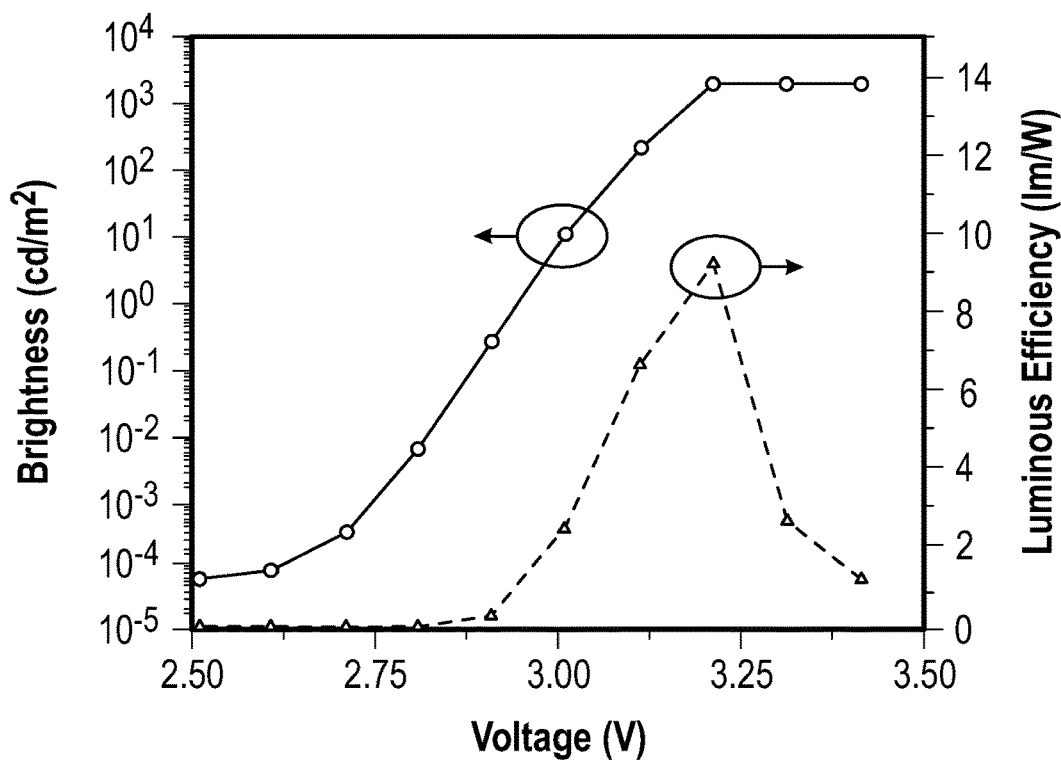
FIG. 28 depicts the voltage versus brightness and luminous efficiency of an embodiment of a light emitting device.
Figure 29:
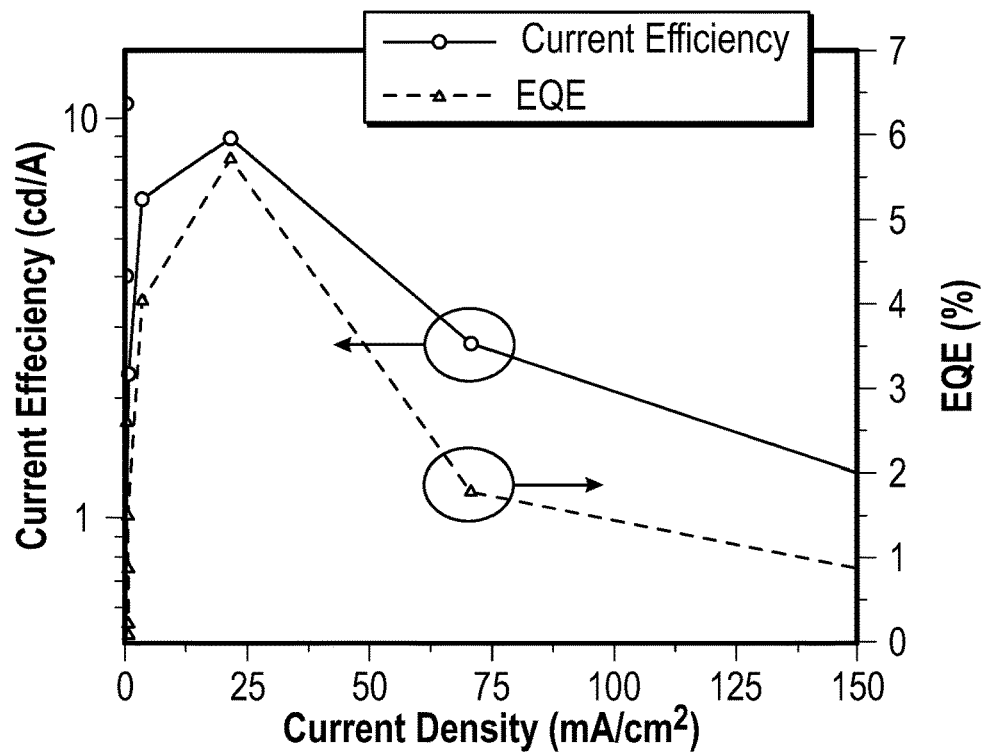
FIG. 29 depicts the voltage versus current efficiency and luminous efficiency of an embodiment of a light emitting device.

To eliminate contributions to the photocurrent from the pump UV-LED, an Edmund Optics deep-dyed polyethylene terephthalate (PET) UV filter was used. Only emission in the forward direction was collected during this measurement. As depicted at FIG. 28, brightness values of up to 1935 cd m$^{-2}$ and luminous efficiency of up to 9.73 lm W$^{-1}$ were obtained. Moreover, further calculations showed an external quantum efficiency (EQE) of 5.7% and current efficiency of 9 cd A$^{-1}$, as depicted at FIG. 29.

However, emission in the forward direction only accounted for approximately one fourth of the total outcoupled optical power due to strong waveguiding. Thus, measurement of the luminous efficiency in an integrating sphere would likely yield values up to 40 lm W$^{-1}$.

In this example, the use of a series of 0D organic metal halide hybrids together with a commercially available blue phosphor BAM:$Eu^{2+}$ for the fabrication of sun-like full spectrum WLEDs with near perfect CRI values has been demonstrated. The 0D organic metal halide hybrids of this example were made of earth abundant elements, which possess numerous features desired for application as down conversion phosphors, including facile synthesis, near-unity PLQE, broadband emission, and large Stokes shift.

In this example, the following materials were used: tin (II) bromide (SnBr$_2$), antimony(III) chloride (SbCl$_3$, 99.95%), manganese(II) bromide (MnBr$_2$, 98%), tetraphenylphosphonium chloride (Ph$_4$PCl, 98%), tetraphenylphosphonium bromide (Ph$_4$PBr, 97%), N,N'-dimethyl ethylenediamine ($C_4N_2H_{14}$, 99%), hydrobromic acid (48 wt. % in H$_2$O) were purchased from Sigma-Aldrich. Dichloromethane (DCM, 99.9%), dimethylformamide (DMF, 99.8%) and diethyl ether (($C_2H_5$)$_2$O, anhydrous) were purchased from VWR. Acetone (HPLC grade) was purchased from EMD Millipore. All reagents and solvents were used without further purification unless otherwise stated.

Solution growth of 0D metal halide bulk materials: Yellow light emitting $(C_4N_2H_{14}Br)_4SnBr_6$ crystals were prepared following a reported procedure (Zhou, C. K. et al., *Chem. Sci.* 2018, 9 (3), 586-593) by diffusing DCM to DMF solution of $SnBr_2$ and $C_4N_2H_{14}Br_2$ overnight. Red light emitting $(Ph_4P)_2SbCl_5$ crystals were prepared following the reported procedure by diffusing $(C_2H_5)_2O$ to DMF solution of $SbCl_3$ and $Ph_4PCl$ overnight (Zhou, C. K. et al., *Chem. Mater.* 2018, 30 (7), 2374-2378). Green light emitting $(Ph_4P)_2MnBr_4$ crystals were prepared following a revised procedure (Xu, L. et al., *Adv. Mater.* 2017, 29 (10), 5) by diffusing 12 ml $(C_2H_5)_2O$ to 4 ml DMF solution of 2 mmol $Ph_4PBr$ and 1 mmol $MnBr_2$ at room temperature for overnight. The crystals were washed with $(C_2H_5)_2O$ and dried under reduced pressure.

Fabrication of white LEDs: Simulation and optimization of the white light spectra were conducted using the Osram-Sylvania LED Color Calculator. The single crystal phosphors were hand-ground using mortar and pestle. They were then proportioned and mixed with a two-part polydimethylsiloxane (PDMS) EI-1184, purchased from Dow-Corning, at a concentration of 25 mg ml$^{-1}$. The mixture gel was placed in a polytetrafluoroethylene (PTFE) mold and cured at 100° C. for 30 minutes, under ambient atmosphere. The phosphor layer was subsequently attached to an Opulent Americas LST1-01G01-UV01-00 365 nm UV-LED.

Characterization: Steady-state emission and excitation of phosphors was collected using a Horiba JY Fluoromax-4 Fluorometer. The temperature dependent photoluminescence spectra were measured on a Varian Cary Eclipse Fluorescence Spectrometer with a Water 4 Position Multi-cell Holder Accessory attached to a Julabo F12-EC Refrigerated/Heating Circulator filled with ethylene glycol-water mixture (3:2). The photoluminescence quantum efficiencies (PLQEs) of the phosphors and phosphor-polymer composites were measured in a Hamamatsu Quantaurus-QY Absolute PL quantum yield spectrometer at an excitation wavelength of 365 nm. The Electroluminescence spectra, current dependence and thermal stability measurements of the white LEDs were collected on an Ocean Optics USB4000 Miniature Fiber Optic Spectrometer in combination with a Keithley 2400 source-meter. Efficiency measurements were conducted using a Keithley 2400 source-meter, a Newport 818-UV photodetector and a Newport multi-function optical meter. An Edmund Optics deep-dyed Polyethylene terephthalate (PET) UV filter was used during efficiency measurement to remove contribution to photocurrent from the UV-LED.

We claim:

1. A method of preparing a bulk assembly, the method comprising:
   providing a precursor solution comprising—
   (i) a solvent;
   (ii) one or more compounds of formula $M^{+y}X_y$, wherein M is a metal selected from the group consisting of Sb, Pb, Sn, and Mn; X is Cl, Br, or I; and y is the charge of the metal; and
   (iii) one or more organic salts; and
   contacting the precursor solution with an anti-solvent to form the bulk assembly.

2. The method of claim 1, wherein a molar ratio of the one or more compounds of formula $M^{+y}X_y$ to the one or more organic salts in the precursor solution is about 1:1.5 to about 1:4.

3. The method of claim 1, wherein a molar ratio of the one or more compounds of formula $M^{+y}X_y$ to the one or more organic salts in the precursor solution is about 1:1.5 to about 1:2.5.

4. The method of claim 1, wherein a molar ratio of the one or more compounds of formula $M^{+y}X_y$ to the one or more organic salts in the precursor solution is about 1:2.

5. The method of claim 1, wherein the solvent comprises dimethylformamide.

6. The method of claim 1, wherein the anti-solvent comprises diethylether.

7. The method of claim 1, wherein M is Sb.

8. The method of claim 1, wherein the one or more compounds of formula $M^{+y}X_y$ comprises antimony trichloride ($SbCl_3$).

9. The method of claim 1, wherein the one or more compounds of formula $M^{+y}X_y$ comprises tin(II) bromide or tin(II) iodide.

10. The method of claim 1, wherein the one or more organic salts comprises a N,N'-dimethylethylene-1,2-diammonium halide salt.

* * * * *